US009716104B2

(12) United States Patent
Kim et al.

(10) Patent No.: US 9,716,104 B2
(45) Date of Patent: *Jul. 25, 2017

(54) VERTICAL MEMORY DEVICES HAVING DUMMY CHANNEL REGIONS

(71) Applicant: Samsung Electronics Co., Ltd., Suwon-si, Gyeonggi-do (KR)

(72) Inventors: Jong Won Kim, Hwaseong-si (KR); Seung Hyun Lim, Seoul (KR); Chang Seok Kang, Seongnam-si (KR); Young Woo Park, Seoul (KR); Dae Hoon Bae, Seongnam-si (KR); Dong Seog Eun, Seongnam-si (KR); Woo Sung Lee, Yongin-si (KR); Jae Duk Lee, Seongnam-si (KR); Jae Woo Lim, Hwaseong-si (KR); HanMei Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,835

(22) Filed: Jan. 5, 2016

(65) Prior Publication Data
US 2017/0040337 A1 Feb. 9, 2017

(30) Foreign Application Priority Data
Aug. 7, 2015 (KR) .......................... 10-2015-0111358

(51) Int. Cl.
*H01L 27/115* (2017.01)
*H01L 27/11582* (2017.01)
*H01L 27/11556* (2017.01)
*H01L 27/11521* (2017.01)
*H01L 27/11568* (2017.01)

(52) U.S. Cl.
CPC .. *H01L 27/11582* (2013.01); *H01L 27/11521* (2013.01); *H01L 27/11556* (2013.01); *H01L 27/11568* (2013.01)

(58) Field of Classification Search
CPC ................................. H01L 27/115–27/11597
See application file for complete search history.

(56) References Cited

U.S. PATENT DOCUMENTS

| 8,324,680 | B2 | 12/2012 | Izumi et al. |
| 8,338,882 | B2 | 12/2012 | Tanaka et al. |
| 8,378,409 | B2 | 2/2013 | Park |
| 8,581,323 | B2 | 11/2013 | Uenaka et al. |
| 8,680,604 | B2 | 3/2014 | Higashi et al. |
| 8,765,598 | B2 | 7/2014 | Smith et al. |
| 8,951,859 | B2 | 2/2015 | Higashitani et al. |
| 9,536,897 | B2 * | 1/2017 | Yoo .................. H01L 27/11582 |
| 2010/0320526 | A1 | 12/2010 | Kidoh et al. |
| 2012/0261722 | A1 | 10/2012 | Tang et al. |
| 2014/0241026 | A1 | 8/2014 | Tanzawa |
| 2015/0008506 | A1 | 1/2015 | Yang et al. |

\* cited by examiner

*Primary Examiner* — Jose R Diaz
(74) *Attorney, Agent, or Firm* — Myers Bigel, P.A.

(57) ABSTRACT

A memory device includes a plurality of channel regions that each extend in a direction perpendicular to an upper surface of a substrate, a plurality of gate electrode layers and a plurality of insulating layers stacked on the substrate adjacent the channel regions, each of the gate electrodes extending different lengths, and a plurality of dummy channel regions adjacent first ends of the plurality of gate electrode layers, wherein the substrate includes a substrate insulating layer formed below the plurality of dummy channel regions.

19 Claims, 69 Drawing Sheets

VERTICAL MEMORY DEVICES HAVING DUMMY CHANNEL REGIONS

CROSS-REFERENCE TO RELATED APPLICATION

This application claims priority under 35 U.S.C. §119 from Korean Patent Application No. 10-2015-0111358 filed on Aug. 7, 2015 in the Korean Intellectual Property Office, the entire content of which is incorporated herein by reference in its entirety.

BACKGROUND

A demand exists for memory devices that have an increased integration density. One method for increasing the integration of a memory device is to use vertical transistor structures instead of planar transistor structures in the memory device.

SUMMARY

Aspects of the inventive concepts provide highly integrated vertical memory devices that may have improved breakdown voltage characteristics.

According to aspect of the inventive concepts, a semiconductor device includes a semiconductor substrate; a gate electrode layer structure that includes a plurality of spaced-apart gate electrode layers stacked on an upper surface of the semiconductor substrate; a plurality of channel regions penetrating the gate electrode layers; a plurality of dummy channel regions penetrating at least the lowermost of the gate electrode layers; and a substrate insulating layer between the semiconductor substrate and the dummy channel regions.

According to another aspect of the inventive concepts, a semiconductor device includes a semiconductor substrate having an upper surface that defines a horizontal plane; a gate electrode layer structure that includes a plurality of gate electrode layers and a plurality of insulating layers that are alternately stacked in a vertical direction on the upper surface of the semiconductor substrate; a plurality of dummy channel regions that penetrate the gate electrode layer structure, the dummy channel regions comprising respective annular channel layers that penetrate a lowermost of the gate electrode layers; and a plurality of channel regions that penetrate the gate electrode layer structure, the channel regions comprising respective epitaxial patterns on the semiconductor substrate and respective annular channel regions on an upper surface of the respective epitaxial patterns, wherein the dummy channel regions are spaced-apart from the semiconductor substrate.

According to yet another aspect of the inventive concepts, a semiconductor memory device includes a semiconductor substrate having an upper surface that has a plurality of recesses therein; a substrate insulating layer that includes a plurality of substrate insulating patterns in the respective recesses; a gate electrode layer structure on the upper surface of the semiconductor substrate; and a plurality of dummy channel regions vertically penetrating the gate electrode layer structure, wherein the dummy channel regions directly contact the substrate insulating layer.

According to another aspect of the inventive concepts, a memory device may include: a substrate; a plurality of gate electrode layers and a plurality of insulating layers stacked on an upper surface of the substrate, the gate electrode layers extending different lengths in a first direction that is parallel to the upper surface of the substrate; a plurality of channel regions, each of the channel regions extending in a second direction that is perpendicular to the upper surface of the substrate to penetrate at least some of the gate electrode layers and insulating layers, the channel regions being adjacent first ends of the gate electrode layers; a plurality of dummy channel regions adjacent second ends of the gate electrode layers; and a substrate insulating layer between the dummy channel regions and the substrate.

According to another aspect of the inventive concepts, a memory device may include: a peripheral circuit region including a plurality of peripheral circuit devices provided on a first substrate and a first interlayer insulating layer covering the peripheral circuit devices; and a cell region including a plurality of channel regions and a plurality of dummy channel regions extending in a direction perpendicular to an upper surface of a second substrate that is different from the first substrate, and a plurality of gate electrode layers and a plurality of insulating layers that are stacked on the second substrate such that the gate electrode layers and the insulating layers are adjacent the channel regions and the dummy channel regions, wherein the peripheral circuit region and the cell region are disposed vertically each other and the second substrate includes a substrate insulating layer provided below the dummy channel regions and is not provided below the channel regions.

According to another aspect of the inventive concepts, a memory device may include: a plurality of channel regions extending in a direction perpendicular to an upper surface of a substrate; a plurality of gate electrode layers adjacent the channel regions, the gate electrode layers extending different lengths in a first direction that is parallel to the upper surface of the substrate; a plurality of peripheral circuit devices that are electrically connected to at least some of the gate electrode layers; a plurality of dummy channel regions between the channel regions and the peripheral circuit devices; and a substrate insulating layer underneath each of the dummy channel regions.

BRIEF DESCRIPTION OF DRAWINGS

The above and other aspects, features and advantages of the inventive concepts will be more clearly understood from the following detailed description taken in conjunction with the accompanying drawings, in which:

FIG. 19b is a cross-sectional view taken along line Ie-Ie' of the memory device of FIG. 19a;

DETAILED DESCRIPTION

Figure 1:
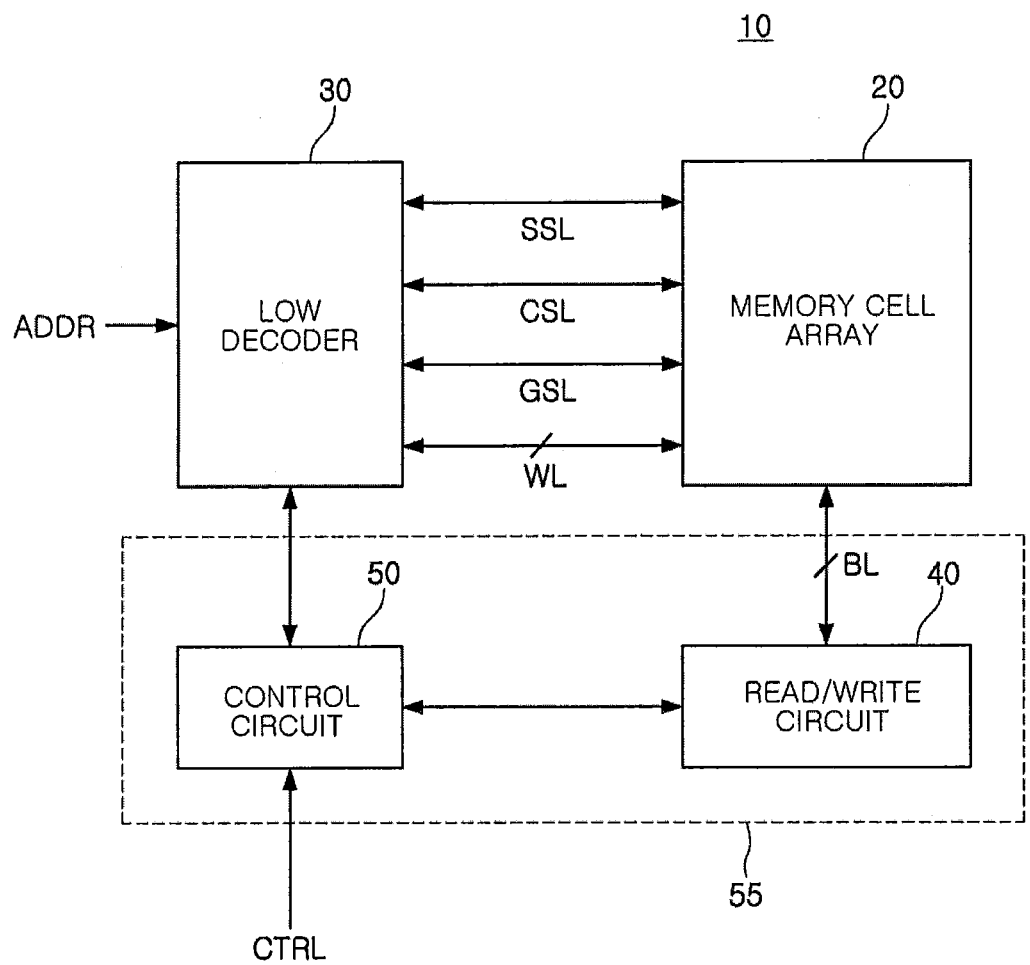
FIG. 1 is a block diagram schematically illustrating a memory device according to an exemplary embodiment of the inventive concepts.

Hereinafter, exemplary embodiments of the inventive concepts will be described in detail with reference to the accompanying drawings.

Throughout the specification, it will be understood that when an element is referred to as being "on" or "connected to" or "coupled to" another element, it can be on, connected to, or coupled to the other element, or intervening elements may be present. However, when an element is referred to as being "directly on" or "directly connected to", or "directly coupled to" another element, it will be understood that intervening elements are not present. The same reference numerals are used throughout to designate the same or like elements. As used herein, the term "and/or" includes any and all combinations of one or more of the associated listed items.

Also, though terms such as "first" and "second" are used herein to describe various elements, components, regions, layers, and/or portions, the elements, components, regions, layers, and/or portions are not limited to these terms. These terms are used only to differentiate one element, component, region, layer, or portion from others thereof. Therefore, an element, a component, a region, a layer, or a portion referred to as a first element, a first component, a first region, a first layer, or a first portion in an embodiment may be referred to as a second element, a second component, a second region, a second layer, or a second portion in another embodiment.

Relative terms such as "below" or "above" or "upper" or "lower" may be used herein to describe a relationship of one element, layer or region to another element layer or region as illustrated in the drawings. It will be understood that these terms are intended to encompass different orientations of the device in addition to the orientation depicted in the figures. For example, a first element of a device that is illustrated in the drawings as being above a second element may be below the second element if the device is turned upside down.

As used herein, the singular forms "a", "an" and "the" are intended to include the plural forms as well, unless the context clearly indicates otherwise. Also, it will be understood that the terms "comprises" and/or "comprising," when used herein, specify the presence of stated features, steps, operations, elements, and/or components, but do not preclude the presence or addition of one or more other features, steps, operations, elements, components, and/or groups thereof.

Hereinafter, exemplary embodiments are described with reference to accompanying drawings that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All embodiments can be combined in any way and/or combination.

FIG. 1 is a block diagram schematically illustrating a memory device 10 according to an exemplary embodiment of the inventive concepts.

Referring to FIG. 1, the memory device 10 includes a memory cell array 20, a low decoder 30, and a core logic circuit 55. The core logic circuit 55 may include a read/write circuit 40 and a control circuit 50.

The memory cell array 20 may include a plurality of memory cells that are arranged in a plurality of columns and rows. The memory cells included in the memory cell array 20 may be connected to the low decoder 30 through a plurality of word lines WL, a common source line CSL, a string select line SSL, and a ground select line GSL, and may be connected to the read/write circuit 40 through a plurality of bit lines BL. In an exemplary embodiment, a plurality of memory cells that are arranged in the same row may be connected to the same word line WL, and a plurality of memory cells that are arranged in the same column may be connected to the same bit line BL.

The memory cells included in the memory cell array 20 may be divided into a plurality of memory blocks. Each of the memory blocks may include a plurality of word lines WL, a plurality of string select lines SSL, a plurality of ground select lines GSL, a plurality of bit lines 13L, and at least one common source line CSL.

The low decoder 30 may receive address information ADDR from an external source and may decode the received address information ADDR to select at least one of the word lines WL, the common source lines CSL, the string select lines SSL, and/or the ground select lines GSL that are connected to the memory cell array 20.

The read/write circuit 40 may select at least one of the bit lines BL that are connected to the memory cell array 20 according to a command received from the control circuit 50. The read/write circuit 40 may read out data stored in a memory cell or write data into a memory cell that is connected to a bit line BL that is selected based on the command received from the control circuit 50. In order to perform the foregoing operations, the read/write circuit 40 may include circuits such as a page buffer, an input/output buffer, and a data latch.

The control circuit 50 may control operations of the low decoder 30 and the read/write circuit 40 in response to a control signal CTRL that is transmitted from an external source. In a case in which data stored in the memory cell array 20 is read, the control circuit 50 may control the low decoder 30 to supply a voltage for a read operation to a word line that is connected to one or more memory cells in which the data that is to be read is stored. When the voltage for the read operation is supplied to a specific word line WL, the control circuit 50 may control the read/write circuit 40 to read out data stored in a memory cell connected to the word line WL to which the voltage for a read operation has been supplied.

In a case in which data is to be written to the memory cell array 20, the control circuit 50 may control the low decoder 30 to supply a voltage for a write operation to a specific word line that is connected to a memory cell into which data is to be written. When the voltage for the write operation is supplied to the specific word line WL, the control circuit 50 may control the read/write circuit 40 to write data into the memory cell.

Figure 2:
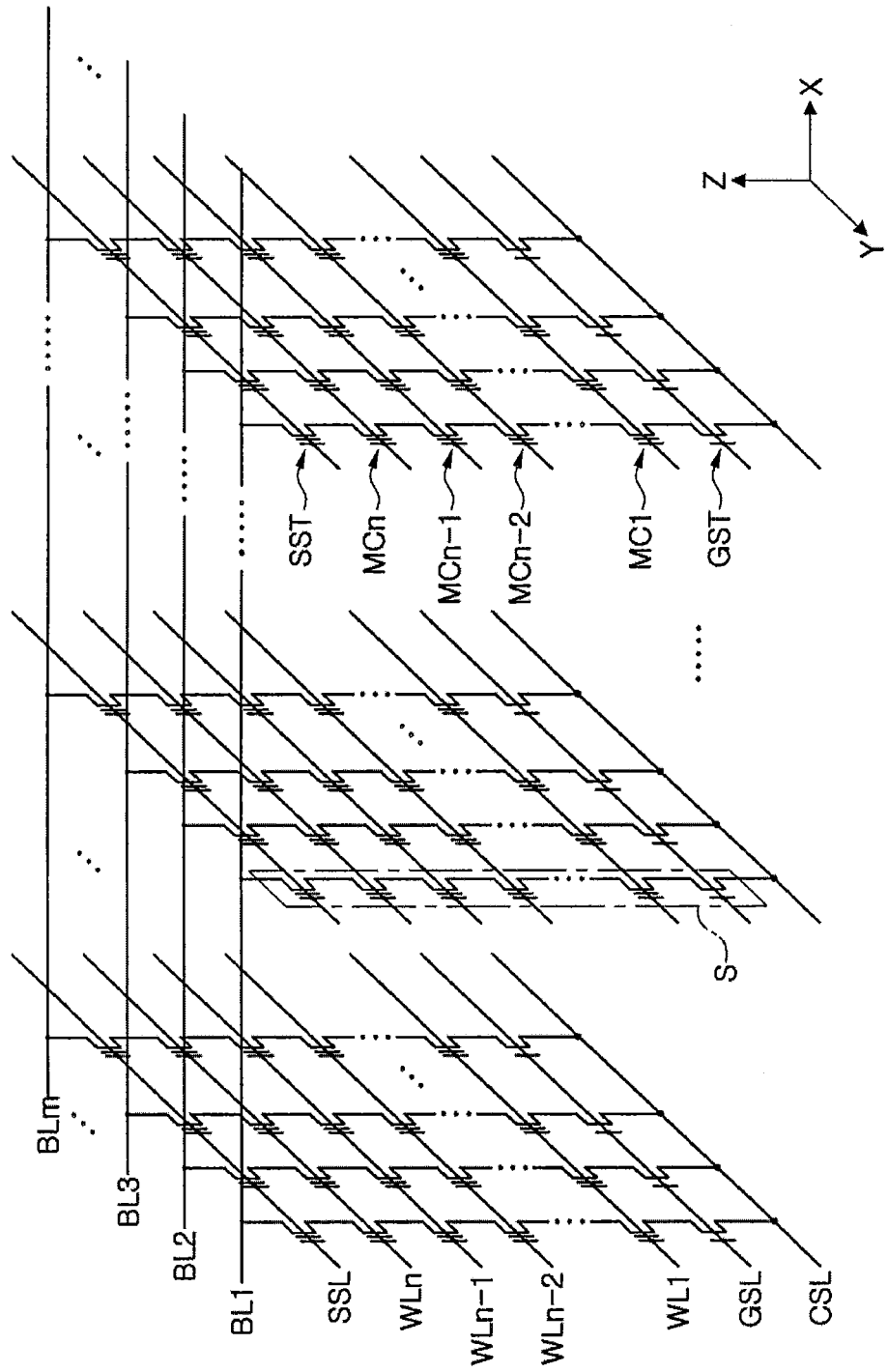
FIG. 2 is a circuit diagram illustrating a memory cell array of a memory device according to an exemplary embodiment of the inventive concepts.

FIG. 2 is an equivalent circuit diagram illustrating a memory cell array of a memory device according to an exemplary embodiment of the inventive concepts. The memory device may be a vertical NAND flash device.

Referring to FIG. 2, the memory cell array may include a plurality of memory cell strings each including memory cells MC1 to MCn connected in series, a ground select transistor GST and a string select transistor SST, with the ground select transistor located at a first end of the memory cells MC1 to MCn and the string select transistor located at the other end of the serially-connected memory cells MC1 to MCn.

The memory cells MC1 to MCn in each memory cell string may be connected to respective word lines WL1 to WLn. The word lines Wl1 to WLn may be used to select respective ones of the memory cells MC1 to MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of memory cell MCn. In FIG. 2, a single ground select transistor GST and a single string select transistor SST are included in each memory cell string. It will be appreciated, however, that in other embodiments a plurality of ground select transistors GST and/or a plurality of string select transistors SST may be included in each memory cell string.

A drain terminal of the string select transistor SST may be connected to one of the bit lines BL1 to BLm. When a signal is applied to the gate terminal of the string select transistor SST through the string select line SSL, a signal applied through the bit lines 13L1 to BLm may be transferred to the memory cells MC1 to MCn of the memory cell string that includes the string select transistor SSL, to thereby perform a data read or write operation. Also, by applying a signal to the gate terminal of the ground select transistor GST through the gate select line GSL, an erase operation to remove all electric charges stored in the memory cells MC1 to MCn may be performed.

Figure 3:
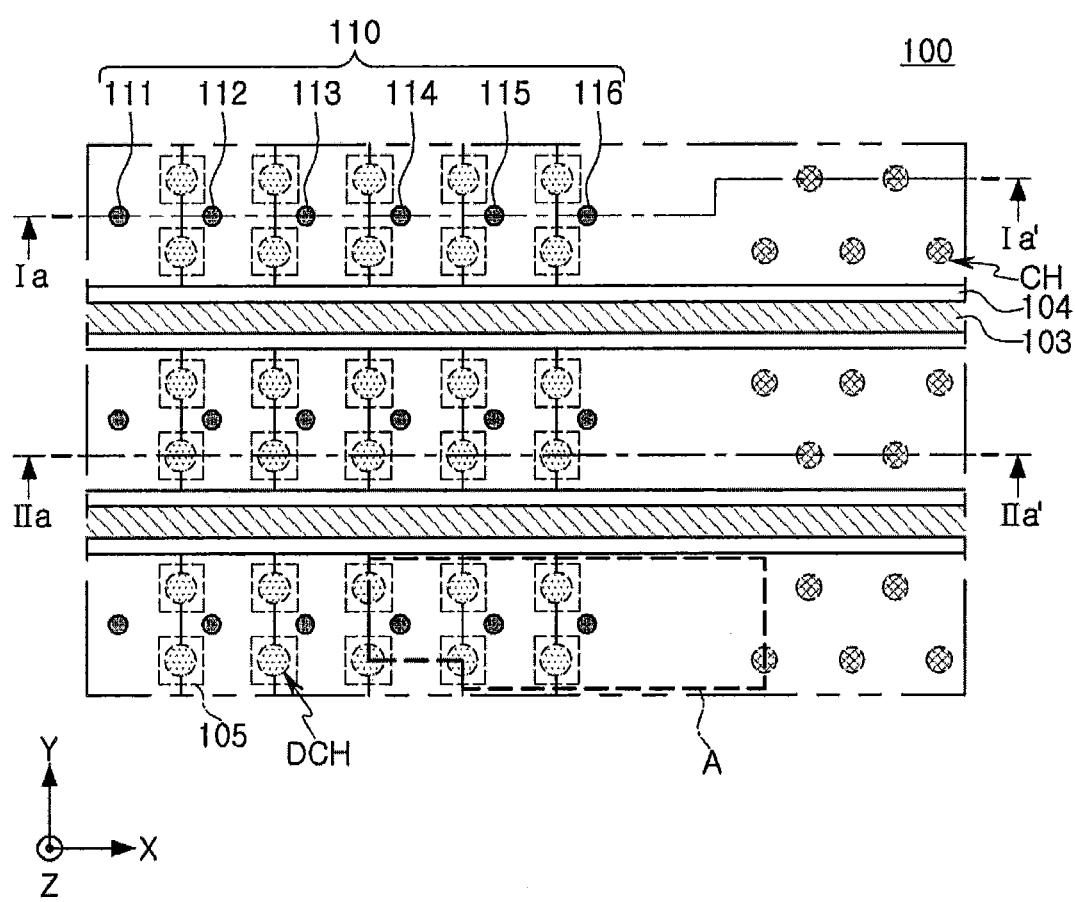
FIG. 3 is a plan view illustrating a memory device according to an exemplary embodiment of the inventive concepts.

FIG. 3 is a plan view illustrating a memory device 100 according to an exemplary embodiment of the inventive concepts.

Referring to FIG. 3, the memory device 100 includes channel regions CH, dummy channel regions DCH, a plurality of contacts 111 to 116 (110) that are connected to a plurality of gate electrode layers stacked on a substrate such that the plurality of contacts 111 to 116 (110) are adjacent the dummy channel regions DCH, and a substrate insulating layer 105 disposed between the dummy channel regions DCH and the substrate. In the exemplary embodiment of FIG. 3, the channel regions CH, the dummy channel regions DCH, and the plurality of contacts 110 may extend in a Z-axis direction, and an upper surface of the substrate may correspond to an X-Y plane, where the X, Y and Z directions are perpendicular to each other.

In the exemplary embodiment of FIG. 3, a diameter of an X-Y plane cross-section of each dummy channel region DCH is shown as being larger than a diameter of an X-Y plane cross-section each channel region CH, but the configuration is not limited thereto. That is, the diameters of the X-Y plane cross-sections of the dummy channel region DCH may be smaller than or equal to the diameters of the X-Y plane cross-sections of the channel regions CH in other embodiments. The gate electrode layers that are connected to the contacts 110 may be stacked on an upper surface of the substrate in the Z-axis direction.

A plurality of common source lines 103 may be provided that separate the gate electrode layers and the channel regions CH into a plurality of regions. A separating insulating layer 104 may be provided adjacent each common source line 103. A separation insulating layer 104 may be provided on each of opposed sidewalls of each common source line 103.

The channel regions CH may be spaced apart from one another in a first direction (the X-axis direction) and a second direction (the Y-axis direction). The number and disposition of the channel regions CH may vary according to exemplary embodiments. For example, in some embodiments, the channel regions CH may be disposed in a zigzag pattern as illustrated in FIG. 3. As shown in FIG. 3, the channel regions CH in a first region may be symmetrical to the channel regions CH in each adjacent region, but the disposition of the channel regions CH is not limited thereto.

Each of the plurality of regions defined by the common source lines 103 and the separating insulating layers 104 may together form a unit cell of the memory device 100. A source region may be provided below the common source line 103 in the Z-axis direction. When a predetermined voltage is applied to the source region, data erasing may be performed in units of unit cells of the memory device 100.

Hereinafter, the memory device 100 will be further described with reference to FIGS. 4 and 5.

Figure 4:
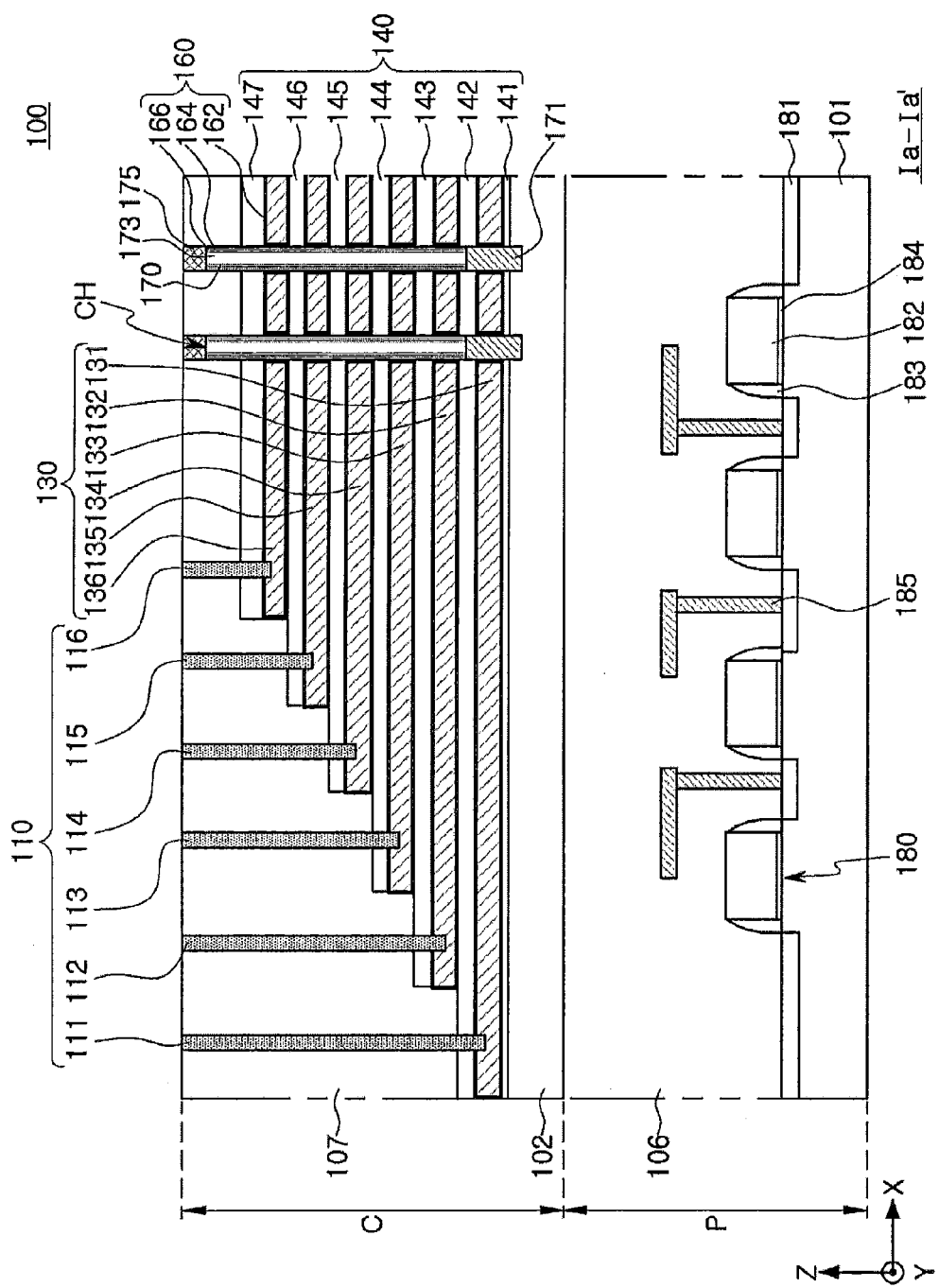
FIG. 4 is a cross-sectional view taken along line Ia-Ia' of the memory device of FIG. 3.
Figure 5:
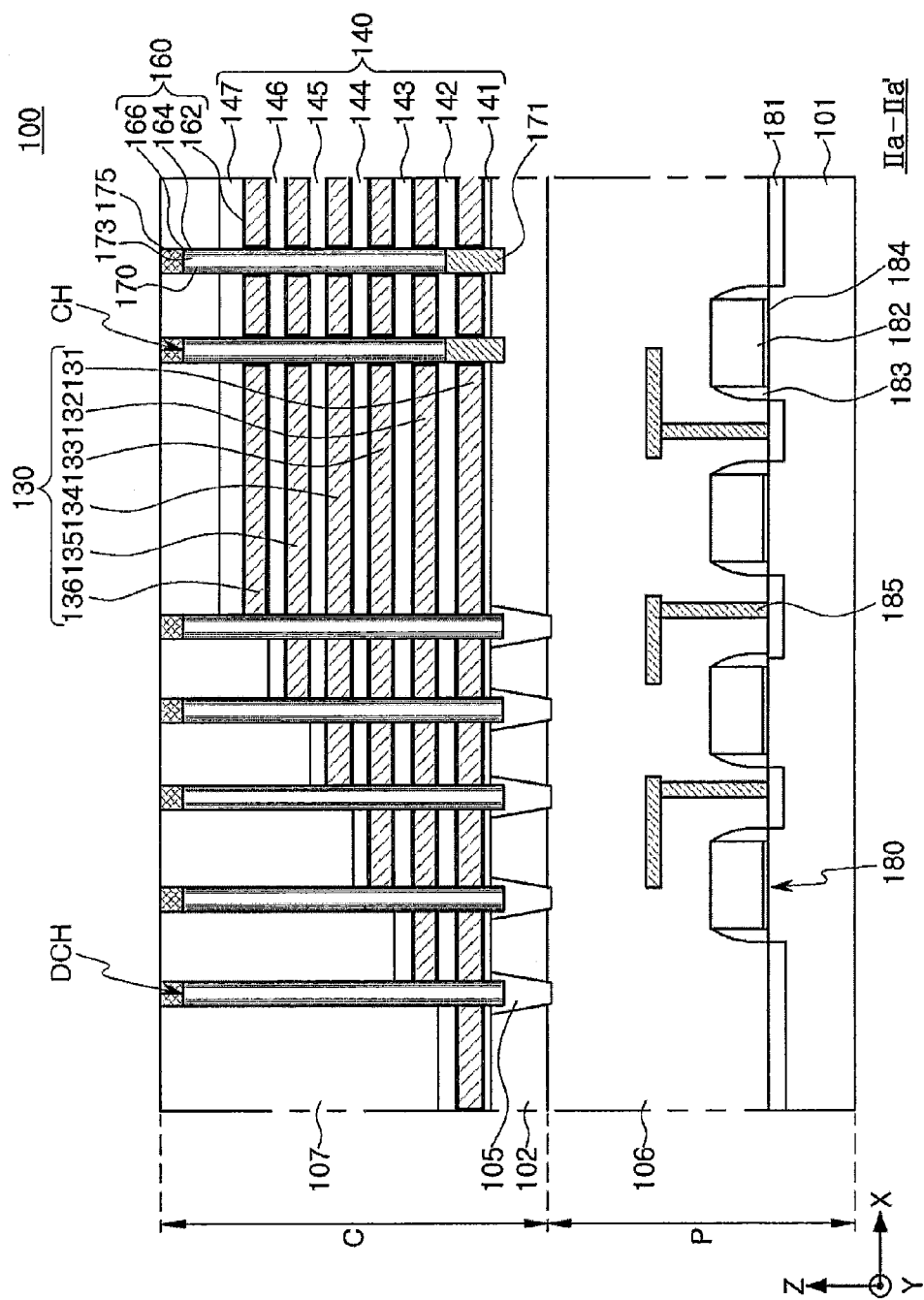
FIG. 5 is a cross-sectional view taken along line IIa-IIa' of the memory device of FIG. 3.

FIG. 4 is a cross-sectional view of the memory device 100 taken along line Ia-Ia' of FIG. 3, and FIG. 5 is a cross-sectional view of the memory device 100 taken along line IIa-IIa of FIG. 3.

The memory device 100 may have a cell-on-peri (COP) structure. Referring to FIGS. 4 and 5, a cell region C having a plurality of gate electrode layers 131 to 136 (which may be collectively referred to as the gate electrode layers 130) and channel regions CH may be provided above a peripheral circuit region P having a plurality of peripheral circuit devices 180. The peripheral circuit region P may include a first substrate 101, and the cell region C may include a second substrate 102. The first and second substrates 101 and 102 may be separate substrates. The first substrate 101 may be a semiconductor substrate having a first conductivity type (e.g., p-type). For example, the first substrate may be a semiconductor substrate that includes at least one selected from the group consisting of a single crystalline silicon layer, a silicon on insulator (SOI) wafer, a silicon layer formed on a silicon germanium (SiGe) layer, a single crystalline silicon layer formed on an insulating layer, and a polycrystalline silicon layer formed on an insulating layer.

In some embodiments, the first substrate 101 may be a single crystalline substrate, and the second substrate may be a polycrystalline silicon substrate. The second substrate 102 may be formed on a first interlayer insulating layer 106, and thus the second substrate 102 may include polycrystalline silicon. In order to improve the crystallinity of the second substrate 102, at least a portion of the first substrate 101 may extend in the Z-axis direction so as to come into contact with a lower surface of the second substrate 102 and the second substrate 102 may be crystallized. Alternatively, a polycrystalline silicon region may be formed on the first interlayer insulating layer 106 and the second substrate 102 may be formed using the polycrystalline silicon region as a seed layer. The polycrystalline silicon region used as the seed layer may be provided on an upper surface of the first interlayer insulating layer 106 or may be provided within a groove pattern formed in the first interlayer insulating layer 106 and extending in a specific direction.

The peripheral circuit region P may include the first substrate 101, the peripheral circuit devices 180, and a first interlayer insulating layer 106. In an exemplary embodiment, the peripheral circuit devices 180 may include at least one planar transistor. Referring to FIGS. 4 and 5, the at least one planar transistor may have a source/drain region 181, a gate electrode 182, a gate spacer film 183, and a gate insulating layer 184. The first interlayer insulating layer 106 may be provided on the peripheral circuit device 180, and wiring patterns 185 that are disposed within the first interlayer insulating layer 106 may be connected to the gate electrode 182 and/or the source/drain region 181. The first interlayer insulating layer 106 may include a silicon oxide, and may include a high deposition plasma (HDP) oxide film or a tetra-ethyl-ortho-silicate (TEOS) oxide film.

The cell region C may be disposed on the peripheral circuit region P. Referring to FIGS. 4 and 5, within the cell region C, the second substrate 102 may be on an upper surface of the first interlayer insulating layer 106 of the peripheral circuit region P. The channel regions CH may extend in a direction that is perpendicular to an upper surface of the second substrate 102 (i.e., the Z-direction), and the gate electrode layers 130 may be stacked on the upper surface of the second substrate 102 such that the gate electrode layers 130 are adjacent the channel regions CH. A plurality of insulating layers 141 to 147 (140) may be disposed between the gate electrode layers 130. The gate electrode layers 130 may have different lengths in the first direction (X-axis direction), forming a step structure. In the region in which the step structure is provided, the gate electrode layers 131-136 may be connected to the respective contacts 111-116. A second interlayer insulating layer 107 may be provided on the plurality of gate electrode layers 130. The second interlayer insulating layer 107 may include a silicon oxide, and may include a high deposition plasma (HDP) oxide film or a tetra-ethyl-ortho-silicate (TEOS) oxide film.

Each channel region CH may include a channel layer 170, a gate insulating layer 160 disposed between the channel layer 170 and the gate electrode layer 130, an embedded insulating layer 173 provided within the channel layer 170, and an epitaxial pattern 171 that is provided beneath the channel layer 170 and insulating layer 173. The channel layer 170 may have an annular shape and the embedded insulating layer 173 may fill a space within the annular channel layer 170. In an exemplary embodiment, the channel layer 170 may have a columnar shape such as a cylindrical shape or a prismatic shape. While not shown in the drawings, each channel region CH may have a sloped side surface such that a width thereof is reduced in a direction (the Z-direction) toward an upper surface of the second substrate 102. A drain region 175 is provided on the top surface of each channel region CH. The drain region 175 may include doped polysilicon.

The channel layers 170 may vertically overlap respective ones of the epitaxial patterns 171. Herein, a first structure that is formed on an underlying substrate "vertically overlaps" a second structure that is formed on the substrate if a line that is perpendicular to a plane defined by the top surface of the substrate bisects both the first and second structures. The epitaxial patterns 171 may be aligned underneath respective ones of the channel layers 170 so that a vertical axis of each epitaxial pattern is aligned with a vertical axis of a respective one of the channel layers 170.

Each channel layer 170 may be electrically connected to the second substrate 102 through the epitaxial pattern 171. Each channel layer 170 may include a semiconductor material such as polysilicon or single crystalline silicon, and the semiconductor material included in the channel layer 170 may be an undoped material or may be doped with a p-type or n-type impurity. The epitaxial patterns 171 may be formed via selective epitaxial growth (SEG). The epitaxial patterns 171 may be collectively referred to herein as an epitaxial layer 171.

In an exemplary embodiment, the dummy channel regions DCH may be positioned adjacent ends of respective ones of the gate electrode layers 131-136. In particular, as shown in FIG. 5, each dummy channel region DCH may be adjacent one end of one of the gate insulating layers 130 (namely the left end in the view of FIG. 5). As the number of gate electrode layers 130 increases, the length of lower ones of the gate electrode layers 130 may also increase. As the length of a gate electrode layer 130 increases, so does the possibility that the gate electrode layer 130 will be bent or broken, rather than being structurally supported, in a region far away from the channel regions CH. In an exemplary embodiment, since the dummy channel regions DCH are provided adjacent the ends of the gate electrode layers 130 that are remote from the channel regions CH, the dummy channel regions DCH may support the gate electrode layers 130, decreasing the probability that the gate electrode layers 130 may be bent or broken. However, the inventive concepts are not limited to configurations in which the dummy channel regions DCH directly contact an end of a respective gate electrode layer 130.

A substrate insulating pattern 105 may be provided below each dummy channel region DCH. Each substrate insulating pattern 105 may include silicon oxide or another insulating material, and like the first and second interlayer insulating layers 106 and 107, the substrate insulating patterns 105 may include an HDP oxide film or a TEOS oxide film. Since the substrate insulating patterns 105 cover lower surfaces and lower portions of the side surfaces of the respective dummy channel regions DCH, unlike the channel regions CH, selective epitaxial growth (SEG) may not occur in the dummy channel regions DCH, and the epitaxial patterns 171 may not be formed. Thus, a problem in which a height of the epitaxial pattern 171 is not controlled as desired during a manufacturing process so that the gate electrode layer 131 corresponding to the ground select transistor GST is electrically connected to other of the gate electrode layers 132 to 136 may be avoided. In the exemplary embodiment illustrated in FIG. 5, it is illustrated that a thickness of each substrate insulating pattern 105 is greater than that of the second substrate 102, but the inventive concepts are not limited thereto. The substrate insulating patterns 105 may be collectively referred to herein as a substrate insulating layer 105. The dummy channel regions DCH may vertically overlap respective ones of the substrate insulating patterns 105.

Referring to FIGS. 4 and 5, the gate electrode layers 130 and the insulating layers 140 may be alternately stacked in the Z-axis direction. The gate electrode layers 130 may be adjacent the channel regions CH, and may form the gate electrodes for the ground select transistor GST, the memory cell transistors MC1 to MCn, and the string select transistor SST. Gate electrode layers 132-135 may form word lines WL1 to WLn and may be commonly connected in adjacent memory cell strings in a predetermined unit arranged in the first direction (X-axis direction) and the second direction (Y-axis direction). While a total of six gate electrode layers 131-136 are illustrated in FIGS. 4-5, other numbers of gate electrodes 130 may be provided. For example, in exemplary embodiments, a total number of the gate electrode layers 130 forming the memory cell transistors MC1 to MCn may be $2^N$ (where N is a natural number).

The gate electrode layer 131 for the ground select transistors GST may be connected to the ground select line GSL. In FIGS. 4 and 5, a single gate electrode layer 135 for the string select transistors SST and a single gate electrode layer 131 for the ground select transistors GST are illustrated, but it will be appreciated that more than one string select transistor SST and/or more than one ground select transistor GST may be provided in each memory cell string. The gate electrode layers 131 and 136 corresponding to the ground select transistors GST and the string select transistors SST may have a structure different from the structure of the gate electrode layers 132-135 that correspond to the memory cell transistors MC1 to MCn.

The gate electrode layers 130 may include a polysilicon or metal silicide material. The metal silicide material may be selected from among, for example, cobalt (Co), nickel (Ni), hafnium (Hf), platinum (Pt), tungsten (W), and titanium (Ti). In exemplary embodiments, the gate electrode layers 130 may include a metal, such as tungsten (W). The gate electrode layers 130 may further include a diffusion barrier. For example, the diffusion barrier may include at least one of tungsten nitride (WN), tantalum nitride (TaN), and titanium nitride (TiN).

The gate electrode layers 130 may be alternately stacked with the insulating layers 140 in the Z-axis direction. Like the gate electrode layers 130, the insulating layers 140 may be separated in the Y-axis direction from other insulating layers 140 by the separating insulating layers 104, and the insulating layers 140 may have decreasing length in the X-axis with increasing distance from the second substrate 102 such that the insulating layers 140 form a step structure. The insulating layers 140 may include an insulating material such as silicon oxide or silicon nitride.

A gate insulating layer 160 may be interposed between each gate electrode layer 132-136 and the channel layer 170, and between the epitaxial pattern 171 and gate electrode layer 131. The gate insulating layer 160 may include a blocking layer 162, a charge storage layer 164, and a tunneling layer 166 that are sequentially stacked between the channel layer 170 and each gate electrode layer 130. The blocking layer 162 may include a high-k dielectric material. Herein, a high-k dielectric material refers to a dielectric material having a dielectric constant higher than that of silicon oxide. The tunneling layer 166 may be a layer that is configured to tunnel electric charges to the charge storage layer 164 via Fowler-Nordheim (F-N) tunneling. The tunneling layer 166 may include, for example, silicon oxide. The charge storage layer 164 may be a charge trap layer or a floating gate conductive layer. For example, the charge storage layer 164 may include a dielectric material, quantum dots, or nanocrystals. The quantum dots or nanocrystals may be formed of a conductor such as fine particles of metal or a semiconductor.

Figure 6:
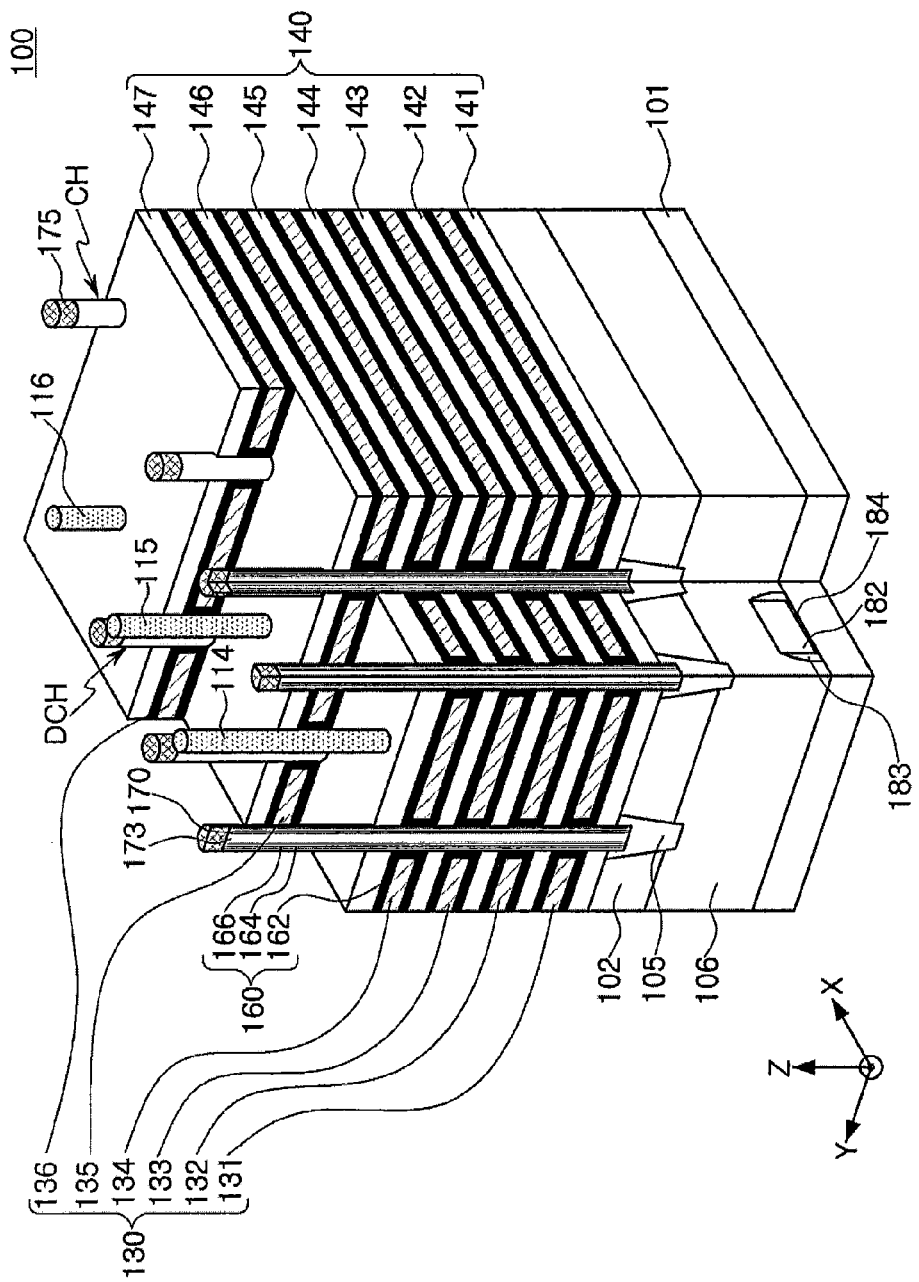
FIG. 6 is a perspective view illustrating a region "A" of the memory device of FIG. 3.

FIG. 6 is a perspective view illustrating a region "A" of the memory device 100 illustrated in FIG. 3.

Referring to FIGS. 4, 5, and 6, the memory device 100 may have a COP structure in which a cell region C is disposed on a peripheral circuit region P. The substrate insulating layer 105 may be provided in a portion of the second substrate 102 that acts as a semiconductor substrate for forming the cell region C. The substrate insulating layer 105 may include silicon oxide or the like.

The substrate insulating layer 105 may be provided in portions of the second substrate 102 that are underneath the dummy channel regions DCH. Consequently, the dummy channel regions DCH may directly contact the substrate insulating layer 105 and may not directly contact the second substrate 102. Thus, unlike the channel regions CH, selective epitaxial growth (SEG) will not occur in the lower portions of the dummy channel regions DCH during the formation of the epitaxial layer 171.

During a manufacturing process of the memory device 100, in order to form the gate electrode layers 130, the insulating layers 140 and sacrificial layers (not shown in FIGS. 3-6) may be alternately stacked in the Z-axis direction to form a mold on the second substrate 102, and thereafter, the sacrificial layers may be selectively removed through openings that are is formed for the common source lines 103 and the separating insulating layers 104. The sacrificial layers may be removed after the formation of the dummy channel regions DCH and the channel regions CH.

If the epitaxial patterns 171 are formed in the lower portions of the dummy channel regions DCH, it may be difficult to control the height of the epitaxial patterns 171, and thus a portion of the gate insulating layer 160, for example, the charge storage layer 164, that is included in the dummy channel regions DCH may be removed when the sacrificial layers are removed. If this occurs, after the sacrificial layers are removed, when a conductive material such as polysilicon, a metal, or a metal silicide material is injected to form the gate electrode layers 130 in the openings created by removal of the sacrificial layers, the conductive material may also be introduced into the regions from which portions of the gate insulating layer 160 has been removed, and this conductive material may electrically connect the middle portions of the gate electrode layers 130. However, in an exemplary embodiment, since the substrate insulating patterns 105 are provided below the dummy channel regions DCH so that the epitaxial patterns 171 are not included in the dummy channel regions DCH, the foregoing problem may be reduced or prevented.

Figure 7:
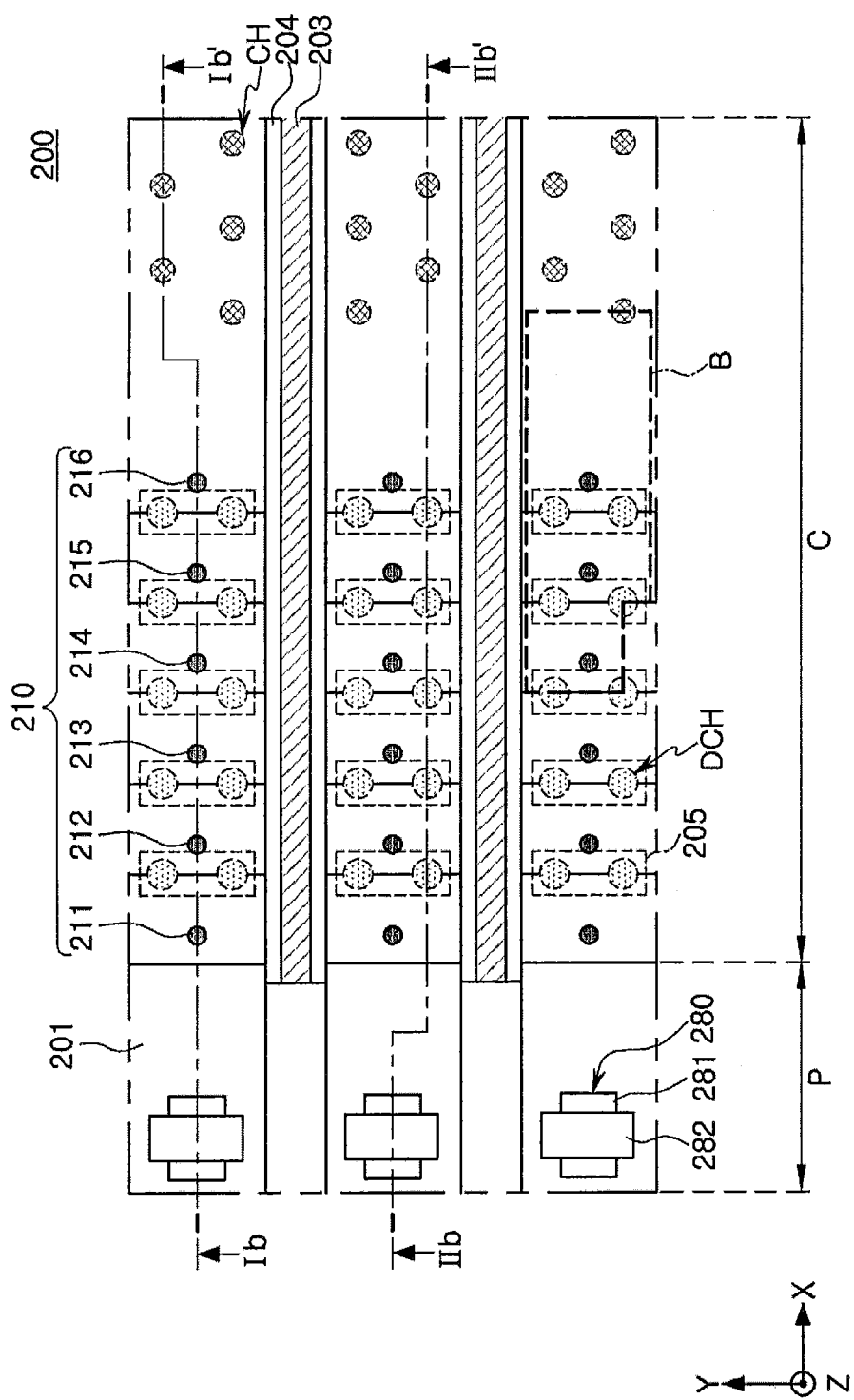
FIG. 7 is a plan view illustrating a memory device according to another exemplary embodiment of the inventive concepts.

FIG. 7 is a plan view illustrating a memory device 200 according to another exemplary embodiment of the inventive concepts.

Referring to FIG. 7, the memory device 200 may include a cell region C and a peripheral circuit region P. The cell region C and the peripheral circuit region P may be adjacent each other in the first direction (X-axis direction) and may be regions that are defined on a single substrate 201. A plurality of peripheral circuit devices 280 in the form of planar transistors having source/drain regions 281 and gate electrodes 282 may be provided in the peripheral circuit region P.

Channel regions CH, dummy channel regions DCH, common source lines 203, separating insulating layers 204, and a plurality of contacts 211 to 216 (210) may be disposed in the cell region C. The channel regions CH and the dummy channel regions DCH may vertically penetrate through at least a portion of a plurality of gate electrode layers (see FIGS. 8 and 9) that are stacked on an upper surface (X-Y plane) of the substrate 201. The contacts 211-216 may be connected to respective ones of the gate electrode layers. The gate electrode layers may be divided into a plurality of unit cell regions by the common source lines 203 and the separating insulating layers 204.

In the exemplary embodiment illustrated in FIG. 7, a plurality of substrate insulating patterns 205 are provided that are disposed between the dummy channel regions DCH and the substrate 201. These substrate insulating patters 205 may be collectively referred to herein as a substrate insulating layer 205. Each substrate insulating pattern 205 may extend in the Y-axis direction. Each substrate insulating pattern 205 may correspond to a plurality of dummy channel regions DCH. Hereinafter, the structure of the memory device 200 will be described in further detail with reference to FIGS. 8 through 10.

Figure 8:
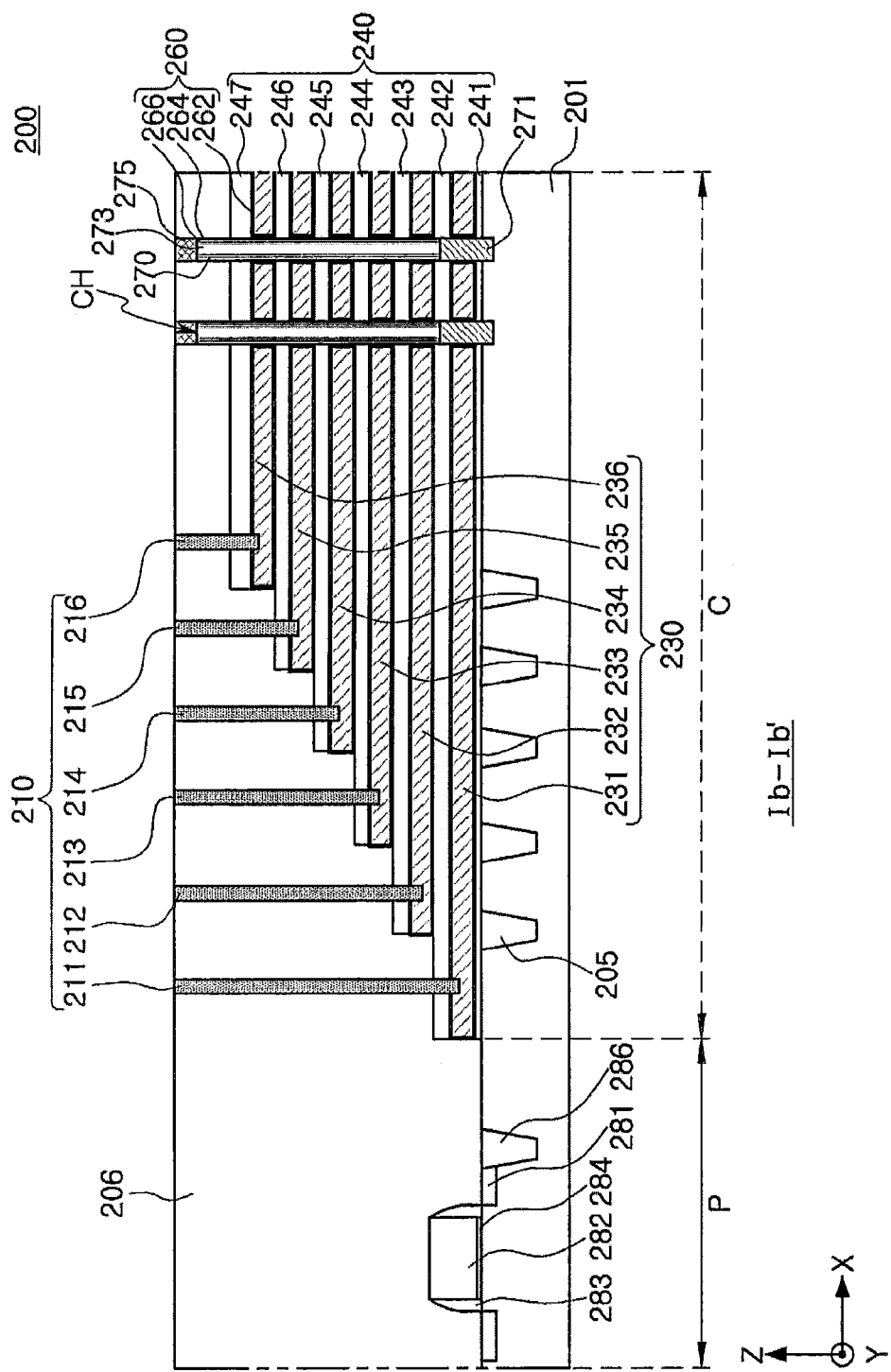
FIG. 8 is a cross-sectional view taken along line Ib-Ib' of the memory device of FIG. 7.
Figure 9:
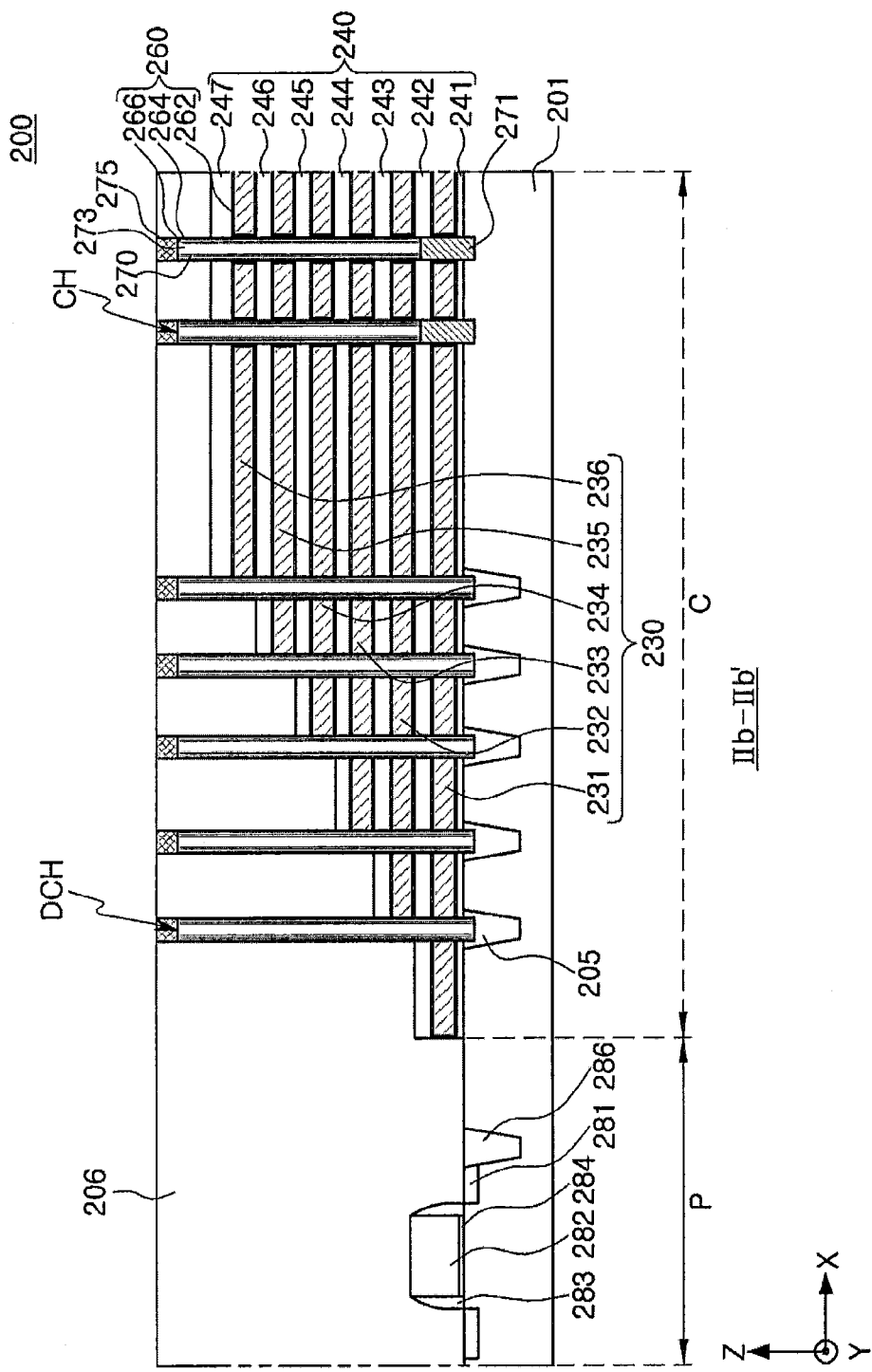
FIG. 9 is a cross-sectional view taken along line IIb-IIb' of the memory device of FIG. 7.
Figure 10:
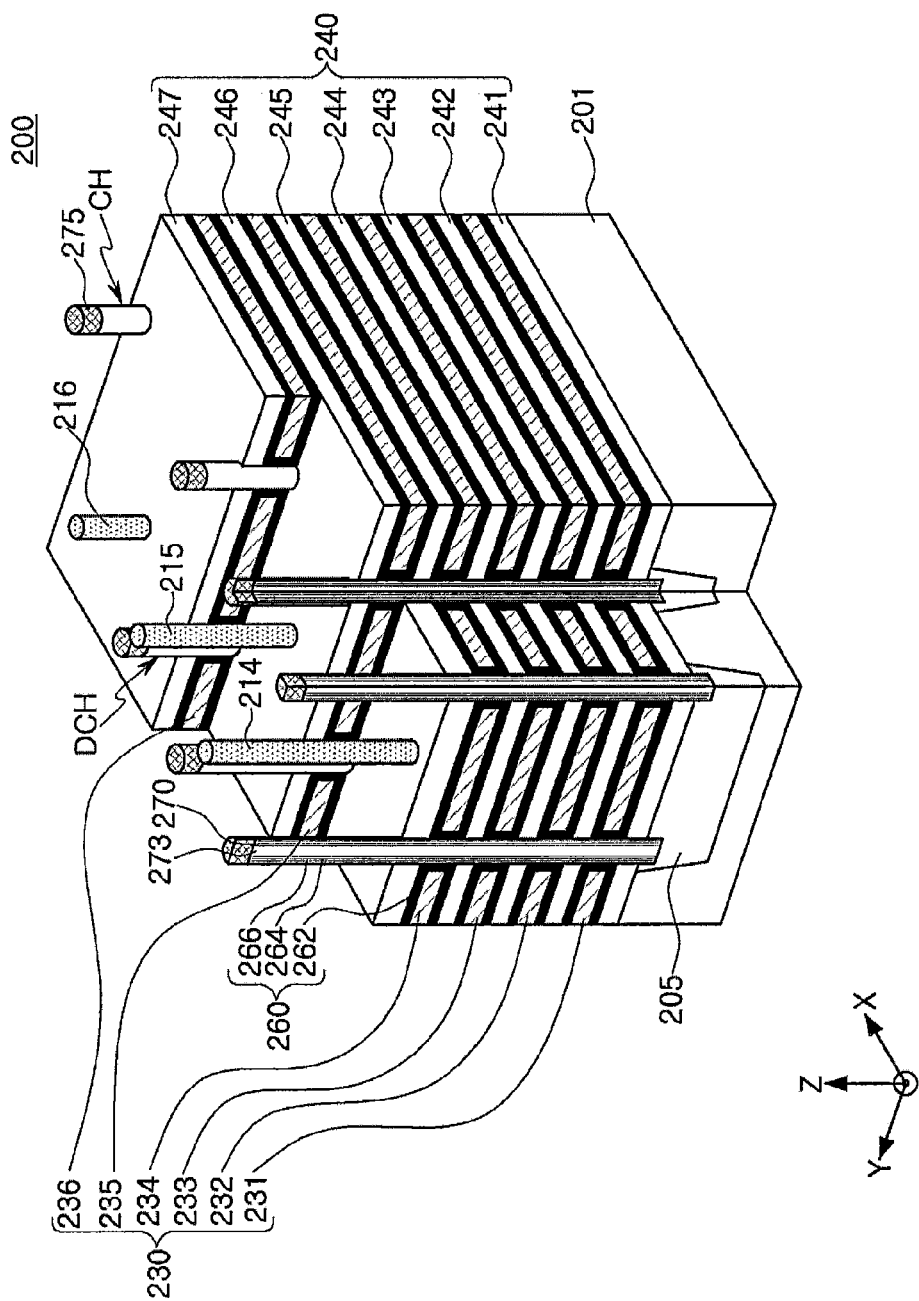
FIG. 10 is a perspective view illustrating a region "B" of the memory device of FIG. 7.

FIG. 8 is a cross-sectional view taken along line Ib-Ib' of the memory device of FIG. 7, FIG. 9 is a cross-sectional view taken along line IIb-IIb' of the memory device of FIG. 7, and FIG. 10 is a perspective view illustrating a region "B" of the memory device of FIG. 7.

Referring to FIG. 8, a plurality of gate electrode layers 231 to 236 (230) and a plurality of insulating layers 241 to 247 (240) may be alternately stacked in the Z-axis direction on an upper surface of the substrate 201. The gate electrode layers 230 may have different lengths in the first direction (X-axis direction) to form a step structure, and in the region in which the step structure is formed, the gate electrode layers 230 may be connected to respective ones of the contacts 210. The insulating layers 240 may extend with the same length in the first direction (X-axis direction) as respective gate electrode layers 230 that are adjacent thereto.

The peripheral circuit device 280 disposed in the peripheral circuit region P may be a planar transistor and may include a source/drain region 281, a gate electrode 282, a gate spacer film 283, and a gate insulating layer 284. Isolation films 286 may be formed between adjacent peripheral circuit devices 280 and/or between the peripheral circuit devices 280 and the gate electrode layers 230.

The channel regions CH may penetrate through the gate electrode layers 230. Each channel region may include a channel layer 270 that extends in the Z-axis direction and that is adjacent the gate electrode layers 230 with the gate insulating layer 260 interposed therebetween. In particular, the gate insulating layer 260 may be interposed between each gate electrode layer 232-236 and the channel layer 270. The gate insulating layer 260 may include a blocking layer 262, a charge storage layer 264, and a tunneling layer 266. An inner space of the channel layer 270 may be filled with an embedded insulating layer 273. An epitaxial pattern 271 may form the lower portion of each channel region CH. The gate insulating layer 260 may also be between each epitaxial pattern 271 and the gate electrode layer 231. A drain region 275 may be provided on the opposite end of each channel region CH.

Referring to FIG. 9, the dummy channel regions DCH may be adjacent respective ends of the gate electrode layers 230. Like the channel regions CH, the dummy channel regions DCH may include a channel layer 270 and an embedded insulating layer 273. A drain region 275 may be formed on an upper surface of each dummy channel region DCH. However, the dummy channel regions DCH do not include the epitaxial patterns 271. A substrate insulating pattern 205 including silicon oxide or the like may be disposed beneath each dummy channel region DCH.

Each substrate insulating pattern 205 may be between a respective one of the dummy channel regions DCH and the substrate 201 and may prevent formation of the epitaxial pattern 271 in the lower portions of the respective dummy channel region DCH through selective epitaxial growth. Thus, a short circuit phenomenon that may occur between some gate electrode layers 230 and the channel regions CH may be avoided when the gate electrode layers 230 are formed after the formation of the dummy channel regions DCH, and the breakdown voltage (BV) characteristics of the gate electrode layer 231 that is connected to the ground select line GSL may be improved.

According to an exemplary embodiment, the substrate insulating patterns 205 may extend in a specific direction within the substrate 201. Referring to FIGS. 7 and 10, the substrate insulating patterns 205 may extend in the Y-axis direction within the substrate 201. Thus, two dummy channel regions DCH may correspond to each substrate insulating pattern 205. That is, one substrate insulating pattern 205 may be disposed between two dummy channel regions DCH and the substrate 201.

Figure 11:
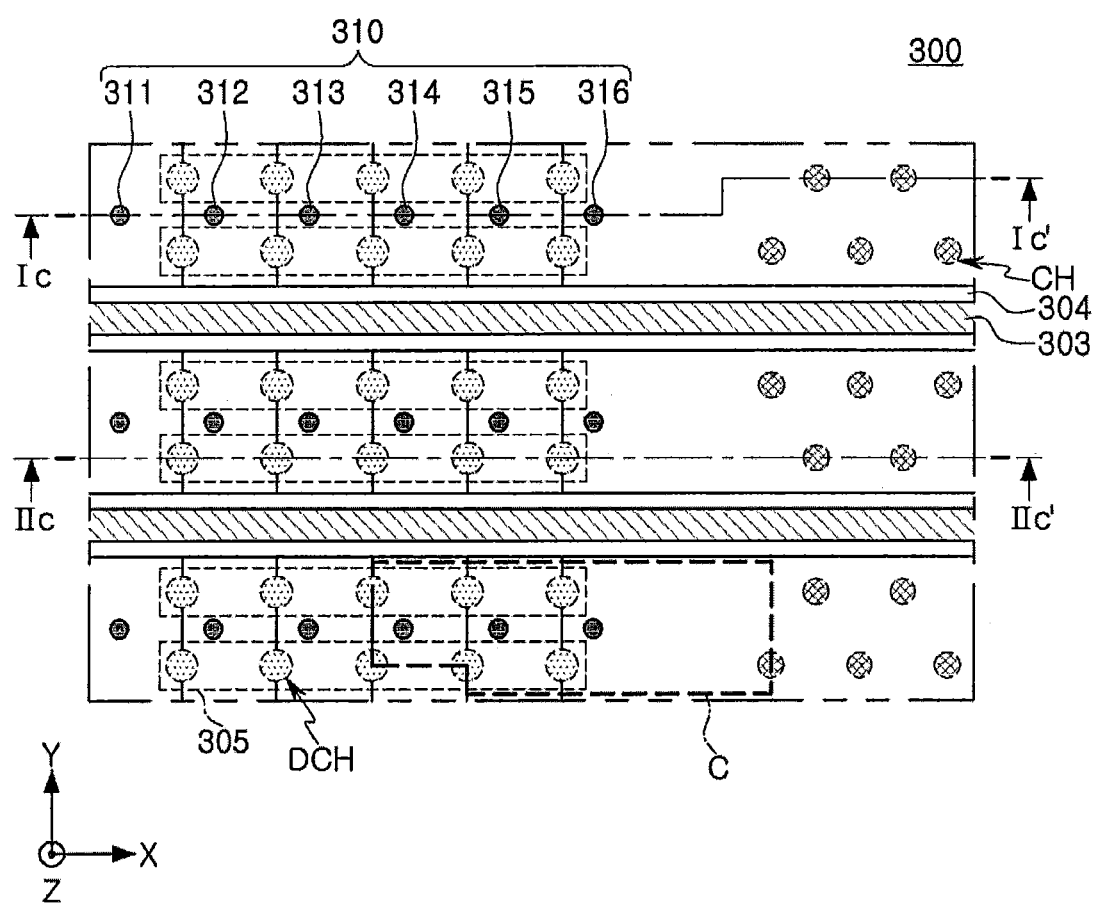
FIG. 11 is a plan view illustrating a memory device according to a further exemplary embodiment of the inventive concepts.

FIG. 11 is a plan view illustrating a memory device 300 according to another exemplary embodiment of the inventive concepts.

Referring to FIG. 11, the memory device 300 may include channel regions CH, dummy channel regions DCH that are provided separately from the channel regions CH, a plurality of contacts 311 to 316 (310) that are connected to a plurality of gate electrode layers, and separating insulating layers 304 and common source lines 303 that divide the gate electrode layers into a plurality of unit cell regions. The gate electrode layers may extend with different lengths in the first direction (X-axis direction) and may be physically and/or electrically connected to respective ones of the contacts 310. In an exemplary embodiment, substrate insulating patterns 305 may be provided below the respective dummy channel regions DCH, and thus, epitaxial patterns 371 that form lower portions of the channel regions CH may not be included in the dummy channel regions DCH.

Figure 12:
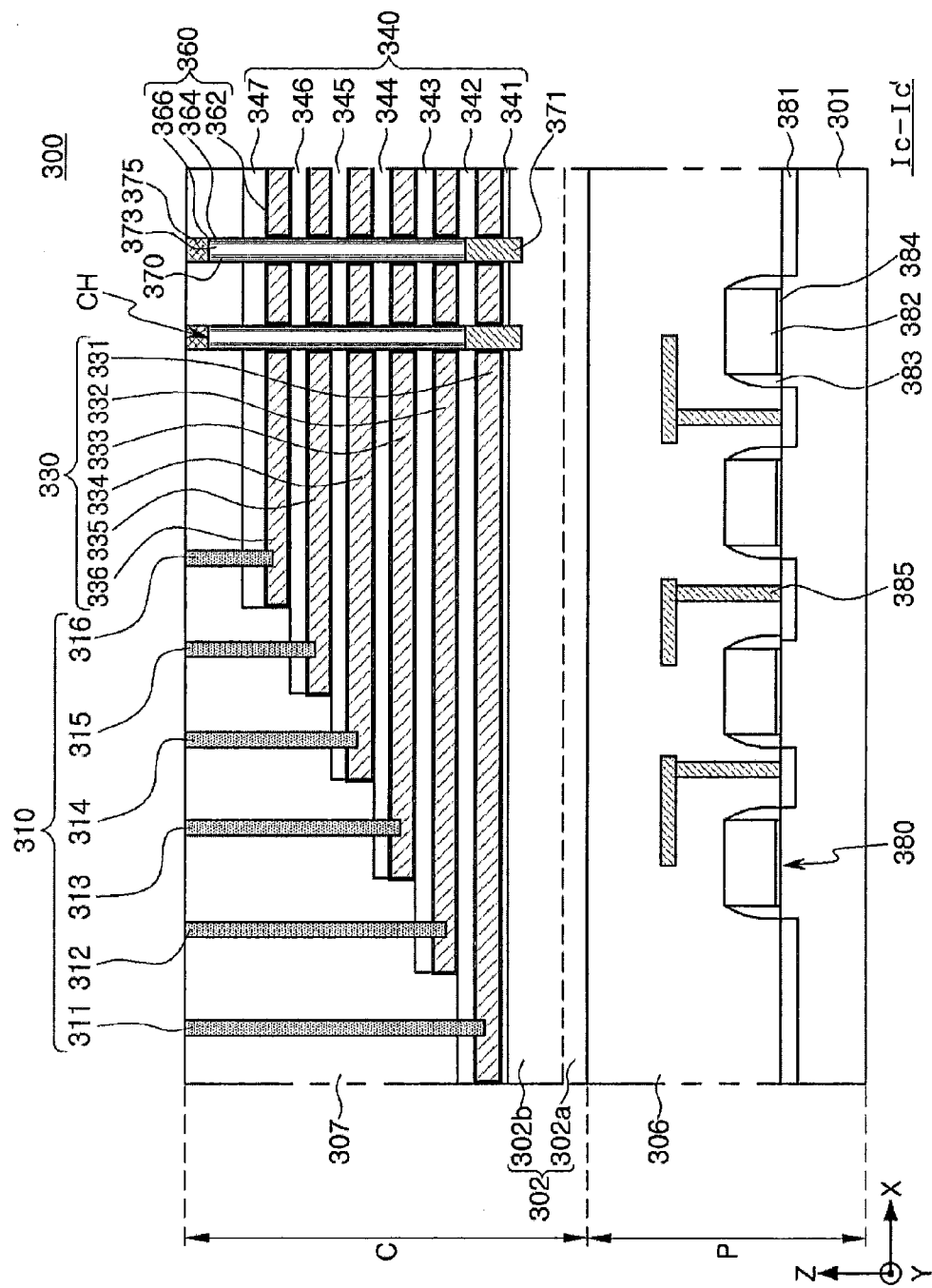
FIG. 12 is a cross-sectional view taken along line Ic-Ic' of the memory device of FIG. 11.
Figure 13:
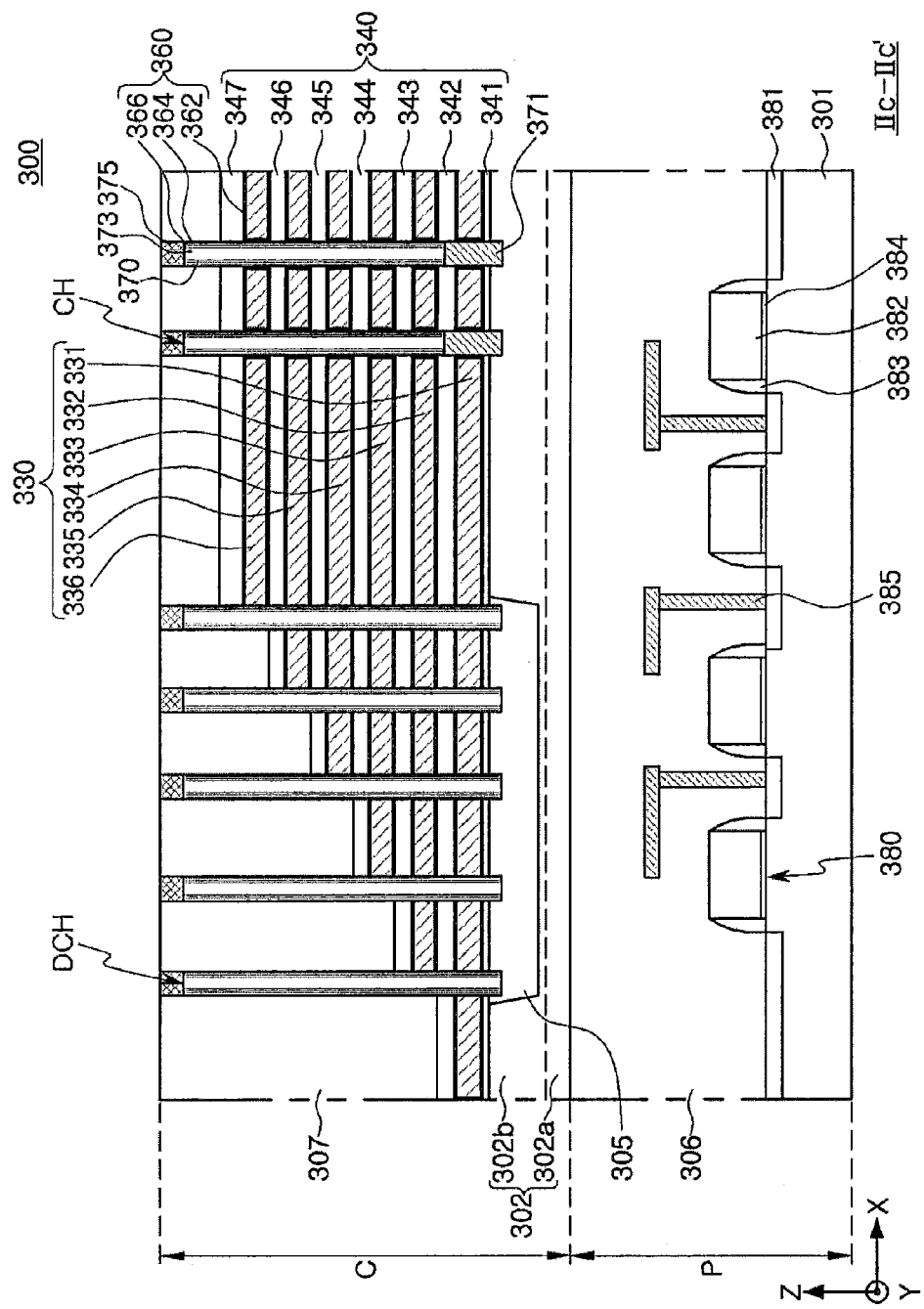
FIG. 13 is a cross-sectional view taken along line IIc-IIc' of the memory device of FIG. 11.
Figure 14:
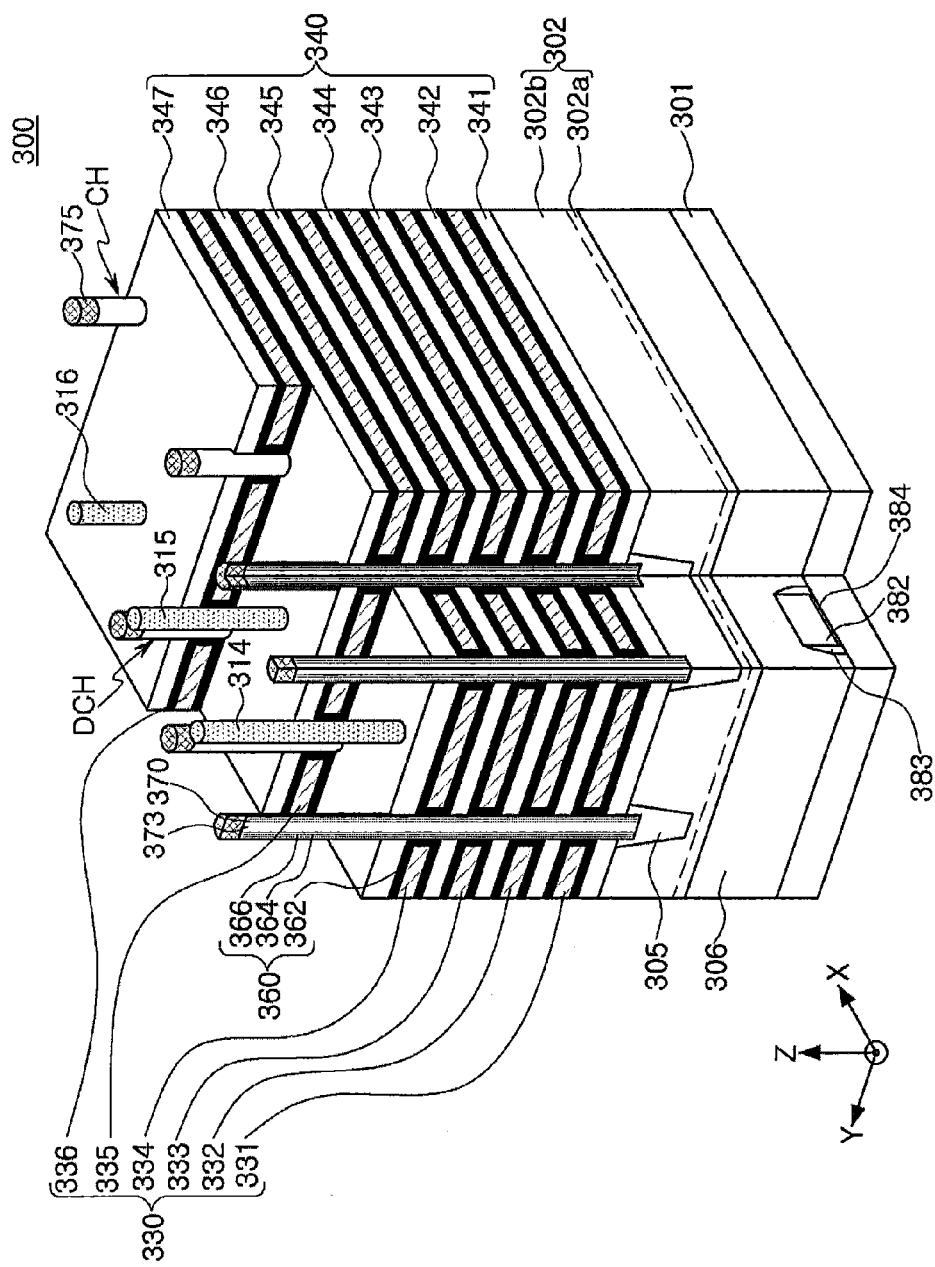
FIG. 14 is a perspective view illustrating a region "C" of the memory device of FIG. 11.

FIG. 12 is a cross-sectional view of the memory device 300 taken along line Ic-Ic' of FIG. 11, FIG. 13 is a cross-sectional view of the memory device 300 taken along line IIc-IIc' of FIG. 11, and FIG. 14 is a perspective view illustrating a region "C" of the memory device 300 that is illustrated in FIG. 11.

Referring to FIG. 12, the memory device 300 may have a cell-on-peri (COP) structure in which a cell region C is disposed on a peripheral circuit region P. The peripheral circuit region P may include a first substrate 301, and a plurality of peripheral circuit devices 380 and a first interlayer insulating layer 306 may be disposed on the first substrate 301. The peripheral circuit devices 380 may comprise planar transistors that include source/drain regions 381, gate electrode layers 382, gate spacer films 383, and gate insulating layers 384, and may be electrically connected to wiring patterns 385.

A second substrate 302 may be disposed on an upper surface of the first interlayer insulating layer 306. The second substrate 302 may include a first layer 302a that may directly contact an upper surface of the first interlayer insulating layer 306, and a second layer 302b that is disposed on an upper surface of the first layer 302a. The first layer 302a may be provided as a seed layer for forming the second layer 302b. In an exemplary embodiment, the second layer 302b may be formed via epitaxial growth using the first layer 302a as a seed layer.

The first layer 302a may be a silicon layer formed using disilane ($Si_2H_6$) as a silicon source, and in particular, the first layer 302a may include large-grained polycrystalline silicon. An average diameter of crystal grains included in the first layer 302a may be greater than a thickness of the first layer 302a. For example, an average diameter of the crystal grains included in the first layer 302a may be a few to tens of micrometers. The second layer 302b may be formed through selective epitaxial growth using the first layer 302a as a seed layer. Like the first layer 302a, the second layer 302b may include polycrystalline silicon, and an average size, for example, an average diameter, of the polycrystalline silicon crystal grains included in the second layer 302b may be greater than that of the polycrystalline silicon crystal grains included in the first layer 302a. Thus, compared to the first layer 302a, the second layer 302b may have relatively few defects.

The second layer 302b may be thicker than the first layer 302a in the Z-axis direction. In the cell region, a pocket P-well may be formed within the second substrate 302, and here, the pocket P-well may be formed only in the second layer 302b and not in the first layer 302a. Thus, the second layer 302b may be grown to have a thickness sufficient for forming the pocket P-well.

The cell region C may include a plurality of gate electrode layers 331 to 336 (330) and a plurality of insulating layers 341 to 347 (340). The gate electrode layers 330 and the insulating layers 340 may be alternately stacked on the second substrate 302 in the Z-axis direction. The gate electrode layers 330 and the insulating layers 340 may extend with different lengths in the first direction (X-axis direction) to form a step structure. In the region in which the step structure is formed, the contacts 310 may be connected to respective ones of the gate electrode layers 330.

Each channel region CH may include a channel layer 370, an embedded insulating layer 373 and an epitaxial pattern 371. A drain region 375 may be provided above each channel region CH. The drain region 375 may comprise polysilicon. The polysilicon may or may not be doped with an impurity. The epitaxial patterns 371 may be grown via selective epitaxial growth from the second substrate 302. Gate insulating layers 360 may be provided between each channel layer 370 and the gate electrode layers 332-336 and between each epitaxial pattern 371 and the gate electrode layer 331. Each gate insulating layer 360 may include a blocking layer 362, a charge storage layer 364, and a tunneling layer 366. The blocking layer 362 may surround the gate electrode layers 330.

Referring to FIG. 13, dummy channel regions DCH may be provided adjacent first ends of the gate electrode layers 330. Like the channel regions CH, the dummy channel regions DCH may include a channel layer 370 and an embedded insulating layer 373. A drain region 375 may be provided above each dummy channel region DCH. However, the epitaxial patterns 371 are not included in the dummy channel regions DCH. A substrate insulating pattern 305 that includes silicon oxide or the like may be provided between each dummy channel region DCH and the second substrate 302. The substrate insulating patterns 305 may be collectively referred to herein as a substrate insulating layer 305.

The substrate insulating patterns 305 may prevent formation of the epitaxial patterns 371 in the dummy channel regions DCH through selective epitaxial growth. Thus, a short circuit phenomenon that may occur between some gate electrodes 330 and the channel regions CH may be avoided even though the gate electrode layers 330 are formed after forming the dummy channel regions DCH, and the breakdown voltage (BV) characteristics of the gate electrode layer 331 that is connected to the ground select line GSL may be improved.

According to an exemplary embodiment, each substrate insulating pattern 305 may extend in a specific direction within the substrate 302. Referring to FIGS. 11 through 14, each substrate insulating pattern 305 may extend in the X-axis direction within the substrate 302. Thus, multiple dummy channel regions DCH may correspond to each substrate insulating pattern 305. For example, as shown in FIGS. 13 and 14, five dummy channel regions DCH may correspond to one substrate insulating pattern 305. In other words, one substrate insulating pattern 305 may surround the lower portions of five dummy channel regions DCH.

Figure 15:
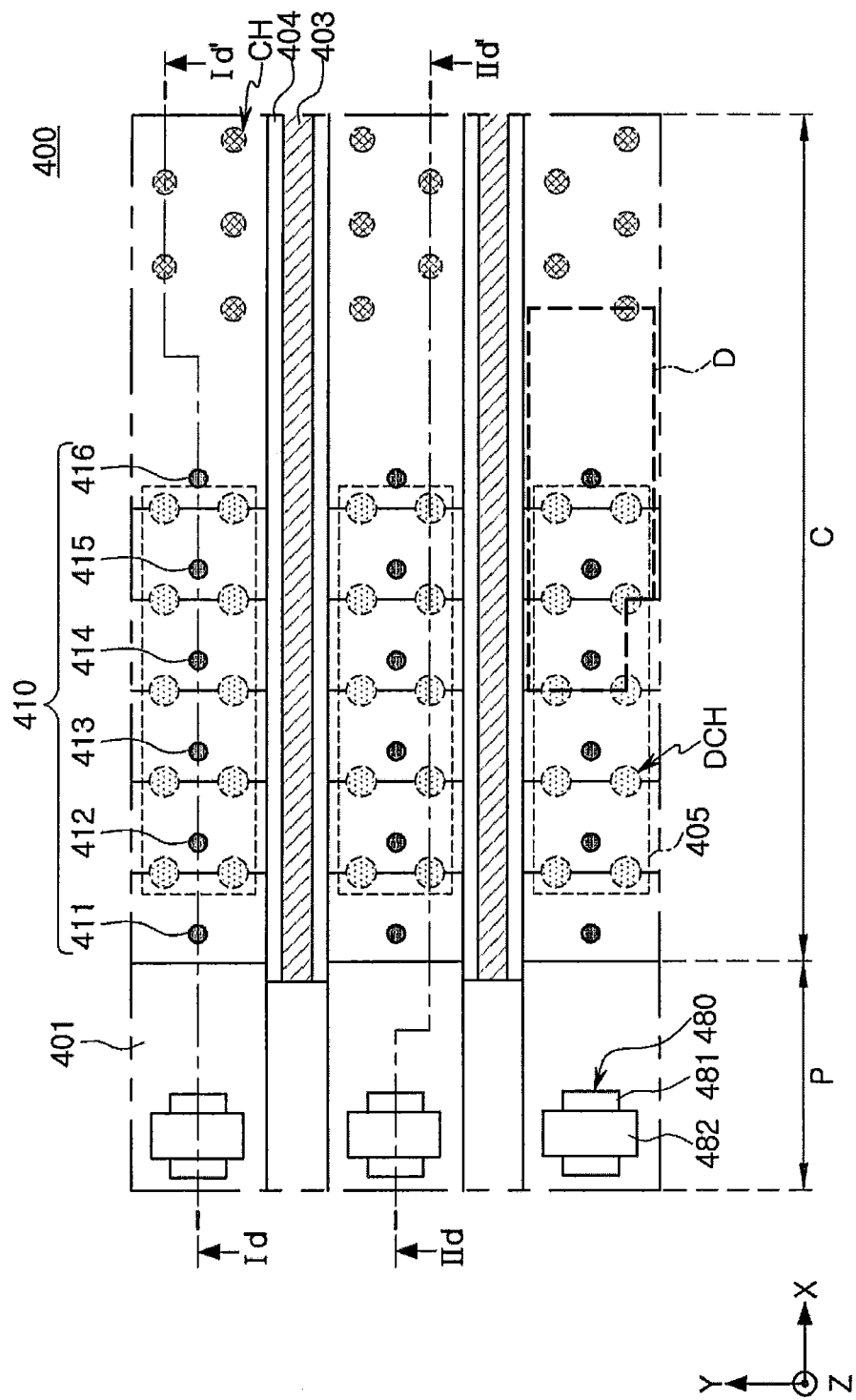
FIG. 15 is a plan view illustrating a memory device according to yet another exemplary embodiment of the inventive concepts.

FIG. 15 is a plan view illustrating a memory device 400 according to yet another exemplary embodiment of the inventive concepts.

Referring to FIG. 15, the memory device 400 may include a cell region C and a peripheral circuit region P. The cell region C and the peripheral circuit region P may be adjacent each other in the first direction (X-axis direction) and may be defined in a single substrate 401. A plurality of peripheral circuit devices 480 that have source/drain regions 481 and planar gate electrodes 482 may be provided in the peripheral circuit region P.

Channel regions CH, dummy channel regions DCH, common source lines 403, separating insulating layers 404, and a plurality of contacts 411 to 416 (410) may be disposed in the cell region C. The channel regions CH and the dummy channel regions DCH may penetrate through at least some of a plurality of gate electrode layers in the Z-axis direction that are stacked on an upper surface (X-Y plane) of the substrate 401, and the contacts 410 may be connected to respective ones of the gate electrode layers. The gate electrode layers may be divided into a plurality of unit cell regions by the common source line 403 and the separating insulating layers 404.

Substrate insulating patterns 405 are disposed between the dummy channel regions DCH and the substrate 401 to cover lower portions of the respective dummy channel regions DCH. The substrate insulating patterns 405 may be collectively referred to herein as a substrate insulating layer 405. In the exemplary embodiment of FIG. 15, it is illustrated that one substrate insulating pattern 405 is provided per unit cell region, but the substrate insulating patterns 405 may also be formed differently. For example, two or more substrate insulating patterns 405 may be provided per unit cell region.

Hereinafter, the memory device 400 will be described with reference to FIGS. 16 through 18.

Figure 16:
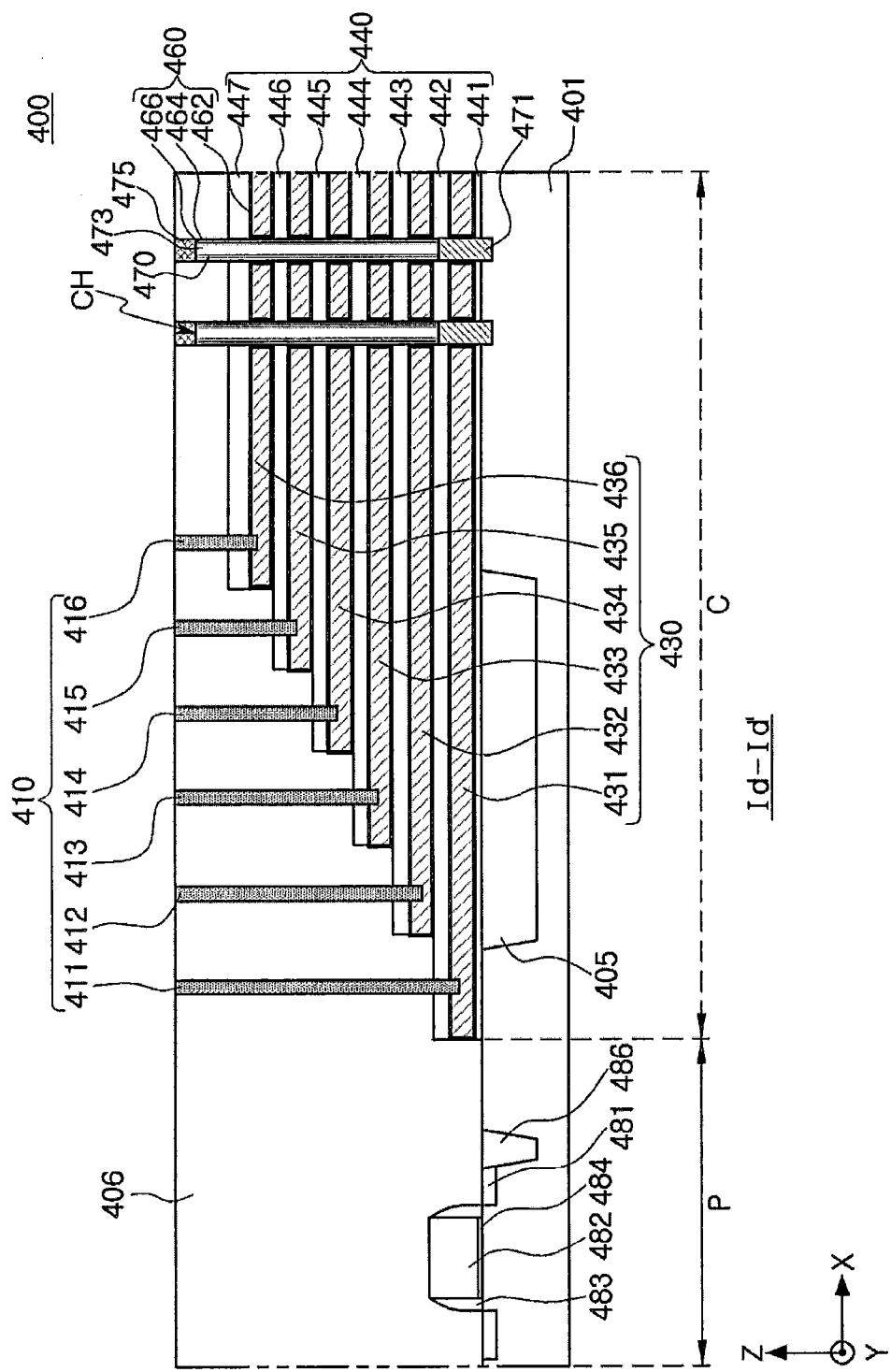
FIG. 16 is a cross-sectional view taken along line Id-Id' of the memory device of FIG. 15.
Figure 17:
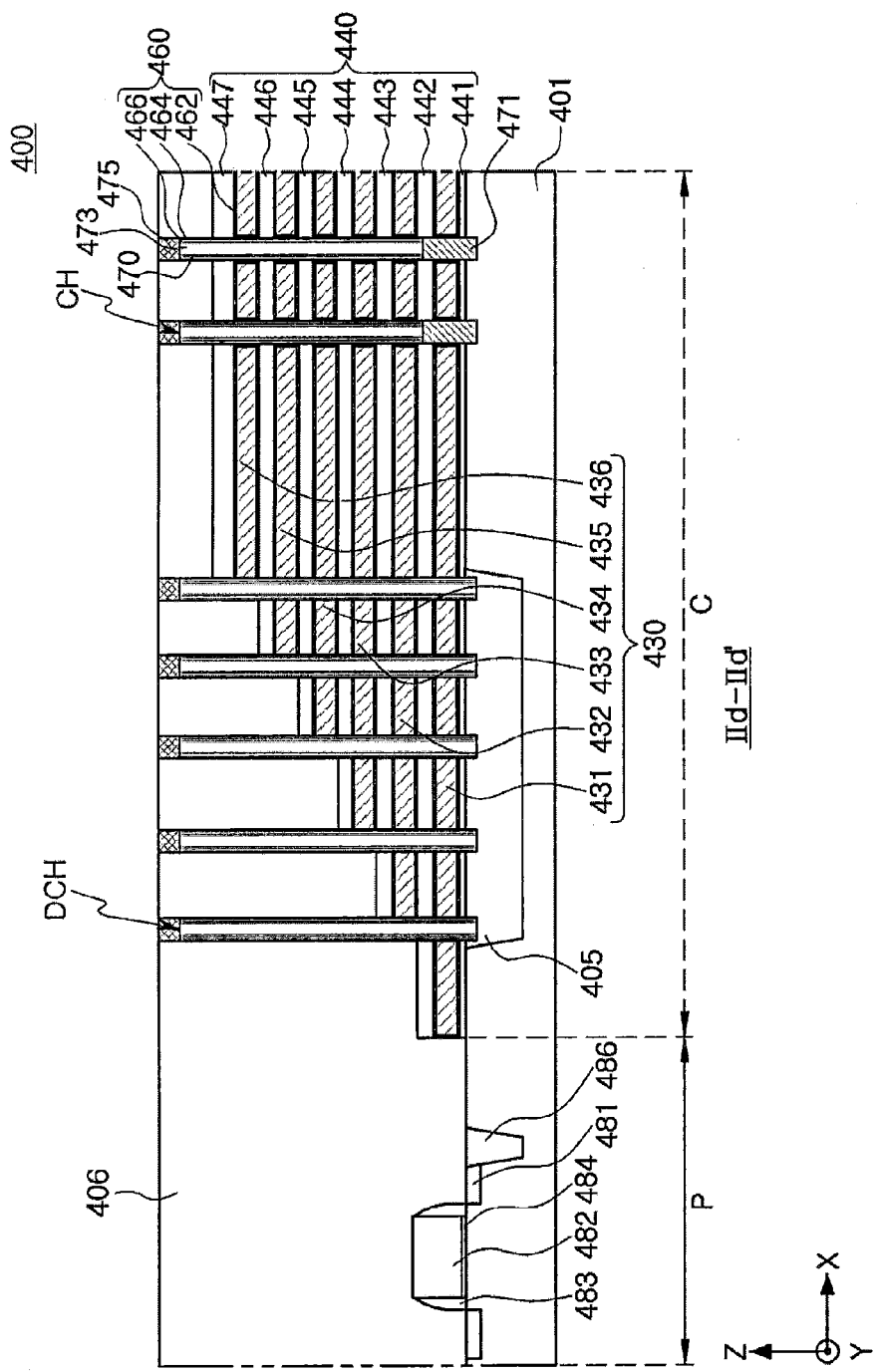
FIG. 17 is a cross-sectional view taken along line IId-IId' of the memory device of FIG. 15.
Figure 18:
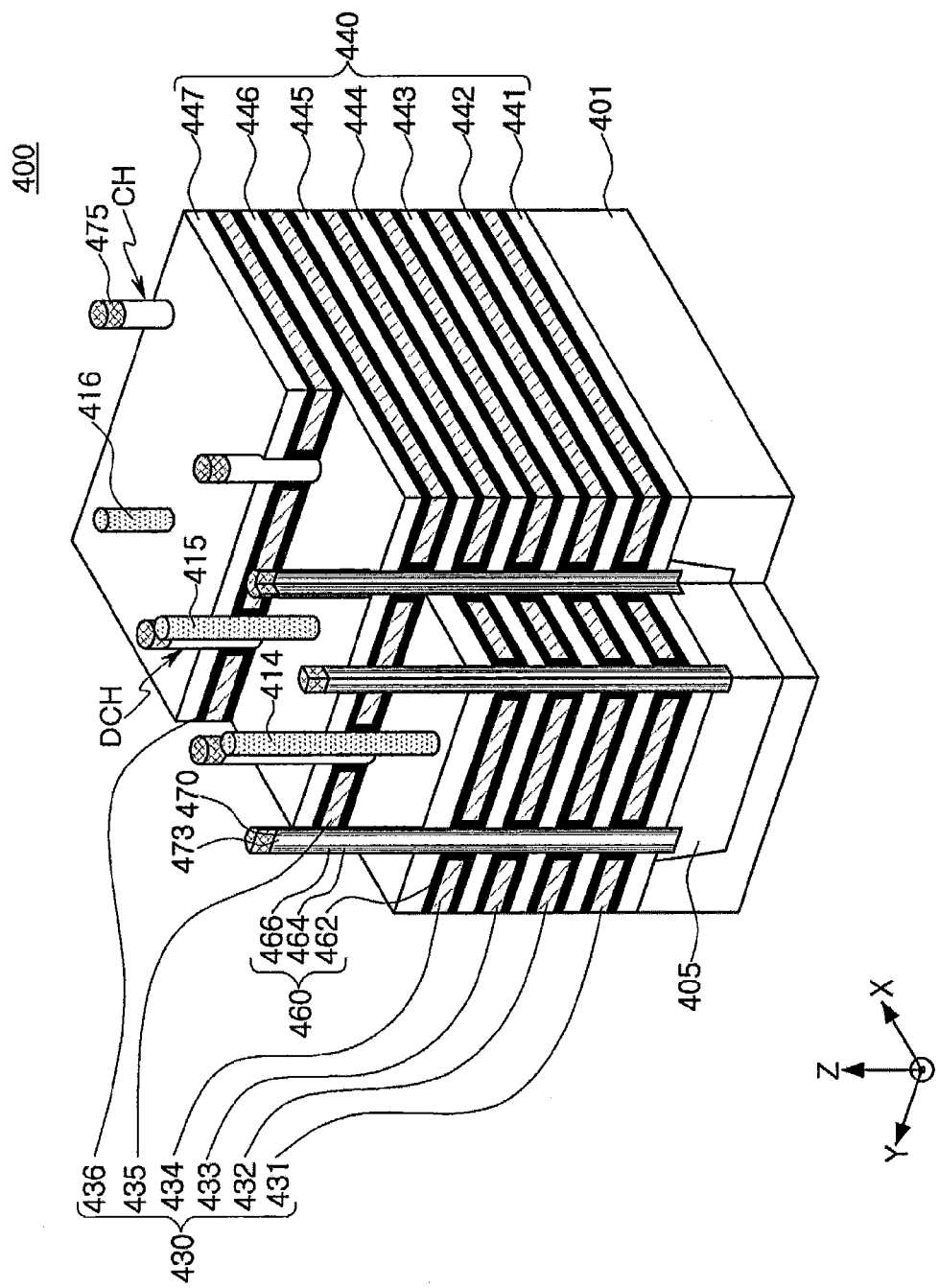
FIG. 18 is a perspective view illustrating a region "D" of the memory device of FIG. 15.

FIG. 16 is a cross-sectional view of the memory device 400 taken along line Id-Id' of FIG. 15, FIG. 17 is a cross-sectional view of the memory device 400 taken along line IId-IId' of FIG. 15, and FIG. 18 is a perspective view illustrating a region "D" of the memory device 400 that is illustrated in FIG. 15.

Referring to FIG. 16, a plurality of gate electrode layers 431 to 436 (430) and a plurality of insulating layers 441 to 447 (440) may be alternately stacked on an upper surface of the substrate 401 in the Z-axis direction. The gate electrode layers 430 may extend with different lengths in the first direction (X-axis direction) to form a step structure, and in the region in which the step structure is formed, the gate electrode layers 430 may be connected to respective ones of the contacts 410. The insulating layers 440 may extend with the same length in the first direction as the gate electrode layers 430 that are adjacent thereto.

Each channel region CH may include a channel layer 470, an embedded insulating layer 473 and an epitaxial pattern 471. A drain region 475, which may be identical to the drain region 375 described above, may be provided above each channel region CH. Gate insulating layers 460 may be provided between each channel layer 470 and the gate electrode layers 432-436 and between each epitaxial pattern 471 and the gate electrode layer 431. Each gate insulating layer 460 may include a blocking layer 462, a charge storage layer 464, and a tunneling layer 466.

The peripheral circuit device 480 disposed in the peripheral circuit region P may be a planar transistor and may include a source/drain region 481, a gate electrode 482, a gate spacer film 483, and a gate insulating layer 484. A plurality of peripheral circuit devices 480 may be provided, and isolation films 486 may be formed between adjacent peripheral circuit devices 480 and/or between the peripheral circuit devices 480 and the gate electrode layers 430.

Referring to FIG. 17, dummy channel regions DCH may be provided between the channel regions CH and the peripheral circuit devices 480. Each dummy channel region DCH may include a channel layer 470 and an embedded insulating layer 473. A drain region 475 may be provided on a top surface of each dummy channel region DCH. However, the dummy channel regions DCH do not include the epitaxial patterns 471. Instead, a substrate insulating pattern 405 having insulating properties may be disposed between each dummy channel region DCH and the substrate 401. Each substrate insulating pattern 405 may cover a lower surface and a lower portion of side surface of a plurality of the dummy channel regions DCH. The substrate insulating patterns 405 may be collectively referred to herein as a substrate insulating layer 405.

The substrate insulating layer 405 may be disposed between the respective dummy channel regions DCH and the substrate 401 and may avoid formation of the epitaxial patterns 471 in the dummy channel regions DCH during a selective epitaxial growth process. Thus, a short circuit phenomenon that may occur between some gate electrodes 430 and the dummy channel regions DCH may be avoided even though the gate electrode layers 430 are formed after the dummy channel regions DCH, and the breakdown voltage (BV) characteristics of the gate electrode layer 431 that is connected to the ground select line GSL may be improved.

According to an exemplary embodiment, each substrate insulating pattern 405 may surround (cover) bottom portions of a respective one of the dummy channel regions DCH. Referring to FIGS. 15 through 18, one substrate insulating pattern 405 may be provided per unit cell region and may surround (cover) ten dummy channel regions DCH. As shown in the perspective view of FIG. 18, the substrate insulating pattern 405 that is exposed through a cut region may surround all the dummy channels DCH included in one unit cell region.

Figure 19A:
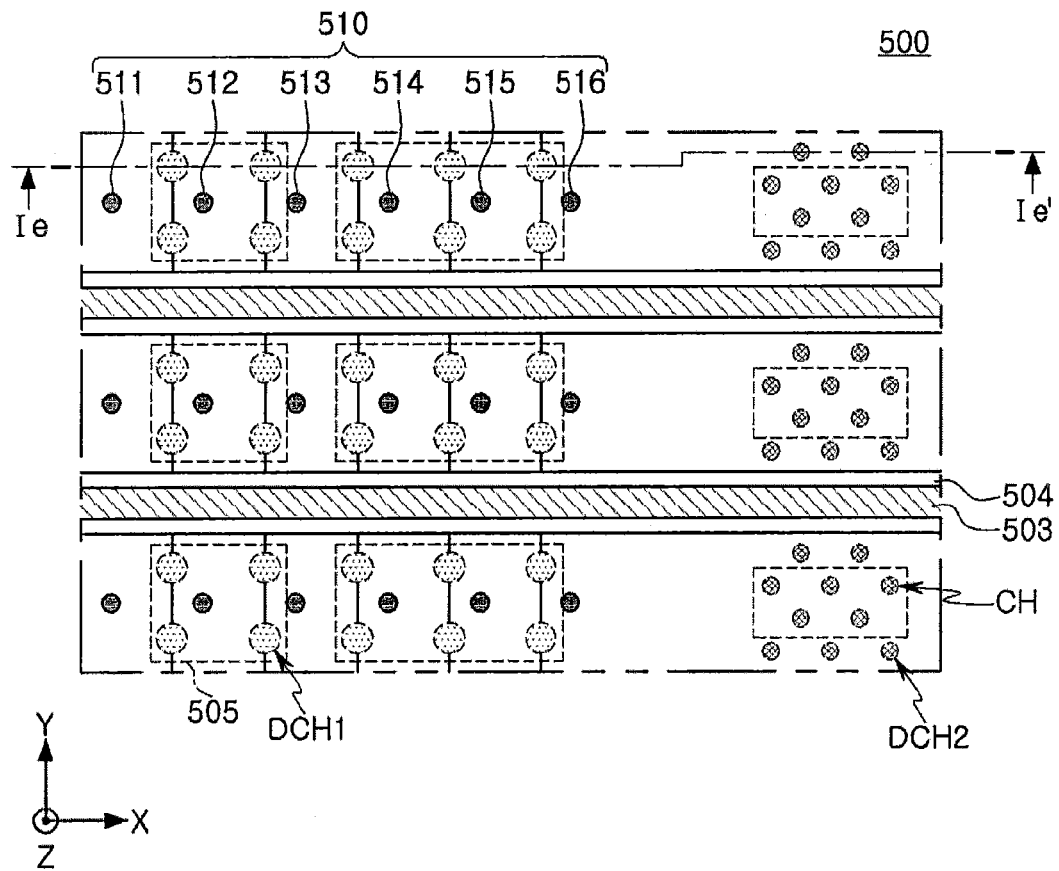
FIG. 19a is a plan view illustrating a memory device according to still another exemplary embodiment of the inventive concepts.
Figure 19B:
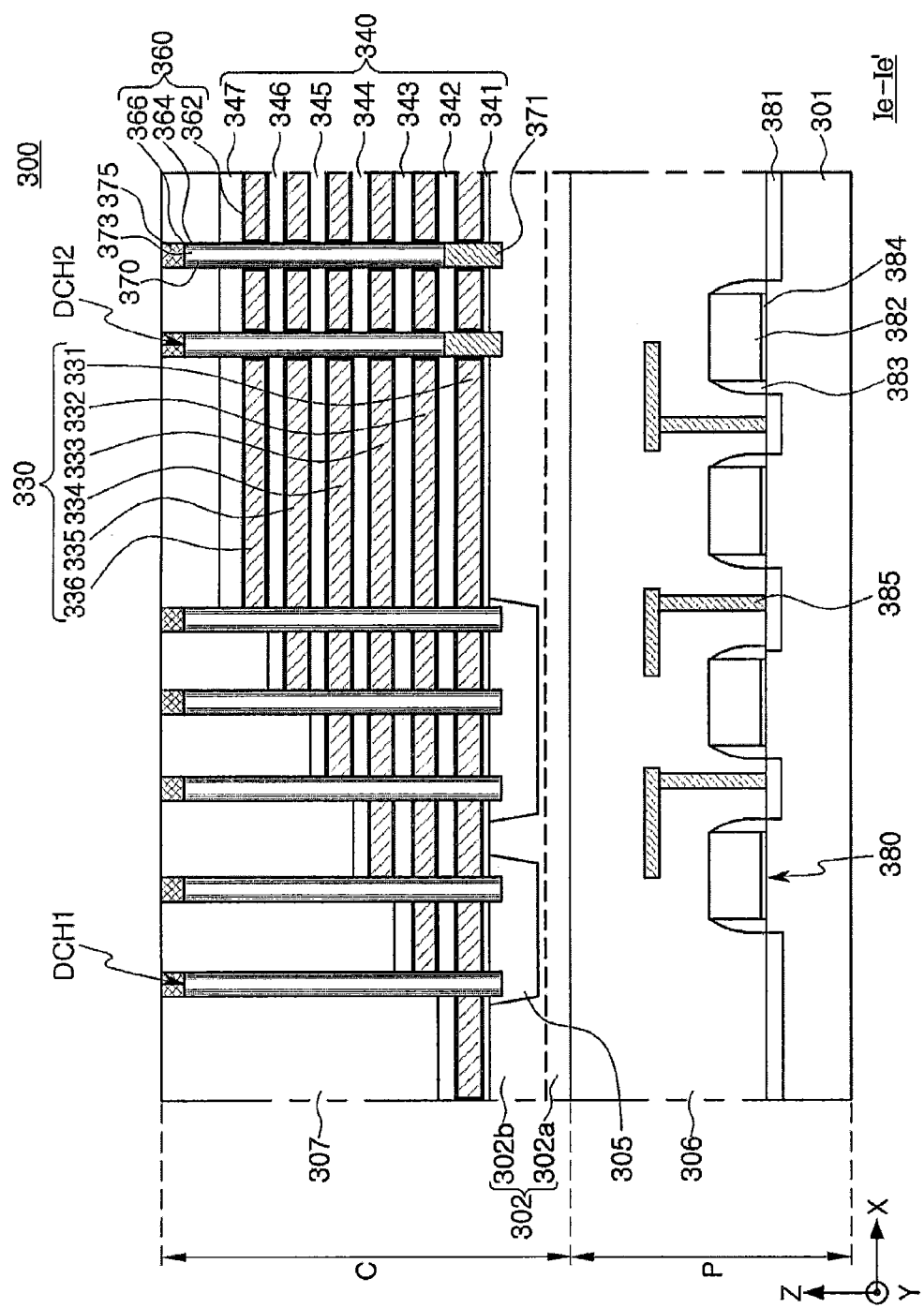

FIG. 19*a* is a plan view illustrating a memory device 500 according to still another exemplary embodiment of the inventive concepts. FIG. 19*b* is a cross-sectional view of the memory device 500 taken along line Ie-Ie' of FIG. 19*a*.

Referring to FIG. 19*a*, the memory device 500 may have a cell-on-peri (COP) structure in which a cell region C is disposed on a peripheral circuit region P. The memory device 500 may include channel regions CH that are disposed in a zigzag pattern in the X-Y plane, dummy channel regions DCH1 and DCH2 that are provided separately from the channel regions CH, a plurality of contacts 511 to 516 (510) that are electrically connected to respective ones of a plurality of gate electrode layers, and common source lines 503 and separating insulating layers 504 that divide the plurality of gate electrode layers into a plurality of regions. The channel regions CH (including epitaxial regions 571), gate insulating layer 560, and drain regions 575 have the same structure as the channel regions CH, gate insulating layer 160 and drain regions 175 that are described above, and hence further description thereof will mostly be omitted.

In the exemplary embodiment illustrated in FIG. 19*a*, substrate insulating patterns 505 may be disposed below the plurality of dummy channel regions DCH1. Referring to FIG. 19*a*, some substrate insulating patterns 505 may surround four dummy channel regions DCH1, and other substrate insulating patterns 505 may surround six dummy channel regions DCH2. That is, some of the substrate insulating patterns 505 may have different shapes or volumes as compared to other of the substrate insulating patterns 505.

In the exemplary embodiment illustrated in FIG. 19*a*, the dummy channel regions include first dummy channel regions DCH1 and second dummy channel regions DCH2. The first dummy channel regions DCH1 may be adjacent first ends of the gate electrode layers that are remote from the channel regions. The second dummy channel regions DCH2 may be adjacent the channel regions CH. The second dummy channel regions DCH2 may have same structure as the channel regions CH, and may be connected to a substrate. However, upper portions of the second dummy channel regions DCH2 may not be connected to a bit line.

Referring to FIG. 19*b*, the channel regions CH include epitaxial patterns 571. The first dummy channel regions DCH1 may be adjacent the first ends of the gate electrode layers 531 to 536 (530), where the first ends of the gate electrode layers 530 are the ends that are farther away from the channel regions CH. The first dummy channel regions DCH1 may include a channel layer 570 and an embedded insulating layer 573. A drain region 575 may be provided on an upper surface of each dummy channel region DCH. However, the first dummy channel regions DCH1 do not include the epitaxial patterns 571. Substrate insulating patterns 505 are provided between the first dummy channel regions DCH1 and an underlying substrate 502. The substrate insulating patterns 505 may prevent formation of the epitaxial patterns 571 in the first dummy channel regions DCH1.

In contrast, the epitaxial patterns 571 may be included in the lower portions of the respective second dummy channel regions DCH2. The second dummy channel regions DCH2 may have same structure as the channel regions CH. However, the drain regions 575 that are provided above each second dummy channel region DCH2 may not be connected to a bit line.

Figure 20:
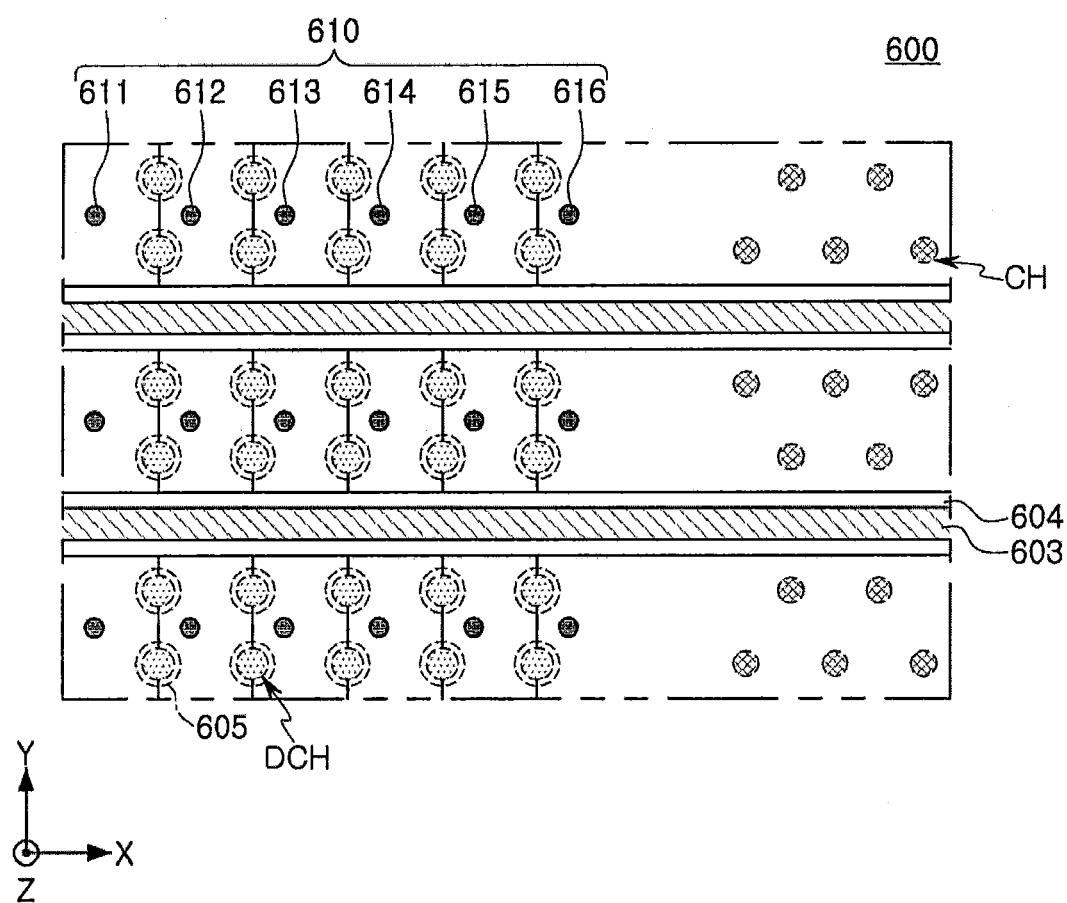
FIG. 20 are plan views illustrating memory devices according to further exemplary embodiments of the inventive concepts.

Referring to FIG. 20, a memory device 600 according to another exemplary embodiment of the inventive concepts may include channel regions CH that are disposed in a zigzag pattern in the X-Y plane, dummy channel regions DCH that are provided separately from the channel regions CH, a plurality of contacts 611 to 616 (610) that are electrically connected to respective ones of a plurality of gate electrode layers, and common source lines 603 and separating insulating layers 604 that divide the gate electrode layers into a plurality of regions. The structure of the memory device 600 may be similar to the memory device 100 described above with reference to FIGS. 3 through 6.

However, the memory device 600 described with reference to FIG. 20 may be formed by a different manufacturing process as compared to the manufacturing processes used to form the memory devices 100, 200, 300, 400, and 500 described above. For example, in the case of the memory device 100, illustrated in FIGS. 3 through 6, the substrate insulating patterns 105 may be formed by removing portions of the second substrate 102 and filling the corresponding openings with an insulating material before the gate electrode layers 130 and the insulating layers 140 are formed on the second substrate 102.

In contrast, in the memory device 600 illustrated in FIG. 20, the gate electrode layers and the insulating layers may be formed on a substrate, and then openings for the dummy channel regions DCH and the channel regions CH may be formed that extend through the gate electrode layers and the insulating layers in the Z-axis direction. The substrate may then be oxidized through the openings to form the substrate insulating layers 605. Thus, each substrate insulating pattern 605 may have a circular or oval cross-sectional shape in the X-Y plane. A manufacturing method of the memory device 600 illustrated in FIG. 20 will be described in detail hereinafter.

Figure 21:
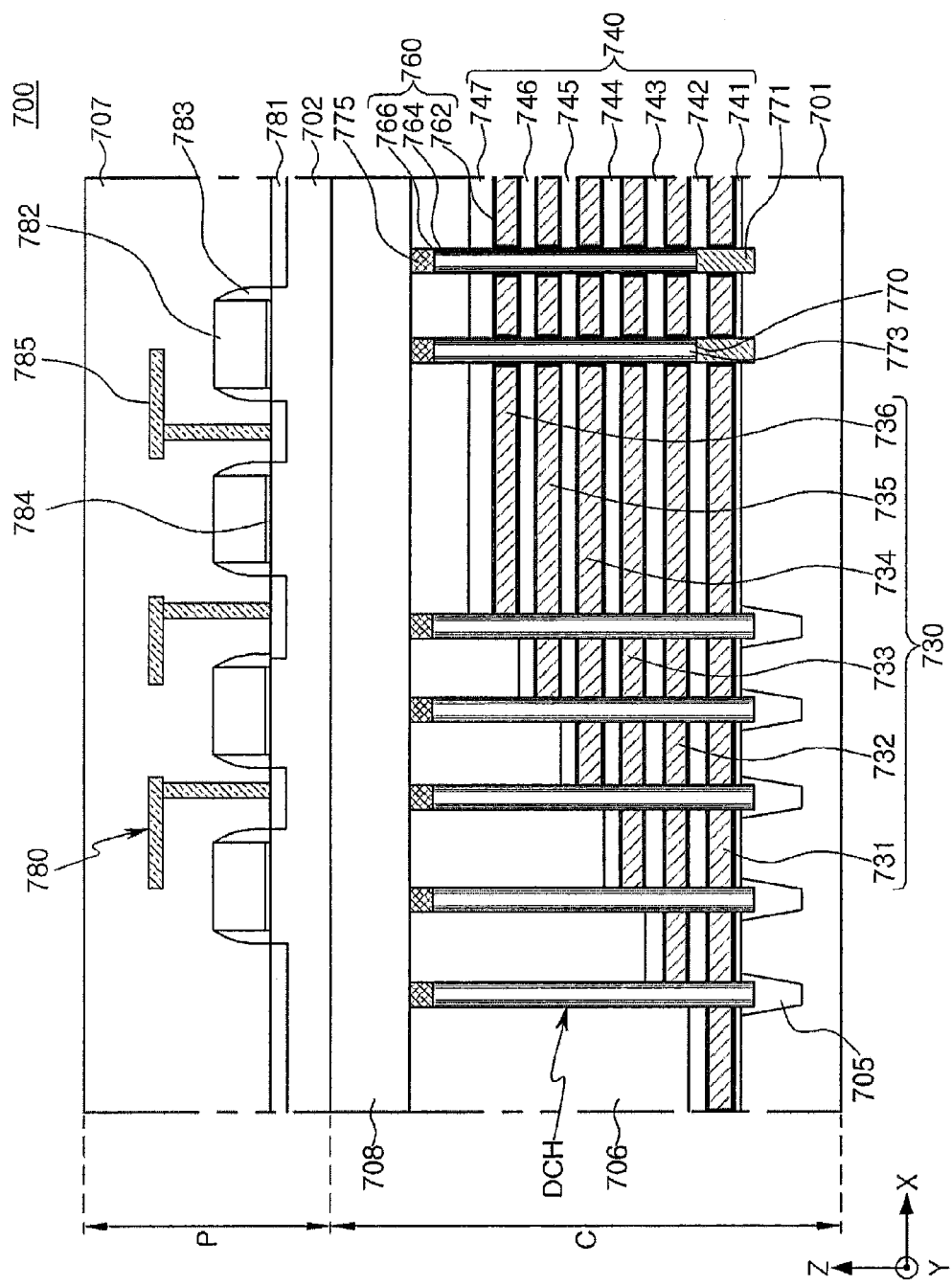
FIG. 21 is a cross-sectional view illustrating a memory device according to another exemplary embodiment of the inventive concepts.

FIG. 21 is a cross-sectional view illustrating a memory device 700 according to still another exemplary embodiment of the inventive concepts.

Referring to FIG. 21, the memory device 700 may have a POC structure in which a peripheral circuit region P is disposed on a cell region C. That is, the cell region C may be disposed below the peripheral circuit region P. The cell region C may include a first substrate 701, a plurality of gate electrode layers 731 to 736 (730) and a plurality of insulating layers 741 to 747 (740) that are alternately stacked on the first substrate 701 in the Z-axis direction, channel regions CH and dummy channel regions DCH that extend in a direction perpendicular to an upper surface of the first substrate 701, and a first interlayer insulating layer 706.

Substrate insulating patterns 705 may be provided below the dummy channel regions DCH. Consequently, epitaxial patterns 771 that are formed in lower portions of the channel regions CH may not be formed in the dummy channel regions DCH. The dummy channel regions DCH and the channel regions CH may each include a channel layer 770 and an embedded insulating layer 773, and the channel regions CH may further include the epitaxial patterns 771. A drain region 775 may be provided on the top surface of each channel region CH and each dummy channel region DCH. However, the drain regions 775 that are on the dummy channel regions DCH may not be connected to a bit line.

In the cell region C, a middle insulating layer 708 may be further provided, and the peripheral circuit region P may be disposed on the middle insulating layer 708. The middle insulating layer 708 may include a plurality of wiring patterns 780, 785, and the wiring patterns may include word lines that are connected to the gate electrode layers 730 through contacts and bit lines that are connected to the drain regions 775 that are on the channel regions CH.

The peripheral circuit region P may include a second substrate 702, a plurality of peripheral circuit devices 780 that are disposed on the second substrate 702, and a second interlayer insulating layer 707. The peripheral circuit devices 780 may be planar transistors and may include source/drain regions 781, gate electrode layers 782, gate spacer films 783, and gate insulating layers 784. The source/drain regions 781 and the gate electrode layers 782 may be connected to at least one wiring pattern 785 within the second interlayer insulating layer 707.

FIGS. 22A through 33B are plan and cross-sectional views that illustrate a method for manufacturing the memory device 100 illustrated in FIGS. 3 through 6. FIGS. 22B through 33B are cross-sectional views taken along the lines IIa-IIa' of FIGS. 22A through 33A, respectively.

Figure 22A:
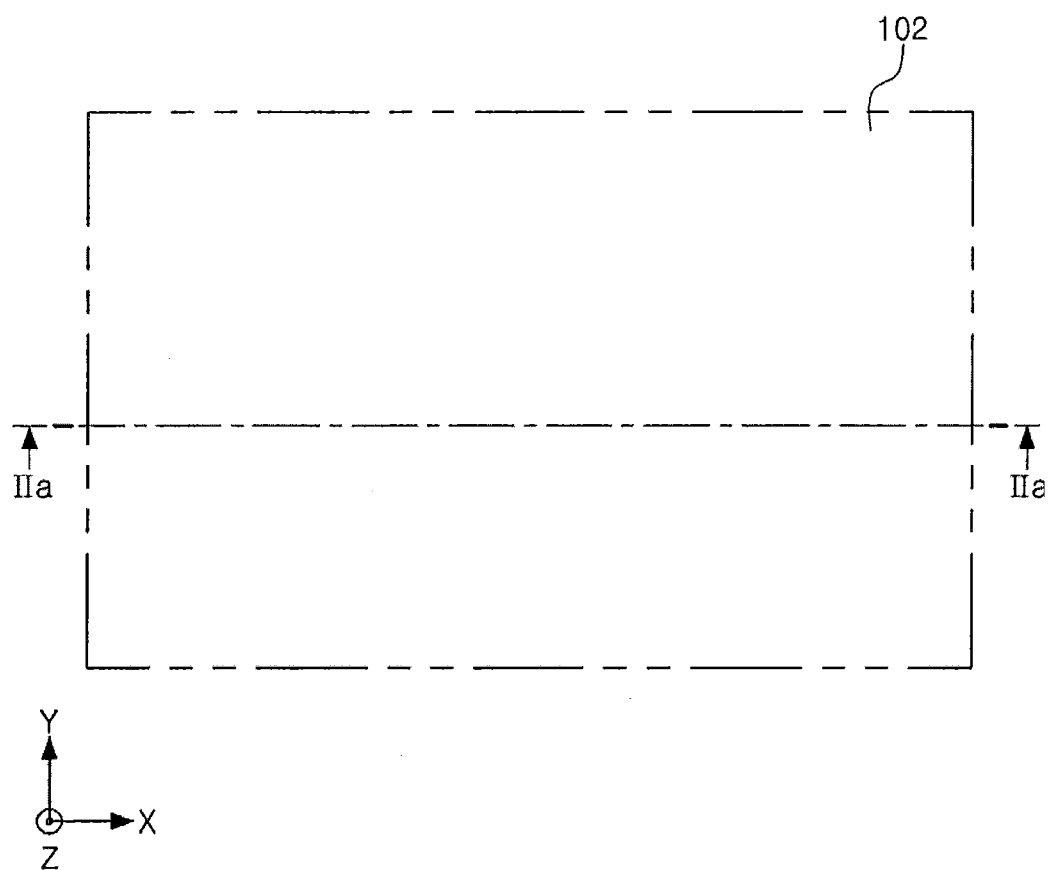
FIGS. 22A through 33B are plan and cross-sectional views that illustrate a method for manufacturing the memory device illustrated in FIGS. 3 through 6.
Figure 22B:
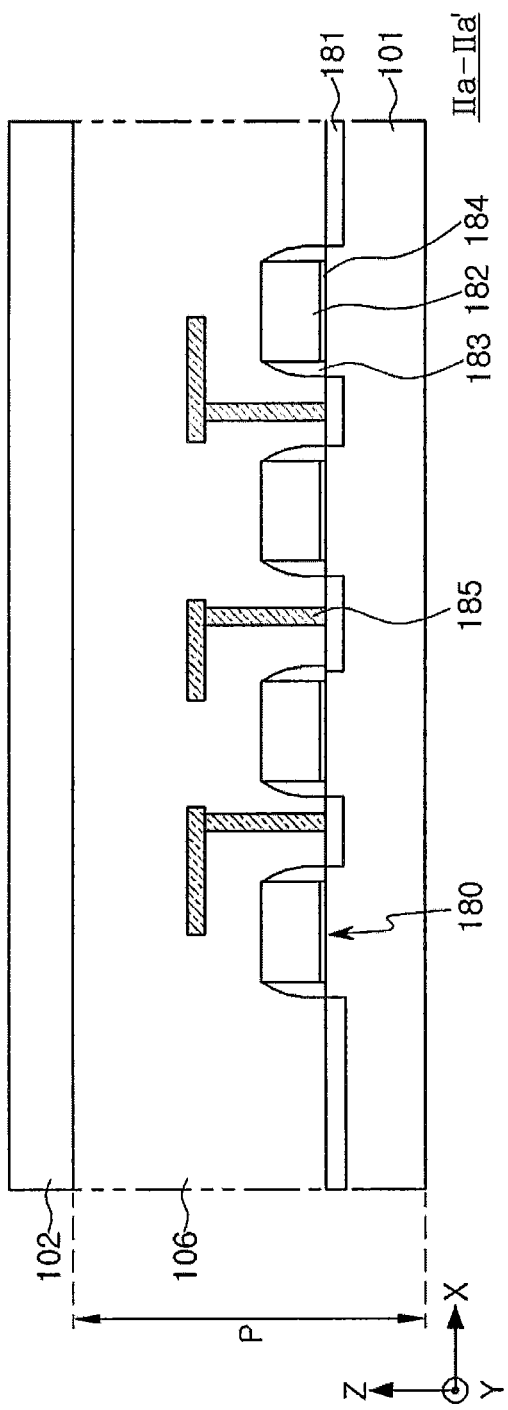

First, referring to FIGS. 22A and 22B, the second substrate 102 may be provided on the peripheral circuit region P. The peripheral circuit region P may include the first substrate 101, and the peripheral circuit devices 180 and the first interlayer insulating layer 106 may be provided on the first substrate 101. The second substrate 102 may be provided on the first interlayer insulating layer 106. The first substrate 101 may be a single crystal silicon substrate, and the second substrate 102 may be a polycrystalline silicon substrate.

Figure 23A:
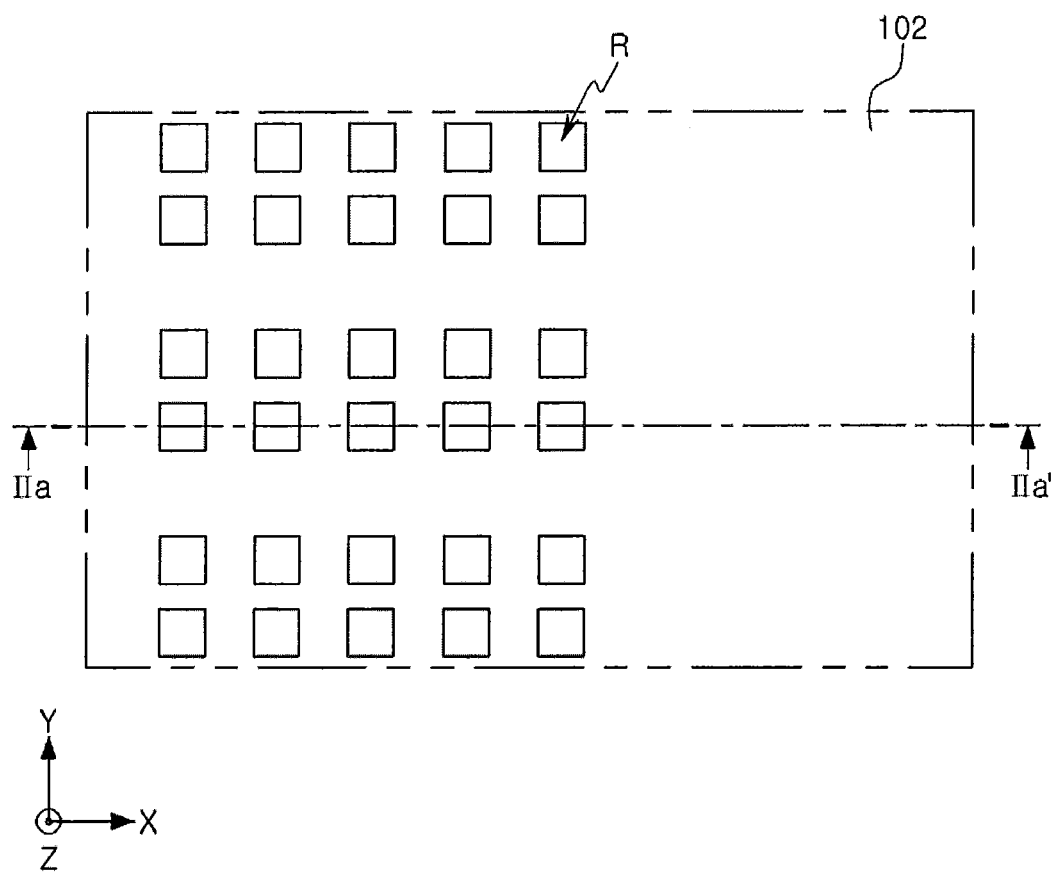
Figure 23B:
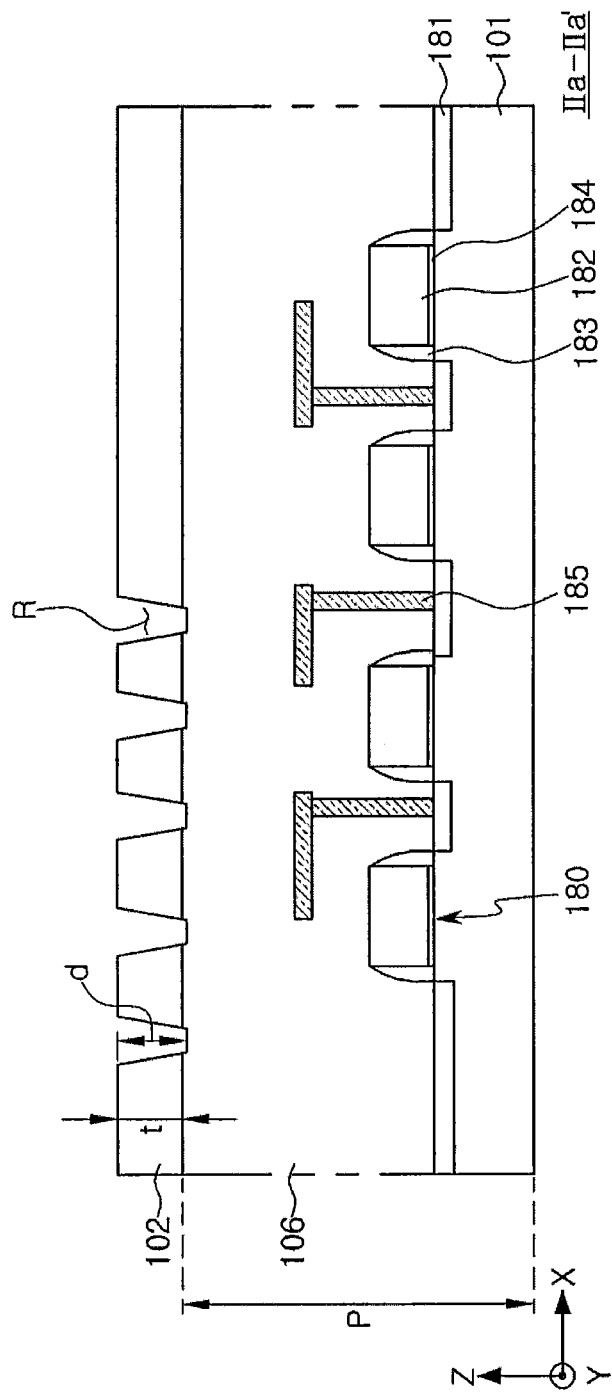

Next, referring to FIGS. 23A and 23B, a plurality of recesses R may be formed in the second substrate 102. The recesses R may be formed by disposing a mask on an upper surface of the second substrate 102 that has openings that expose the regions corresponding to the recesses R, and then subsequently etching the second substrate using the mask as an etch mask. The sizes and shapes of the recesses R may be variously modified. The recesses R may be positioned at regions of the second substrate 102 in which the dummy channel regions DCH are to be formed. Referring to FIG. 23B, it is illustrated that a depth d of each recess R may be greater than a thickness t of the second substrate 102, but the depth d and the thickness t may not be limited thereto.

Figure 24A:
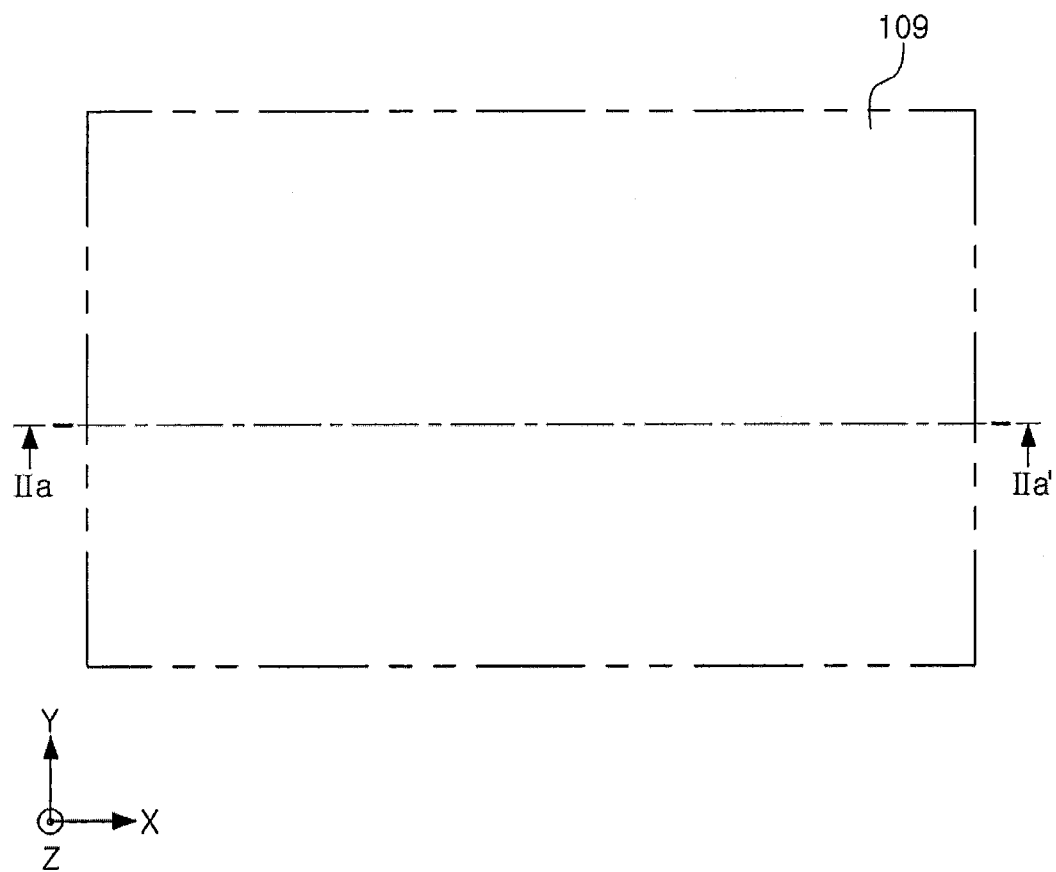
Figure 24B:
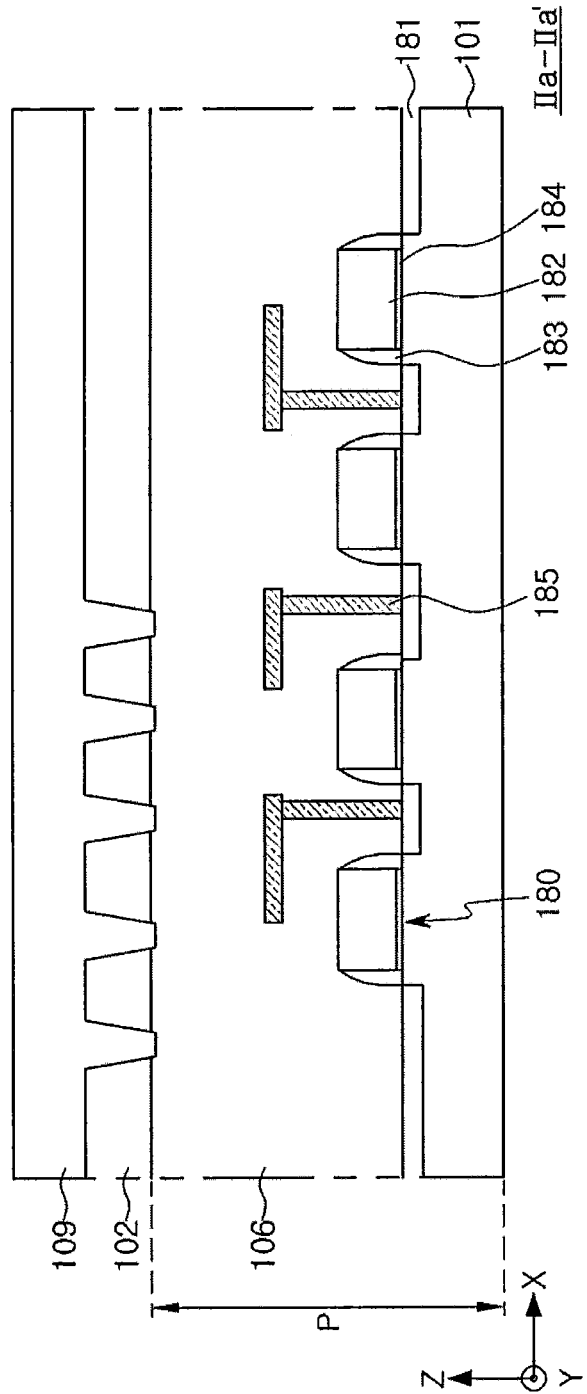
Figure 25A:
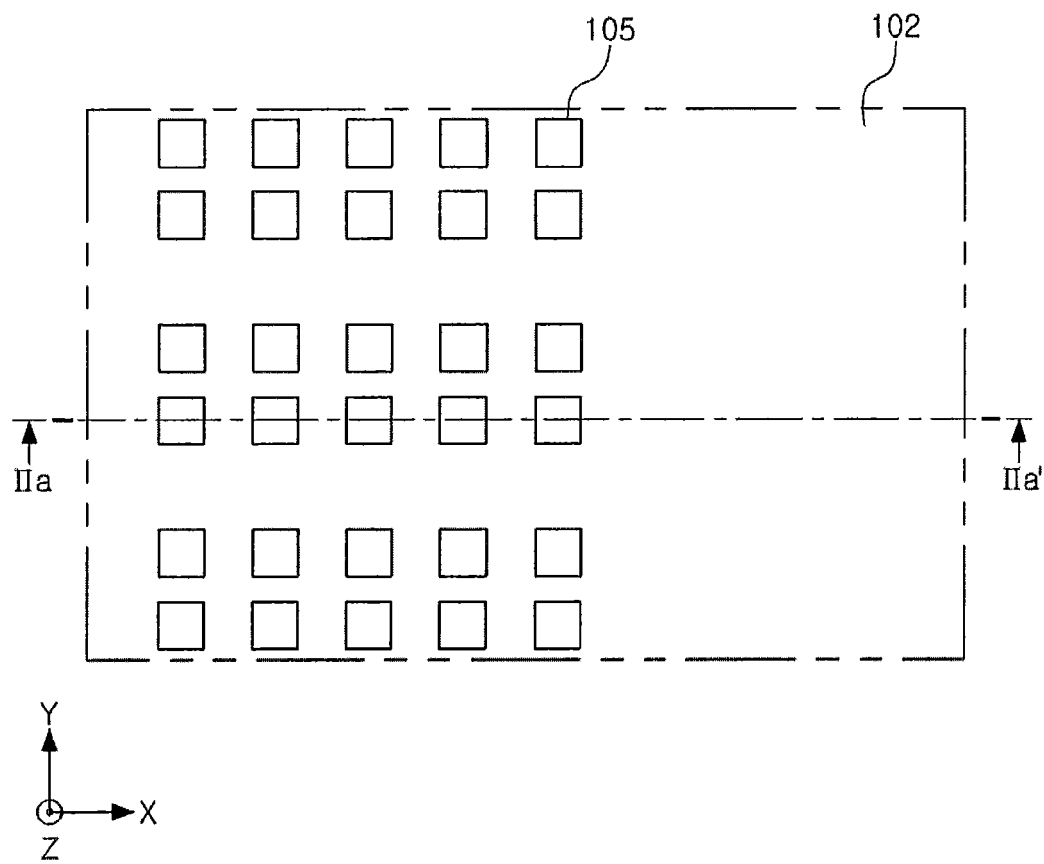
Figure 25B:
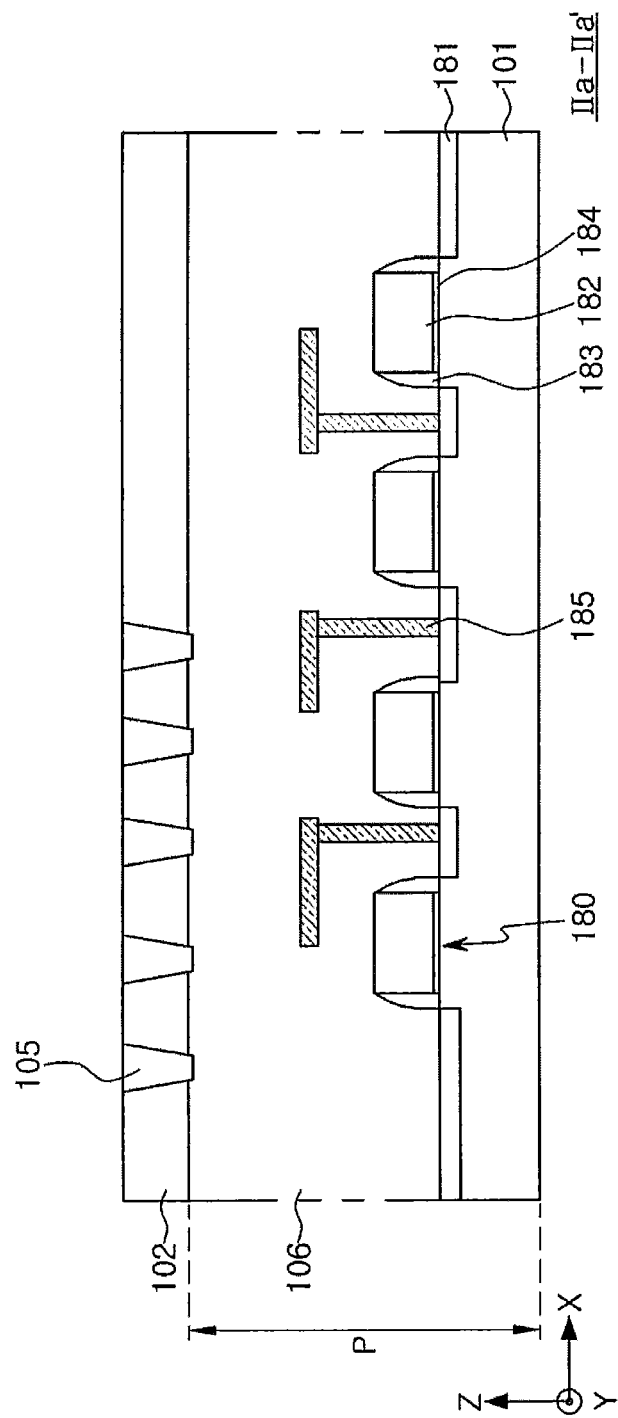

Referring to FIGS. 24A and 24B, an insulating material 109 may be formed on the second substrate 102 that has the recesses R formed therein. The insulating material 109 may fill the recesses R and may cover at least a portion of an upper surface of the second substrate 102. Thereafter, a polishing method such as chemical mechanical polishing (CMP) or the like may be performed to remove an upper portion of the insulating material 109. As illustrated in FIGS. 25A and 25B, by removing the upper portion of the insulating material 109 a plurality of substrate insulating patterns 105 may be formed. An upper portion of the second substrate 102 may be removed during the polishing step so that the upper surfaces of the substrate insulating patterns 105 may be coplanar with the upper surface of the second substrate 102.

Figure 26A:
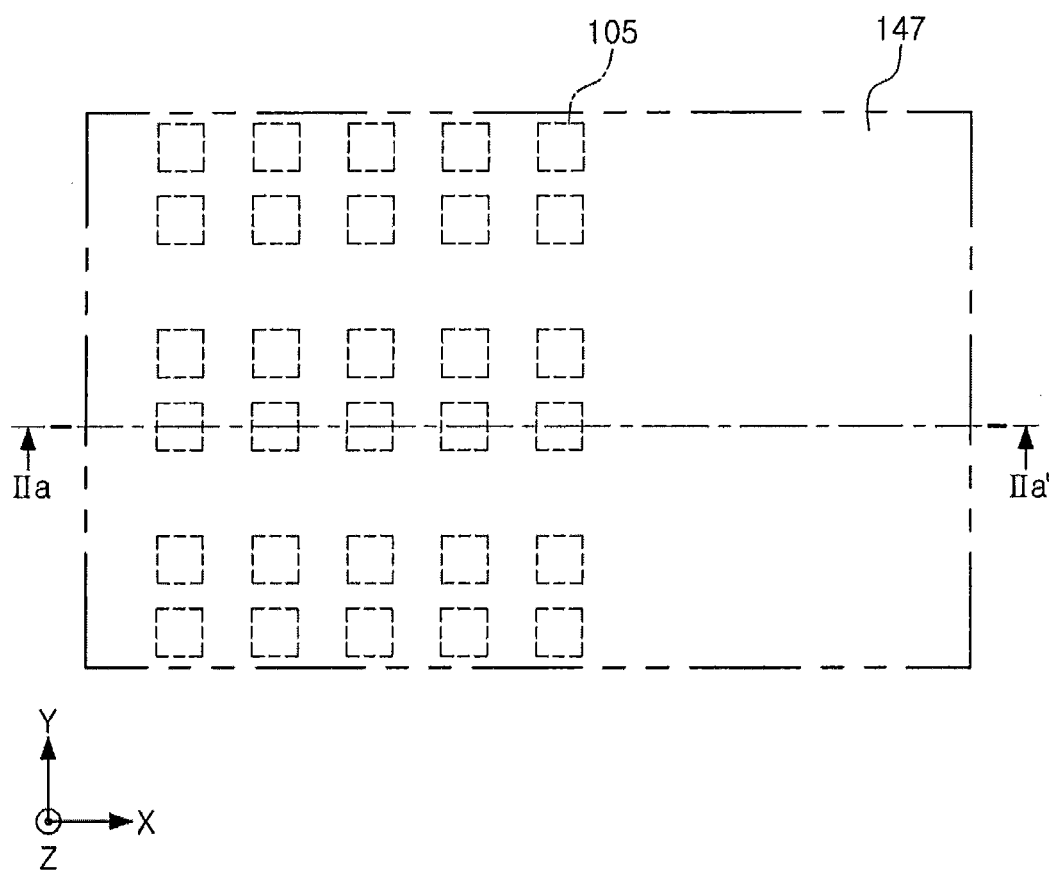
Figure 26B:
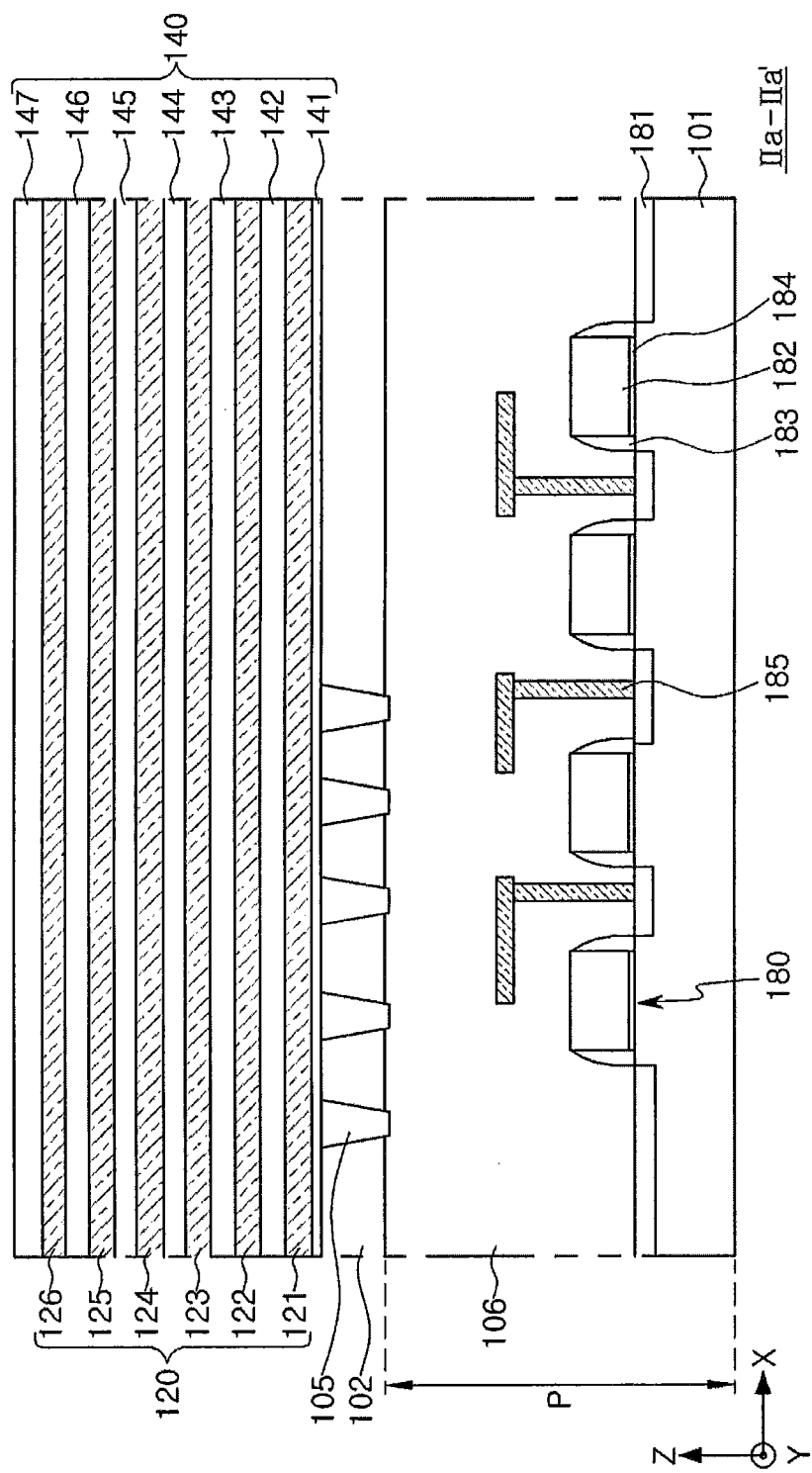

Referring to FIGS. 26A and 26B, the sacrificial layers 121 to 126 (120) and insulating layers 141 to 147 (140) may be formed that are alternately stacked on the second substrate 102 and the substrate insulating patterns 105 in the Z-axis direction. The sacrificial layers 120 may be formed of a material that may be etched with high etch selectivity with respect to the insulating layers 140. Such etch selectivity may be quantitatively expressed through a ratio of an etch rate of the sacrificial layers 120 to an etch rate of the insulating layers 140. For example, the insulating layers 140 may be at least one of a silicon oxide film and a silicon nitride film, and the sacrificial layers 120 may be a material selected from among a silicon film, a silicon oxide film, a silicon carbide film, and a silicon nitride film, which is different from a material of the insulating layer 140. For example, if the insulating layer 140 is a silicon oxide film, the sacrificial layer 120 may be a silicon nitride film.

Figure 27A:
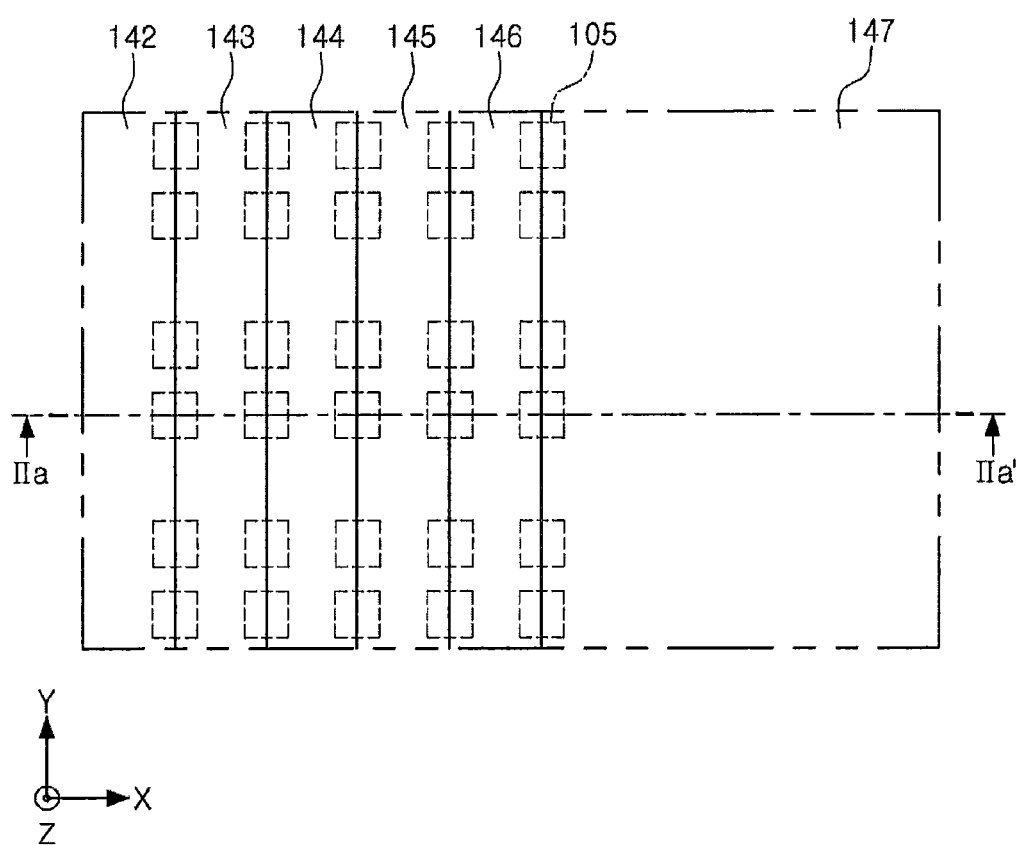
Figure 27B:
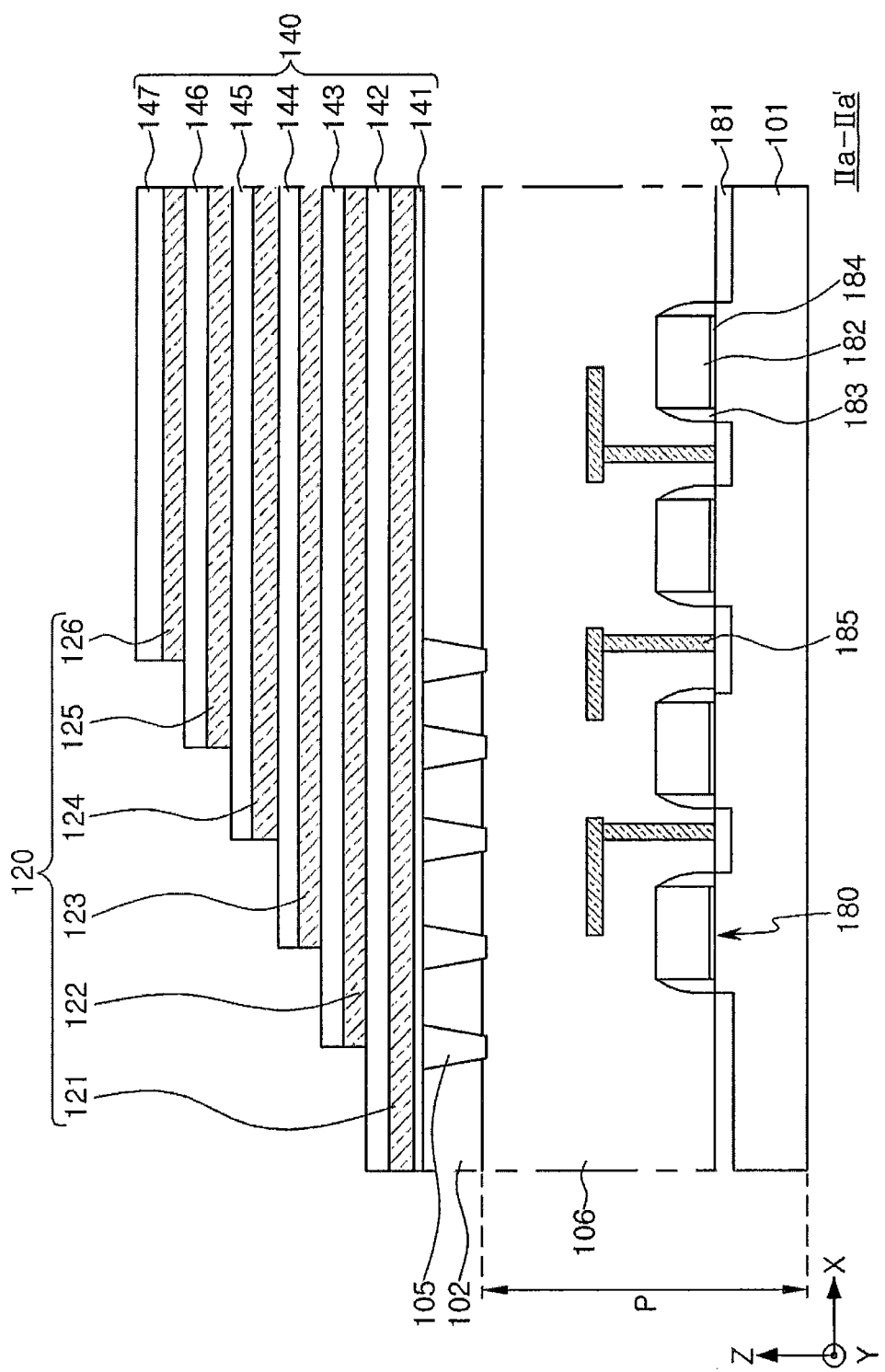

Referring to FIGS. 27A and 27B, the sacrificial layers 120 and the insulating layers 140 may then be etched to have a step structure, as illustrated in FIGS. 27A and 27B. To etch the alternatively stacked sacrificial layers 120 and insulating layers 140 to form the step structure, a series of mask layers may be formed on the sacrificial layers 120 and the insulating layers 140, and the sacrificial layers 120 and the insulating layers 140 exposed by each mask layer may be etched. By sequentially etching the sacrificial layers 120 and the insulating layers 140 while trimming the mask layer further in each subsequent etching step, the step structure illustrated in FIG. 27B may be formed.

In an exemplary embodiment, each of the insulating layers 140 and each of the sacrificial layers 120 may form a pair, and the insulating layers 140 and the sacrificial layers 120 included in each pair may have the same length in the X-axis direction. Additionally, an insulating layer 141 may be provided below the sacrificial layer 121 that is positioned in the lowermost portion in the Z-axis direction and may extend to have the same length as that of the lowermost sacrificial layer 121.

Figure 28A:
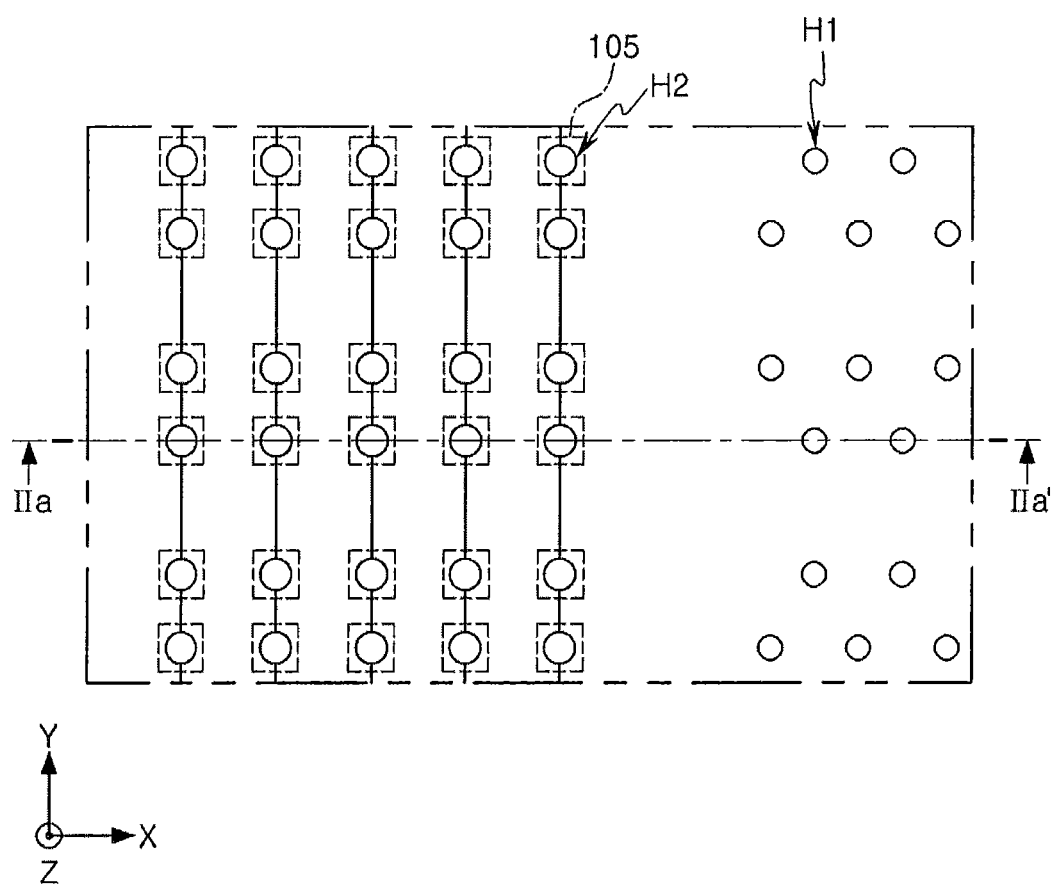
Figure 28B:
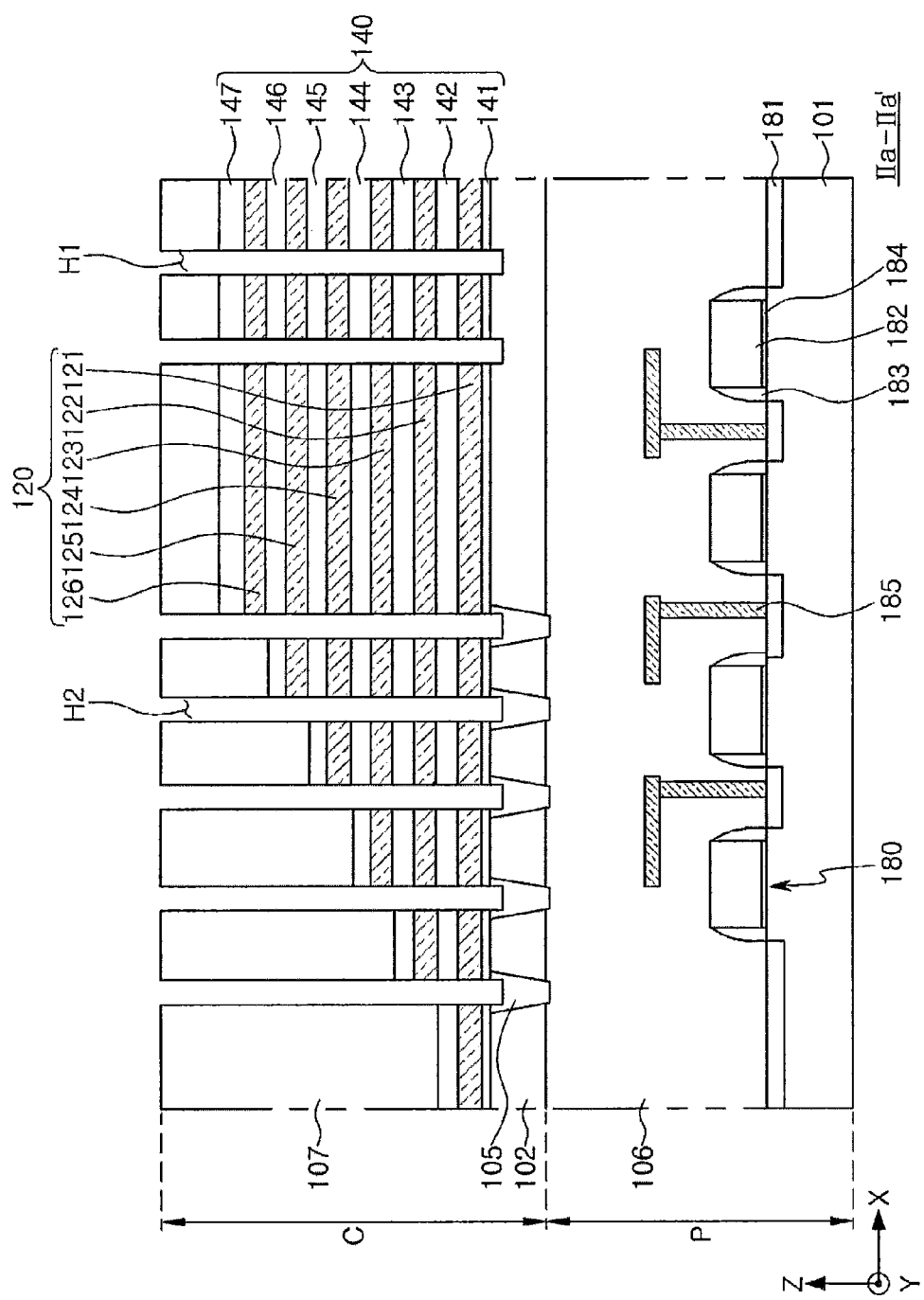

Referring to FIGS. 28A and 28B, a plurality of channel openings H1 and H2 may be formed through the sacrificial layers 120 and the insulating layers 140. The first channel openings H1 may be regions in which the channel regions CH are formed, and the second channel openings H2 may be regions in which the dummy channel regions DCH are formed. The second channel openings H2 may be vertically aligned above corresponding substrate insulating layers 105 in the region in which the step structure is formed. That is, a portion of the substrate insulating patterns 105 may be exposed through the second channel openings H2. The first channel openings H1 may have a depth that is sufficient such that the first channel openings penetrate through a portion of the second substrate 102, and thus, each first channel opening H1 may expose a portion of the second substrate 102. Before the first and second channel openings H1 and H2 are formed, the second interlayer insulating layer 107 may be formed on the sacrificial layers 120 and the insulating layers 140.

Figure 29A:
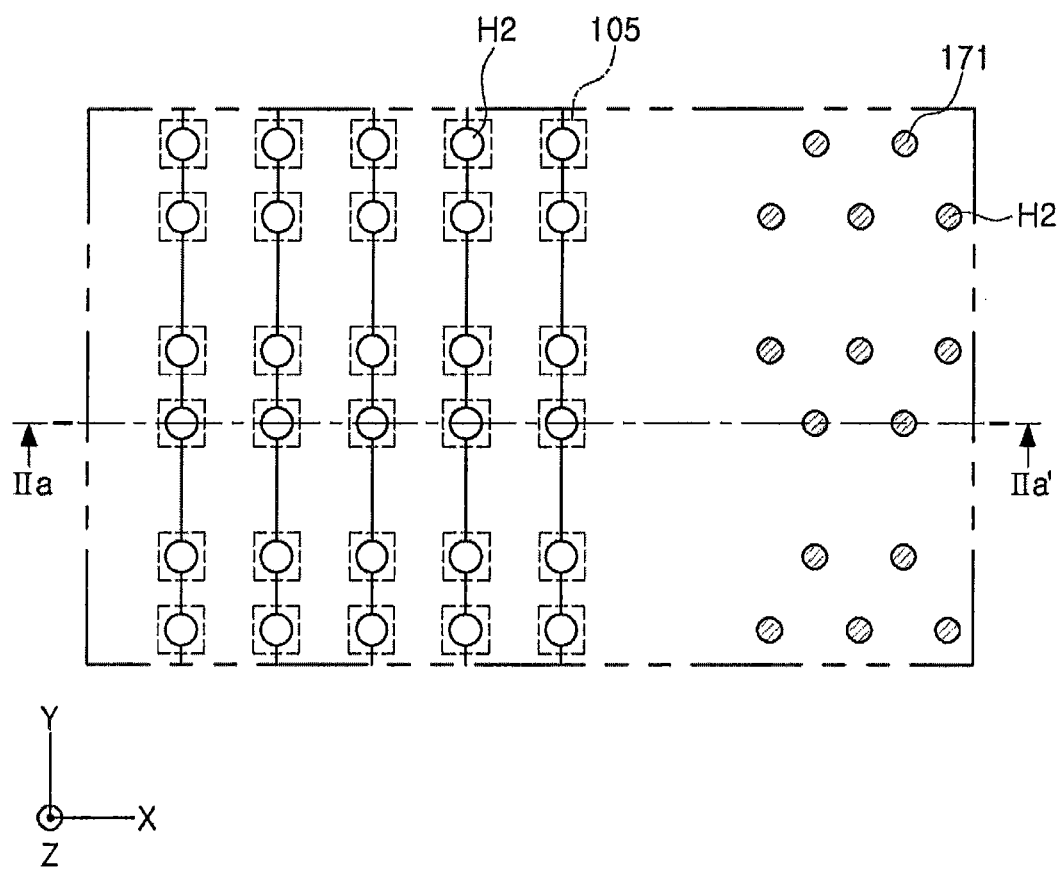
Figure 29B:
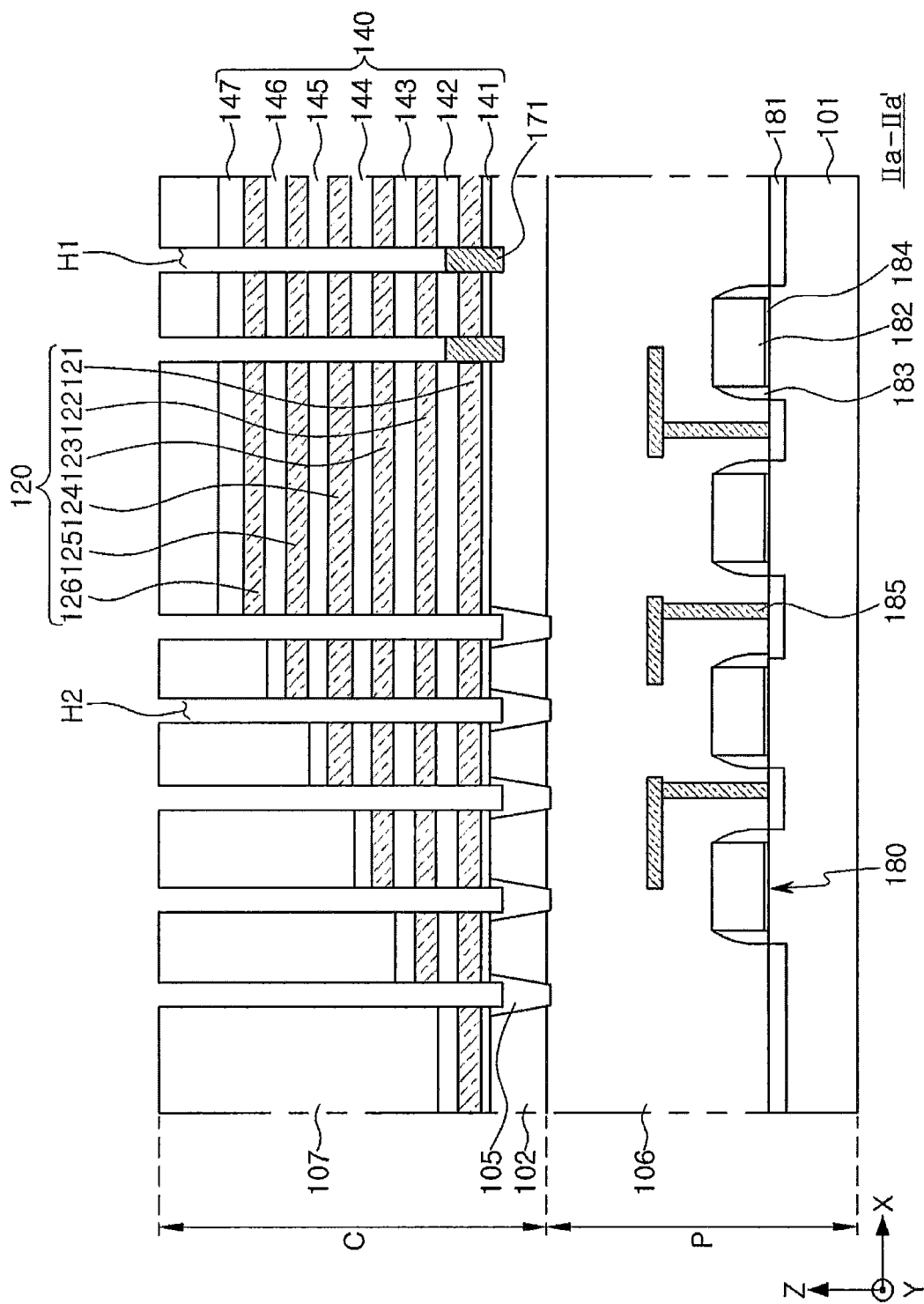

Subsequently, referring to FIGS. 29A and 29B, the epitaxial layer 171 may be formed by performing selective epitaxial growth (SEG). The selective epitaxial growth may be performed using the exposed regions of the second substrate 102 as a seed. As each first channel opening H1 exposes a portion of the second substrate 102, the epitaxial patterns 171 are formed in the lower portion of each first channel opening H1. However, since a substrate insulating layer 105, rather than the second substrate 102, is exposed in the lower portion of each second channel opening H2, selective epitaxial growth may not occur within the second channel openings H2. Thus, the epitaxial patterns 171 may be formed only within the first channel openings H1.

Figure 30A:
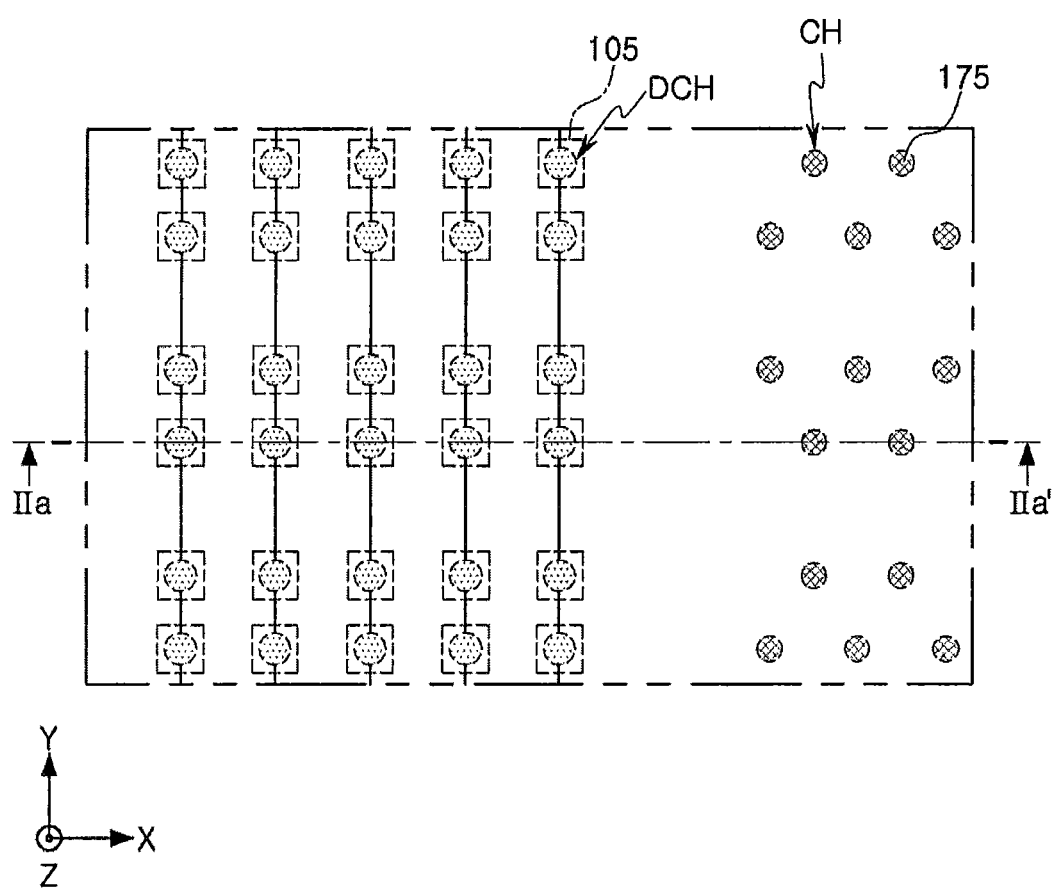
Figure 30B:
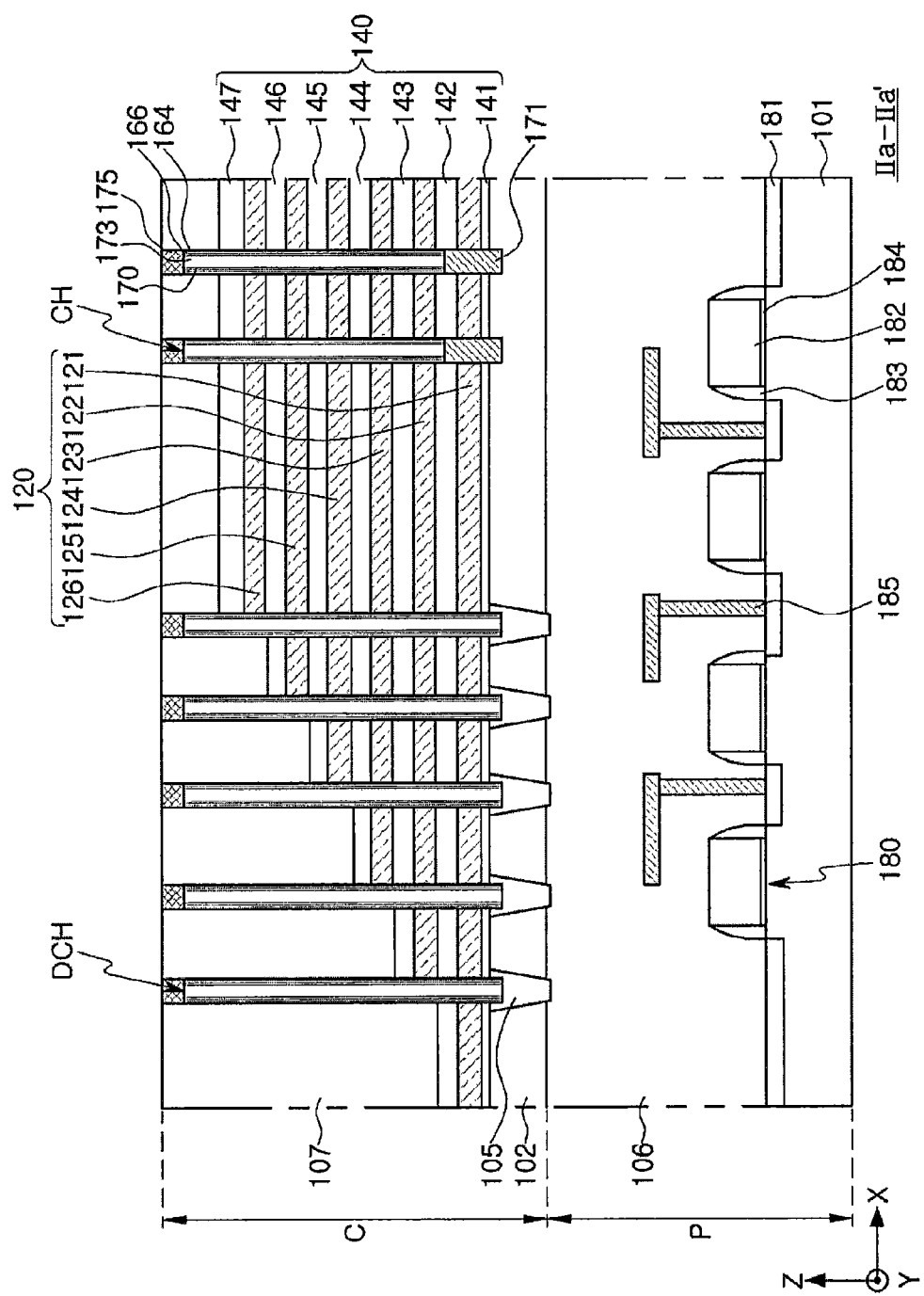

Thereafter, referring to FIGS. 30A and 30B, the remaining portions of the channel regions CH and the dummy channel regions DCH may be formed by forming the channel layer 170 and the embedded insulating layer 173 in each of the first and second channel openings H1 and H2. Before forming the channel layer 170, the charge storage layer 164 and the tunneling layer 166 may be formed on an inner surface and a lower surface of each of the plurality of channel openings H1 and H2 by atomic layer deposition (ALD) or CVD. Here, the charge storage layer 164 and the tunneling layer 166 are sequentially provided on the inner surface and the lower surface of each of the channel openings H1 and 112, adjacent the sacrificial layers 120 and the insulating layers 140, and the channel layer 170 may be formed on an inner side of the tunneling layer 166. The channel layer 170 may be formed to have a predetermined thickness, for example, a thickness of ⅕₀ to ⅕ of the width of each of the plurality of channel openings H1 and H2, and may also be formed through ALD or CVD.

The interior of the channel layer 170 may be filled with the embedded insulating layer 173. Before formation of the embedded insulating layer 173, selectively, hydrogen annealing may be performed to heat-treat the structure including the channel layer 170 under a gas atmosphere including hydrogen or heavy hydrogen. Through the hydrogen annealing treatment, a substantial portion of crystal defects present within the channel layer 170 may be cured (healed). Thereafter, the drain regions 175 may be formed of a conductive material such as polysilicon, or the like, on the channel layers 170.

As described above with reference to FIGS. 29A and 29B, selective epitaxial growth may not occur within the second channel openings H2 in which the dummy channel regions DCH are formed. Thus, as illustrated in FIG. 30B, in the dummy channel regions DCH, the channel layer 170, the embedded insulating layer 173, the charge storage layer 164, and the tunneling layer 166 may be in direct contact with respective ones of the substrate insulating patterns 105.

Figure 31A:
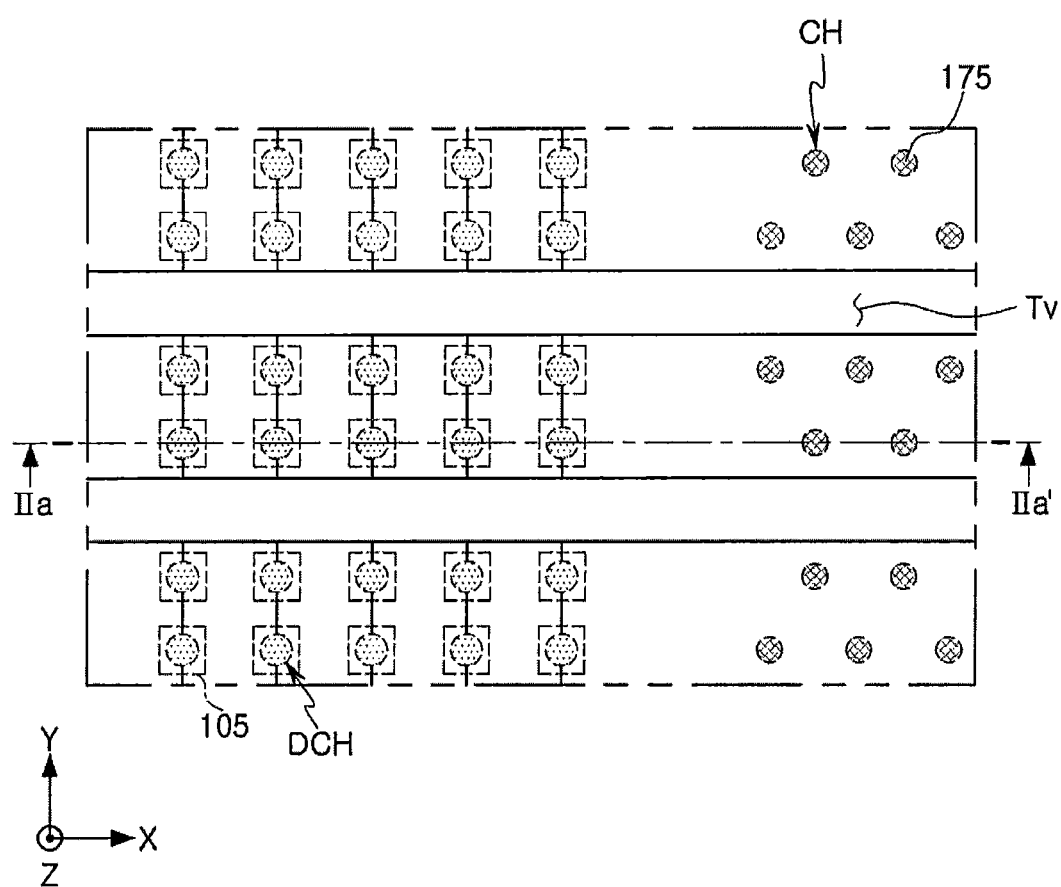
Figure 31B:
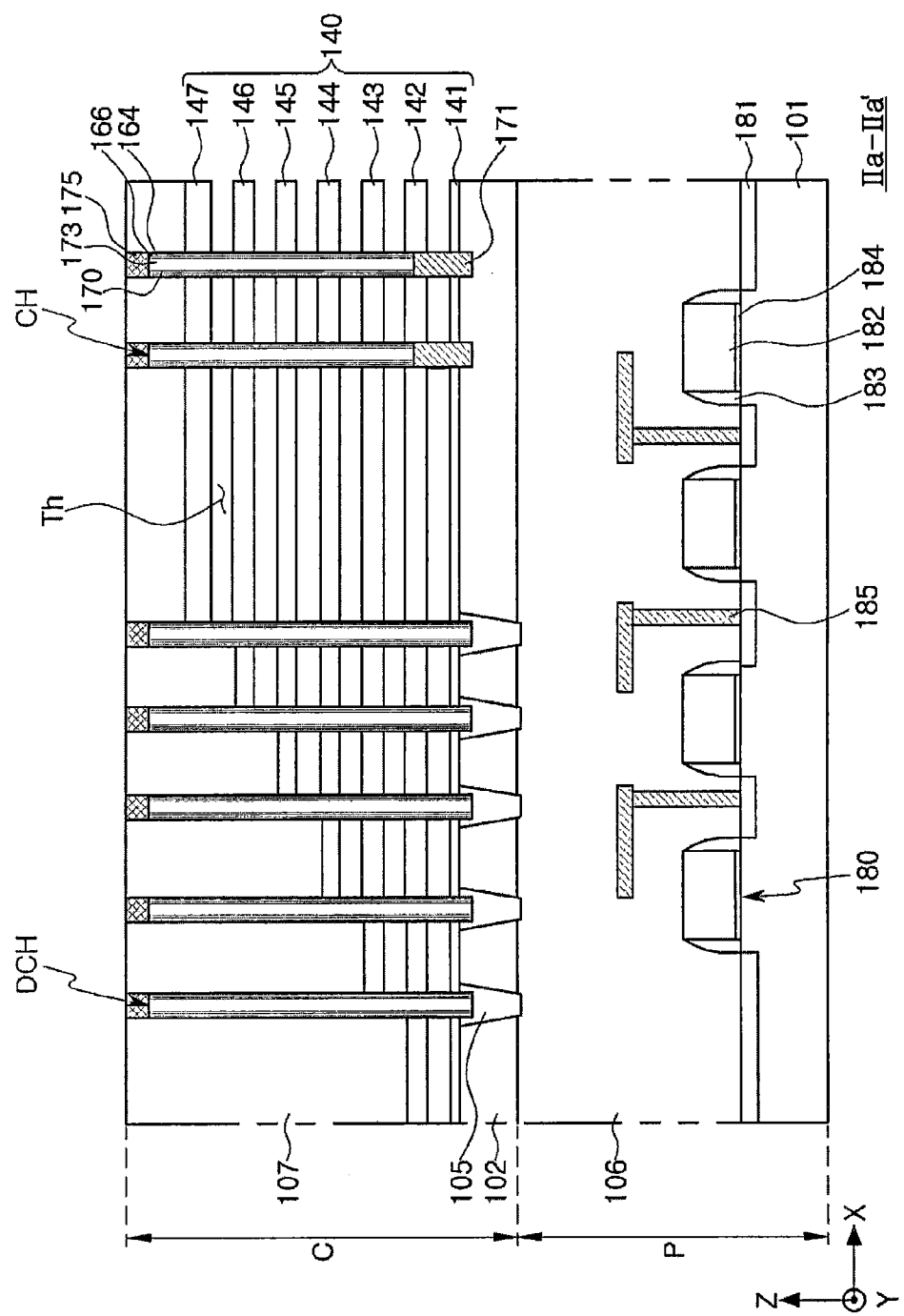

Thereafter, referring to FIG. 31A, a plurality of vertical openings Tv may be formed through the device. The vertical openings Tv may be regions in which common source lines 103 and separating insulating layers 104 are to be formed. Referring to FIG. 3113, the sacrificial layers 120 may be selectively removed by an etchant that is introduced through the horizontal openings Tv. By removing the sacrificial layers 120, a plurality of horizontal openings Th may be provided between the insulating layers 140, and portions of the side surfaces of the charge storage layer 164 may be exposed by the horizontal openings Th. Prior to formation of the vertical openings Tv, an insulating layer may be formed on the drain regions 175 to protect the channel layer 170 during the etching process.

Figure 32A:
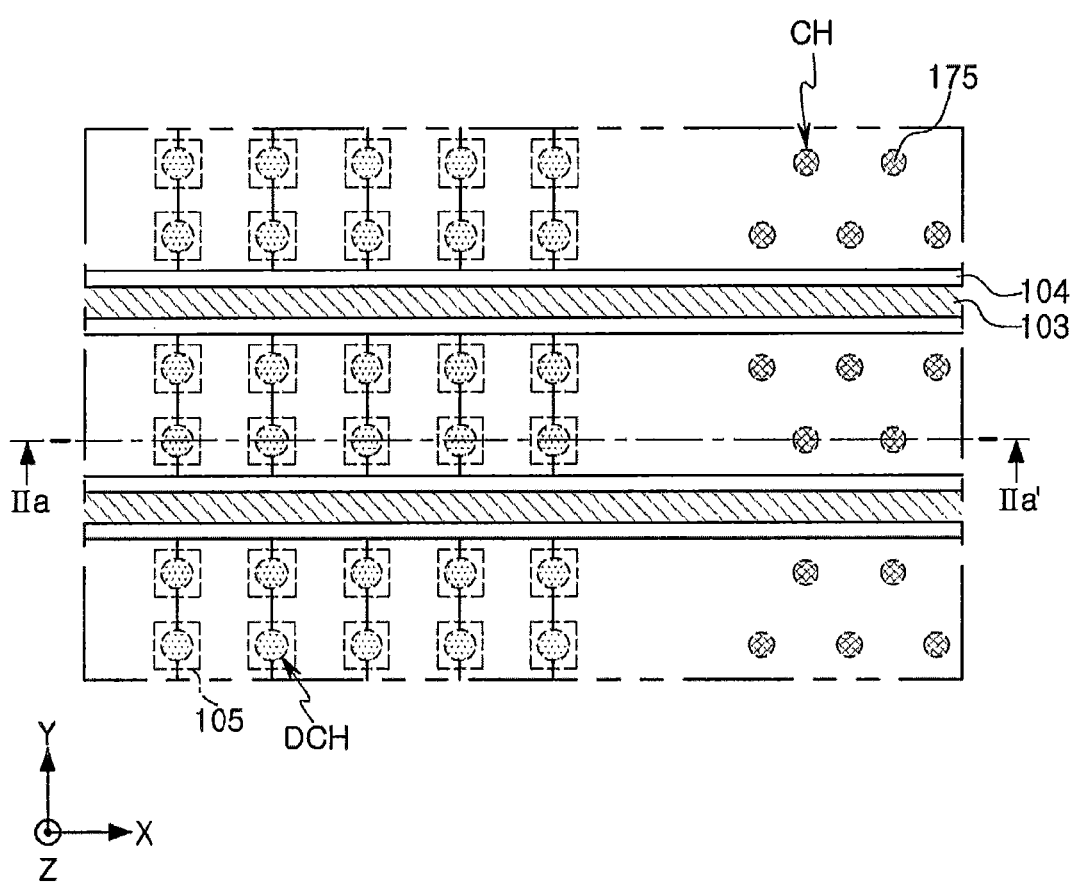
Figure 32B:
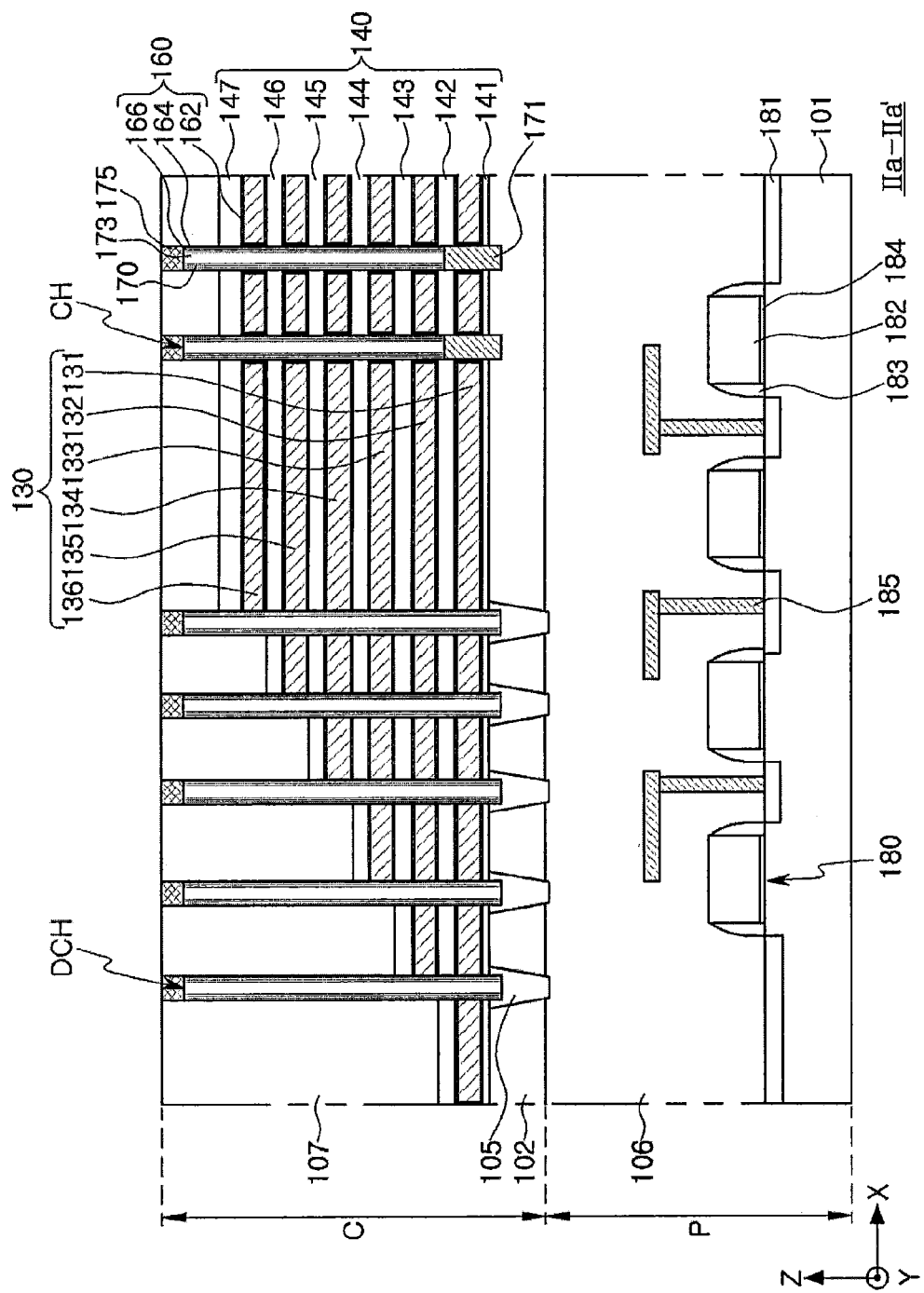

Referring to FIGS. 32A and 32B, a plurality of gate electrode layers 131 to 136 (130) may be formed within the respective horizontal openings Th. Prior to the formation of the gate electrode layers 130, the blocking layer 162 may be first formed on inner side walls of the horizontal openings Th. The gate electrode layers 130 may include, for example, a metal, polycrystalline silicon, or a metal silicide material. The metal silicide material may be, for example, a metal silicide material selected from among cobalt (Co), nickel (Ni), hafnium (Hf), platinum (Pt), tungsten (W), and titanium (Ti), or combinations thereof. In a case in which the gate electrode layers 130 are formed of a metal silicide material, the gate electrode layers 130 may be formed by embedding silicon (Si) in the side openings, forming a separate metal layer, and subsequently performing a silicidation process thereon.

If the substrate insulating patterns 105 are not present and instead each dummy channel region DCH includes a respective epitaxial pattern 171, a problem may arise when the horizontal openings Th are formed by introducing an etchant through the vertical openings Tv. Specifically, if the substrate insulating patterns 105 are not provided, each dummy channel region DCH may include an epitaxial patterns 171 that is formed during the selective epitaxial growth process used to form the epitaxial patterns 171 that are included in the channel regions CH, and a height of the epitaxial patterns 171 that are provided in the dummy channel regions DCH may be determined by a cross-sectional area of the dummy channel region DCH. For example, if the cross-sectional areas of the dummy channel regions DCH are greater than the cross-sectional areas of the channel regions CH, a height of the epitaxial patterns 171 in the dummy channel regions DCH may be lower than a height of the epitaxial patterns 171 in the channel regions CH. Conversely, if the cross-sectional areas of the dummy channel regions DCH are smaller than that the cross-sectional areas of the channel regions CH, the height of the epitaxial patterns 171 in the dummy channel regions DCH may be higher than a height of the epitaxial patterns 171 that are formed in the channel regions CH.

If the height of the epitaxial patterns 171 in the dummy channel regions DCH is not appropriately controlled to a desired value, the charge storage layer 164 that is present within the dummy channel regions DCH may be removed together with the sacrificial layers 120 during the etching step used to form the horizontal openings Th. Then, in the subsequent process that is performed to form the gate electrode layers 130, the lowermost gate electrode layer 131 that acts as a gate electrode of the ground select transistor GST may be electrically connected to other of the gate electrode layers 132 to 136.

In an exemplary embodiment, by forming the substrate insulating patterns 105, selective epitaxial growth of epitaxial patterns 171 in the dummy channel regions DCH may be suppressed. Thus, when etching is performed to form the horizontal openings Th, the charge storage layer 164 may not be removed, and may act to electrically isolate the gate electrode layers 130 from each other. Also, since the epitaxial patterns 171 are not included in the dummy channel regions DCH, only the height of the epitaxial patterns 171 that are included in the channel regions CH needs to be appropriately controlled, and since the thickness of the insulating layer 142 disposed between the lowermost gate electrode layer 131 and the gate electrode layer 132 positioned thereon is reduced, an overall height of the memory device 100 may be reduced.

Figure 33A:
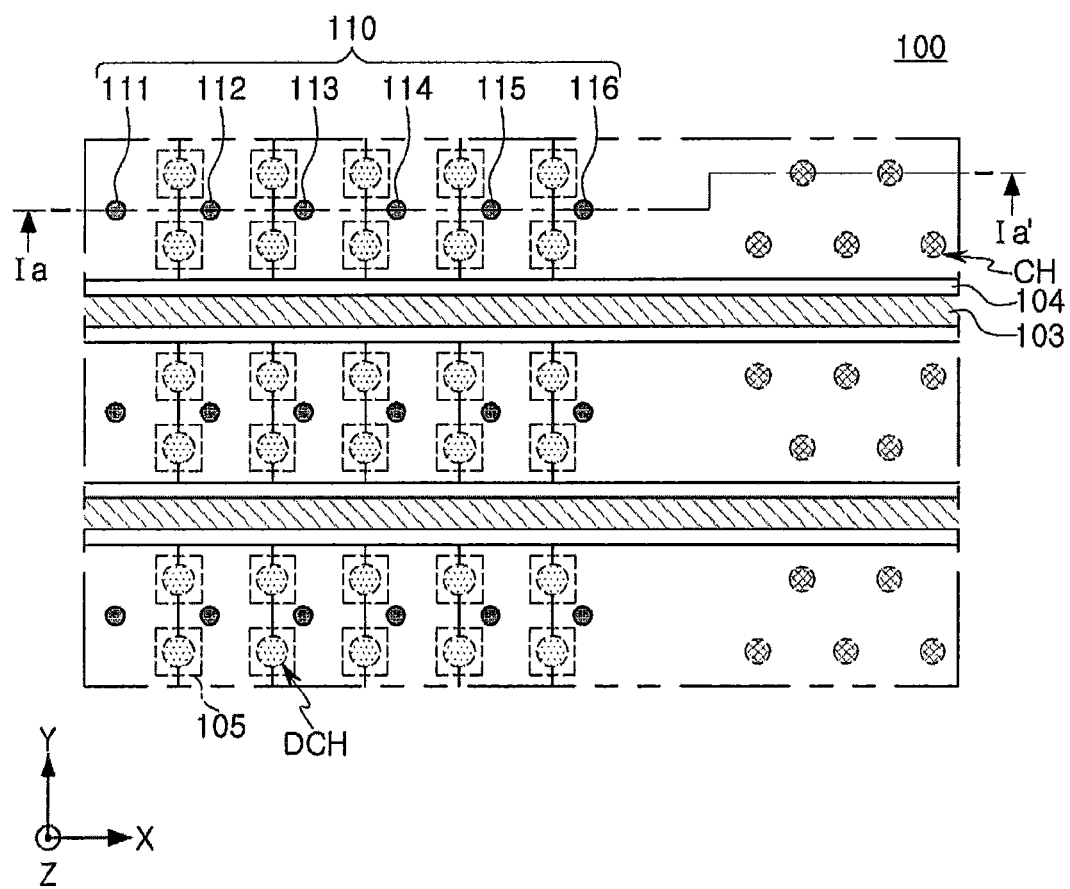
Figure 33B:
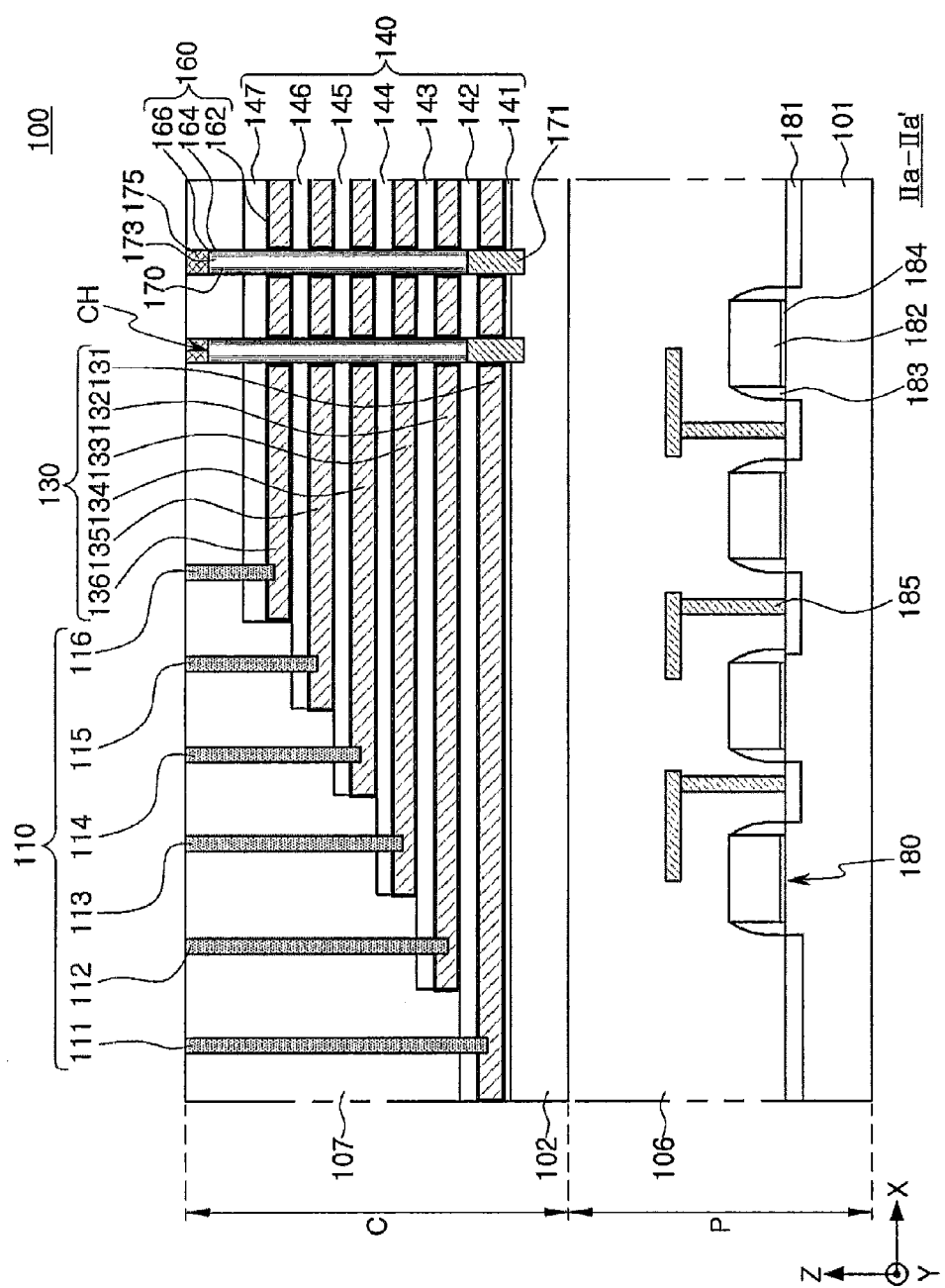

Referring to FIGS. 33A and 33B, the contacts 111 to 116 (110) may be formed in the region in which the step structure is formed. The contacts 110 may be formed by selectively etching the step structure in the Z-axis direction to form a plurality of openings, and the openings may be filled with a conductive material. Due to a high aspect ratio, the contacts 110 may have a tapered structure as the width thereof is reduced in the Z-axis direction toward the second substrate 102.

Thereafter, the contacts 110 may be connected to a word line, and the channel regions CH may be connected to a bit line through the drain regions 175. The dummy channel region DCH may not be connected to a bit line.

FIGS. 34A through 36b are plan and cross-sectional views that illustrate a method for manufacturing the memory device 200 illustrated in FIGS. 7 through 10.

Figure 34A:
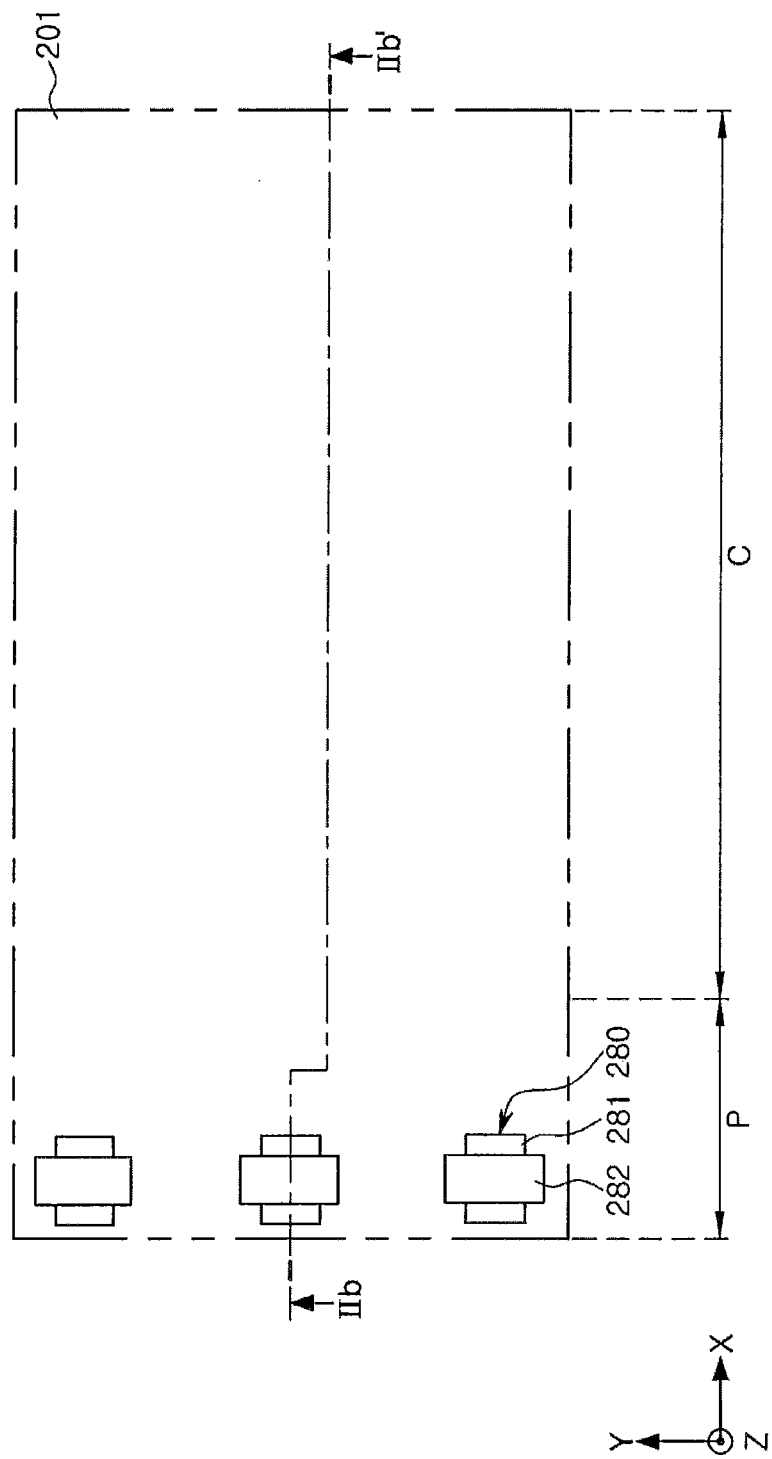
FIGS. 34A through 36b are plan and cross-sectional views that illustrate a method for manufacturing the memory device illustrated in FIGS. 7 through 10.
Figure 34B:
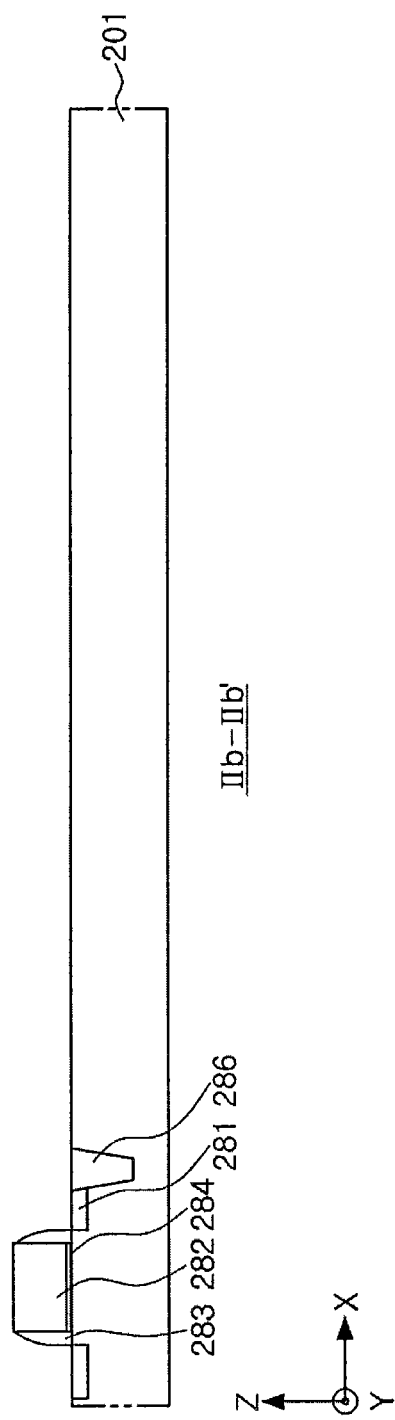

Referring to FIGS. 34A and 34B, a plurality of peripheral circuit devices 280 may be formed in the peripheral circuit region P that is defined on the substrate 201. The plurality of peripheral circuit devices 280 may be planar semiconductor devices and may include source/drain regions 281, gate electrode layers 282, gate spacer films 283, and gate insulating layers 284. The isolation film 286 may be formed in the boundary of the peripheral circuit device 280.

Figure 35A:
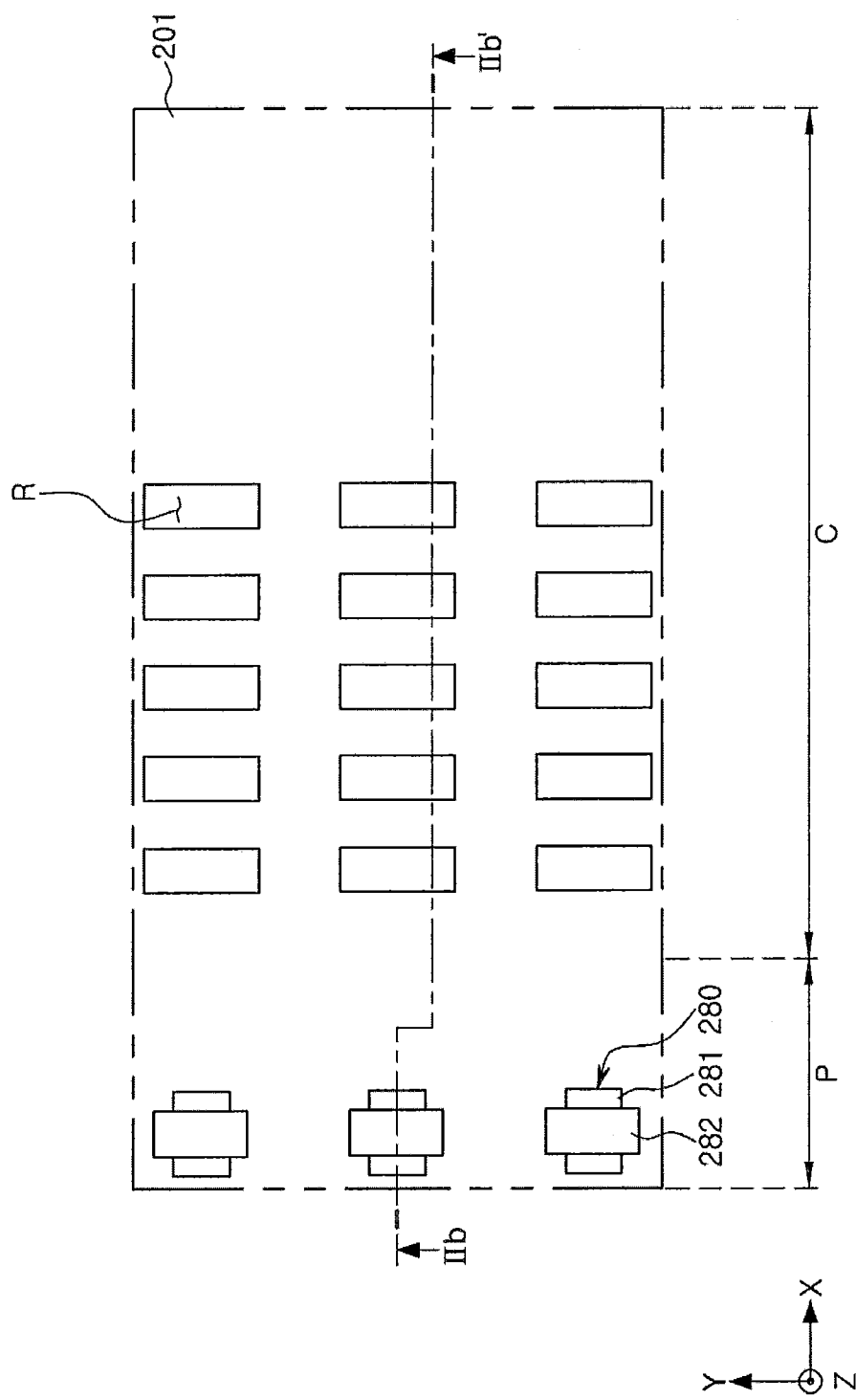
Figure 35B:
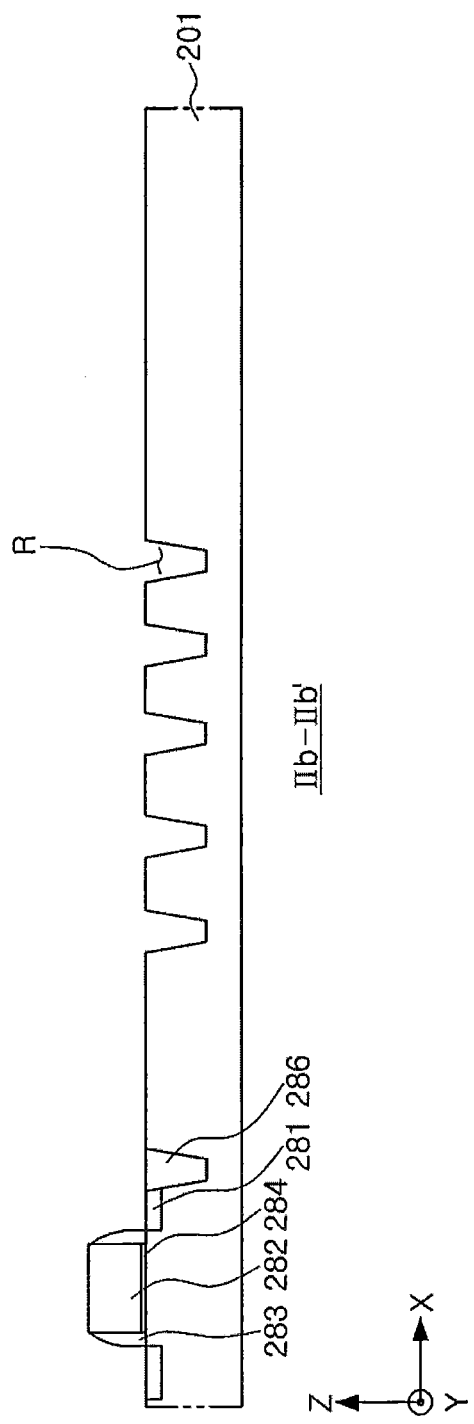

Referring to FIGS. 35A and 35B, a plurality of recesses R may be formed in the substrate 201. The recesses R may be formed by etching the substrate 201 using an etch mask that has openings that expose regions of the substrate 201 in which the recesses R are to be formed. Sizes and shapes of the recesses R may be variously modified. The recesses R may be formed in regions of the substrate 201 that are below regions of the device in which the dummy channel regions DCH are to be formed.

Figure 36A:
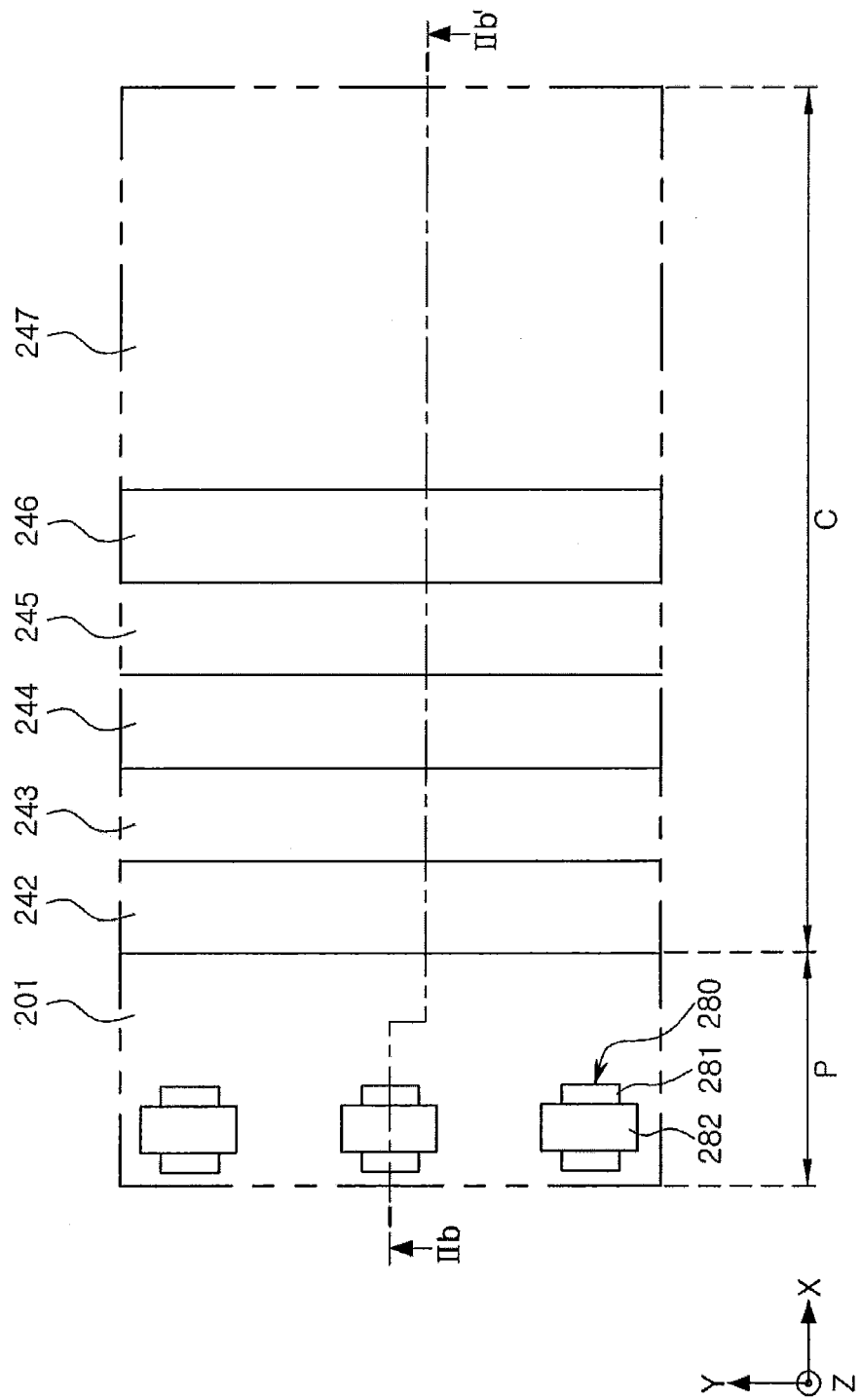
Figure 36B:
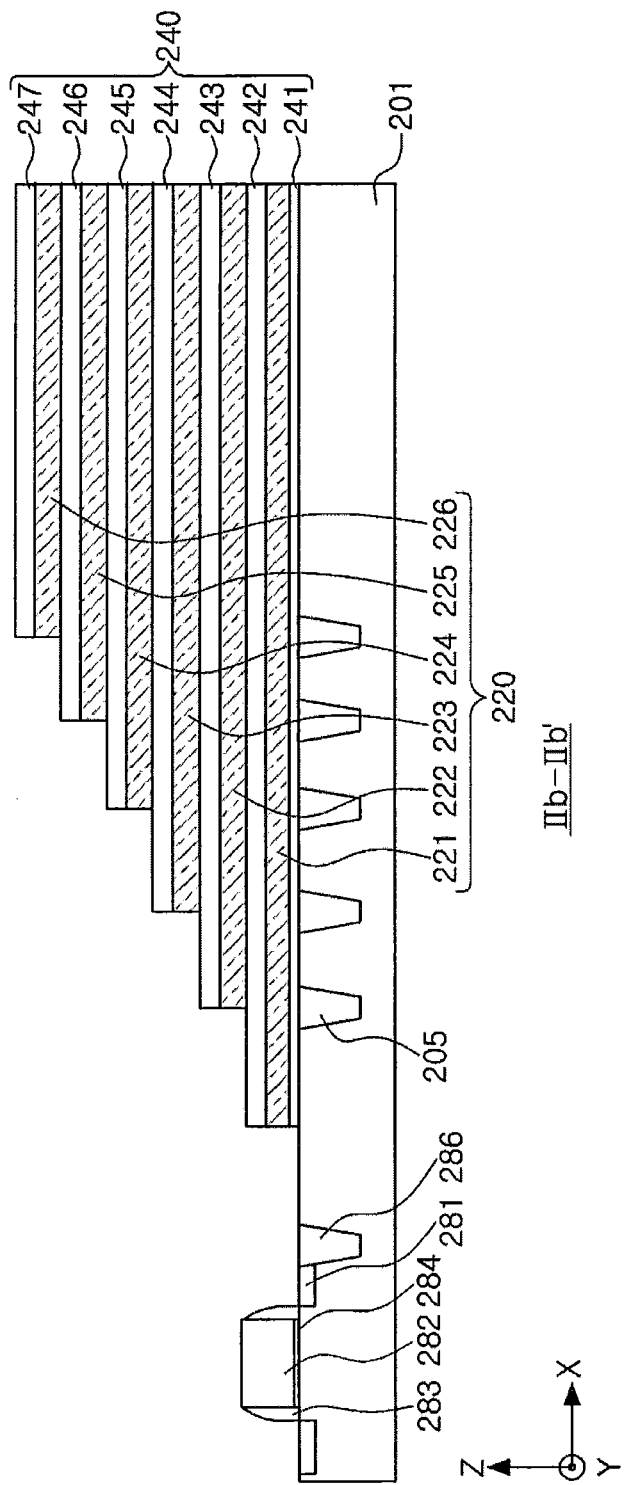

After the recesses R are formed, the recesses R may be filled with an insulating material to form the substrate insulating patterns 205. In particular, the substrate insulating patterns 205 may be formed in the manner described above with reference to FIGS. 24A through 25B. After the substrate insulating patterns 205 are formed, as illustrated in FIGS. 36A and 36B, the sacrificial layers 221 to 226 (220) and the insulating layers 241 to 247 (240) may be formed on upper surfaces of the substrate 201 and the substrate insulating patterns 205. The sacrificial layers 220 and the insulating layers 240 may be formed to have a step structure. Subsequent processes for manufacturing the memory device 200 may be similar to the processes described above with reference to FIGS. 28A through 33B, and hence description thereof will not be repeated here.

FIGS. 37A through 40B are plan and cross-sectional views that illustrate a method for manufacturing the memory device 300 of FIGS. 11 through 14.

Figure 37A:
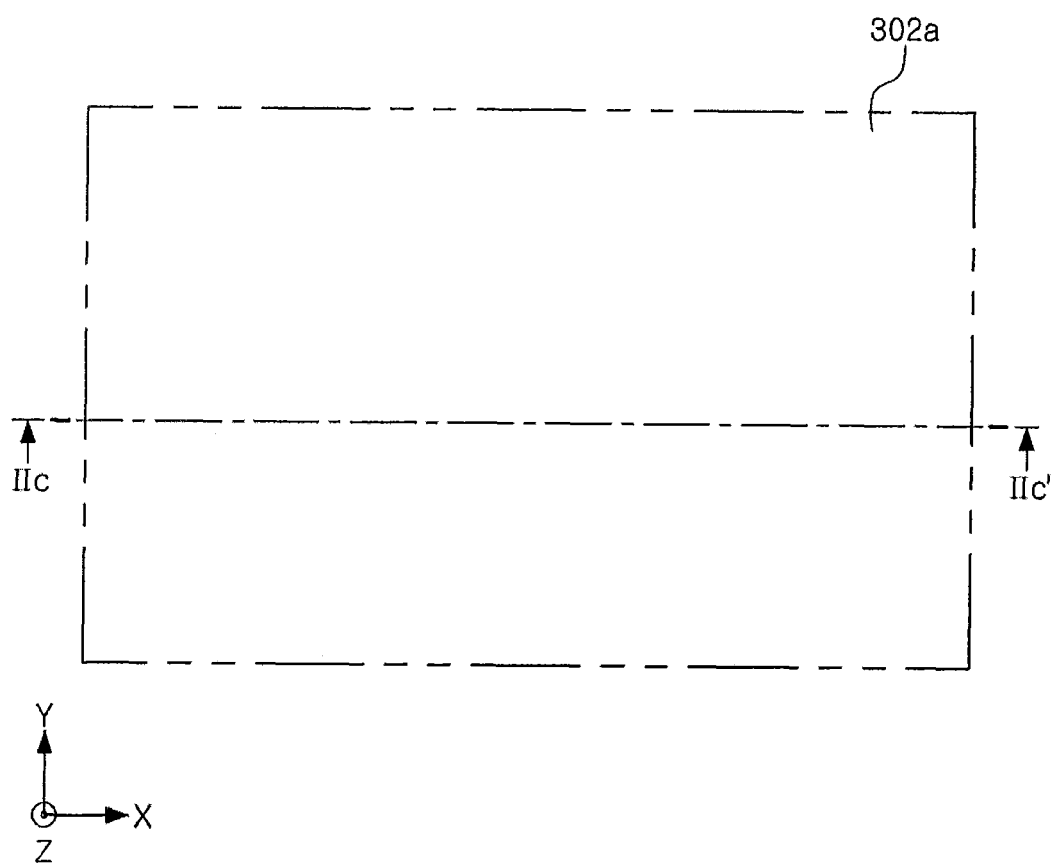
FIGS. 37A through 40B are plan and cross-sectional views that illustrate a method for manufacturing the memory device illustrated in FIGS. 11 through 14.
Figure 37B:
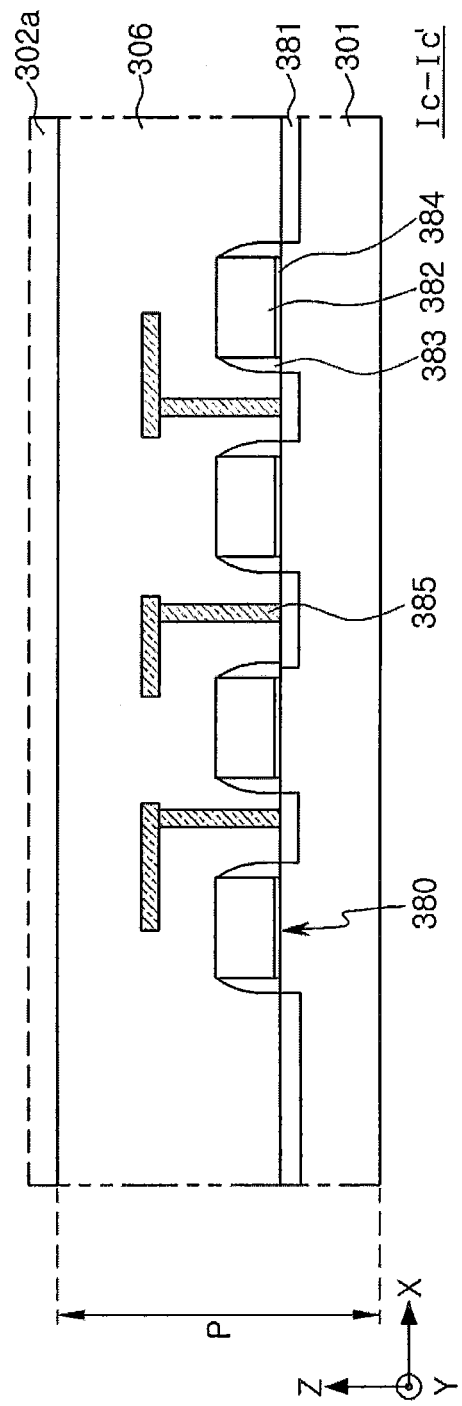

Referring to FIGS. 37A and 37B, the first layer 302a of a second substrate 302 may be formed on the peripheral circuit region P. The peripheral circuit region P may include the first substrate 301, as well as the plurality of peripheral circuit devices 380 and the first interlayer insulating layer 306 that are formed on the first substrate 301. The first substrate 301 may be a single crystal silicon substrate. The first layer 302a may be a silicon layer formed using disilane ($Si_2H_6$) as a silicon source. The first layer 302a may include large-grained polycrystalline silicon. An average diameter of crystal grains included in the first layer 302a may be greater than a thickness of the first layer 302a. For example, an average diameter of the crystal grains included in the first layer 302a may be a few to tens of micrometers.

Figure 38A:
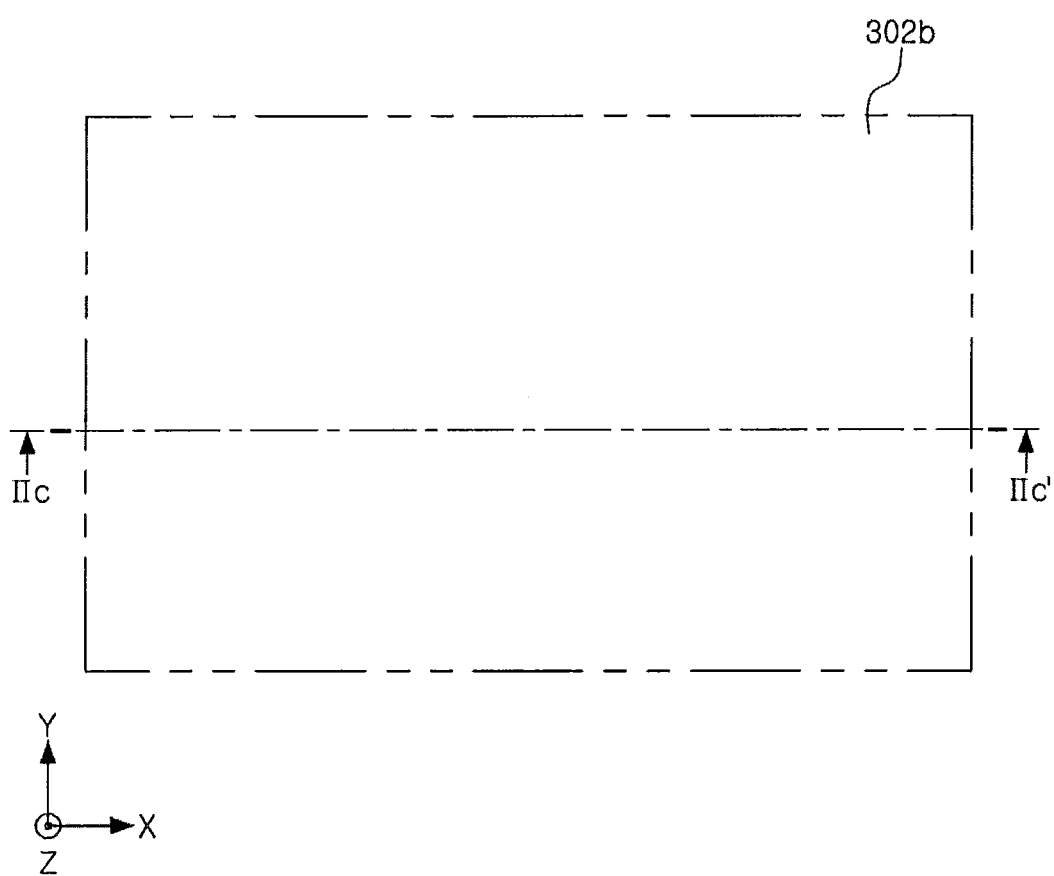
Figure 38B:
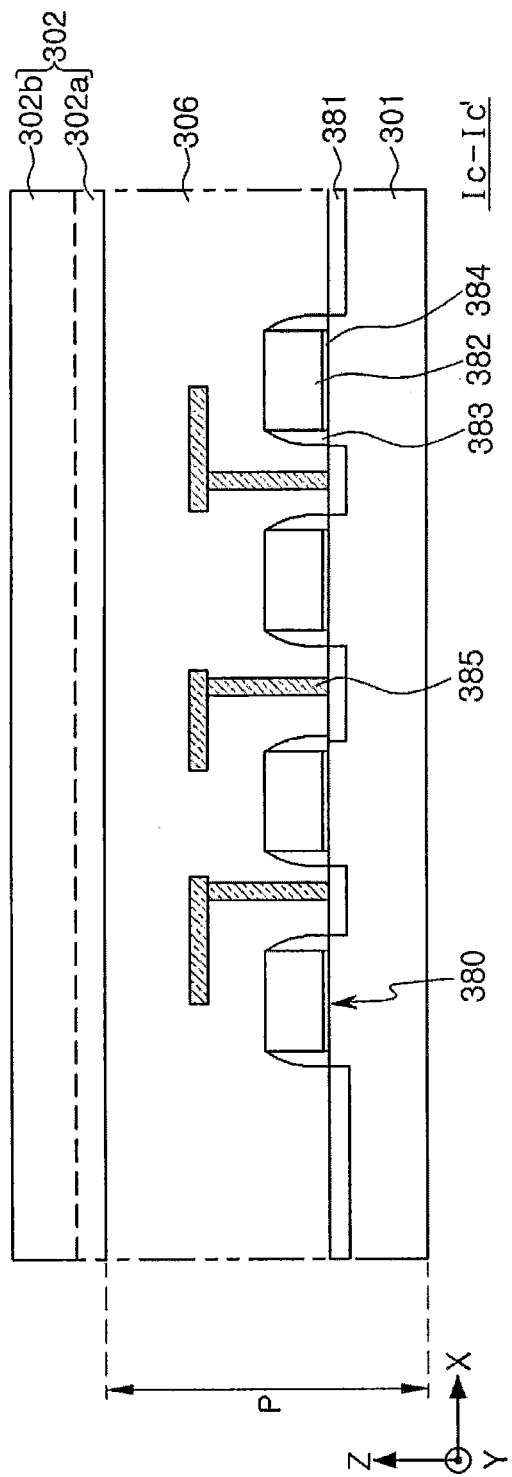

Referring to FIGS. 38A and 38B, the second layer 302b may be formed on the first layer 302 via epitaxial growth using the first layer 302a as a seed layer. In an exemplary embodiment, the second layer 302b may be formed through selective epitaxial growth using the first layer 302a as a seed layer. Like the first layer 302a, the second layer 302b may include polycrystalline silicon, and an average size, for example, an average diameter, of the polycrystalline silicon crystal grains included in the second layer 302b may be greater than that of the polycrystalline silicon crystal grains included in the first layer 302a. Thus, compared with the first layer 302a, the second layer 302b may have a relatively few defects.

The second layer 302b may be thicker than the first layer 302a. In the cell region, a pocket P-well may be formed within the second substrate 302. The pocket P-well may be formed only in the second layer 302b. Thus, the second layer 302b may be grown to have a thickness sufficient for forming the pocket P-well.

Figure 39A:
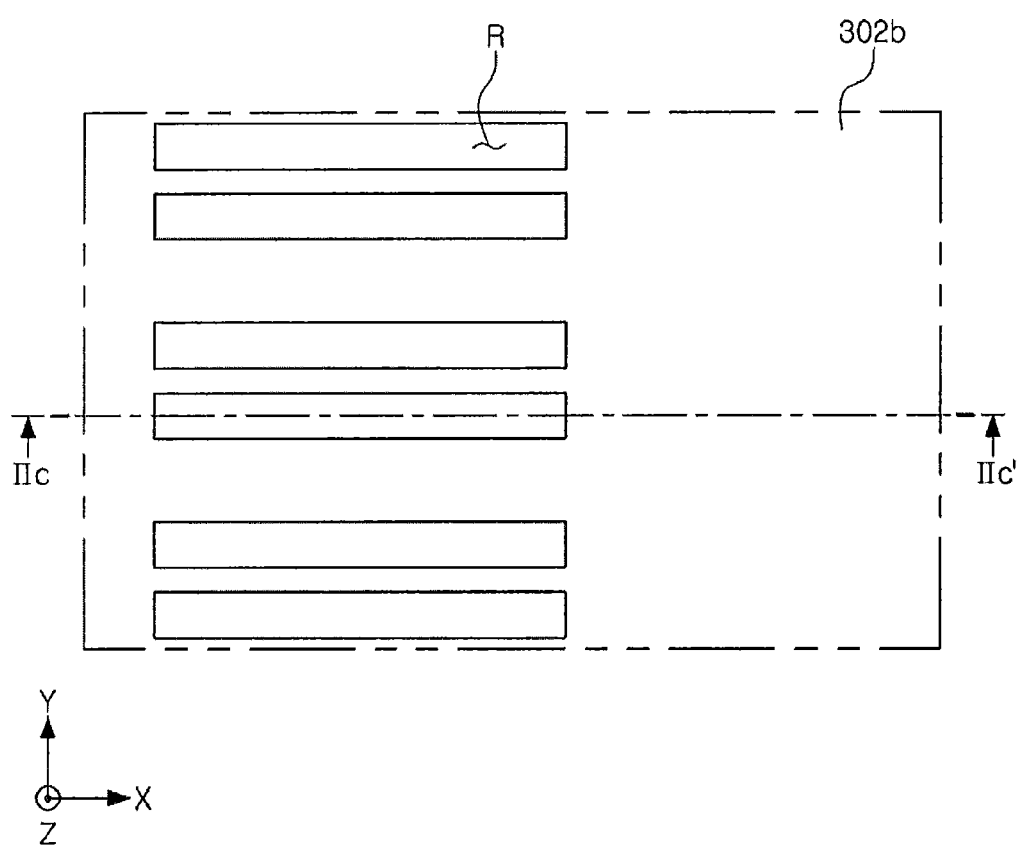
Figure 39B:
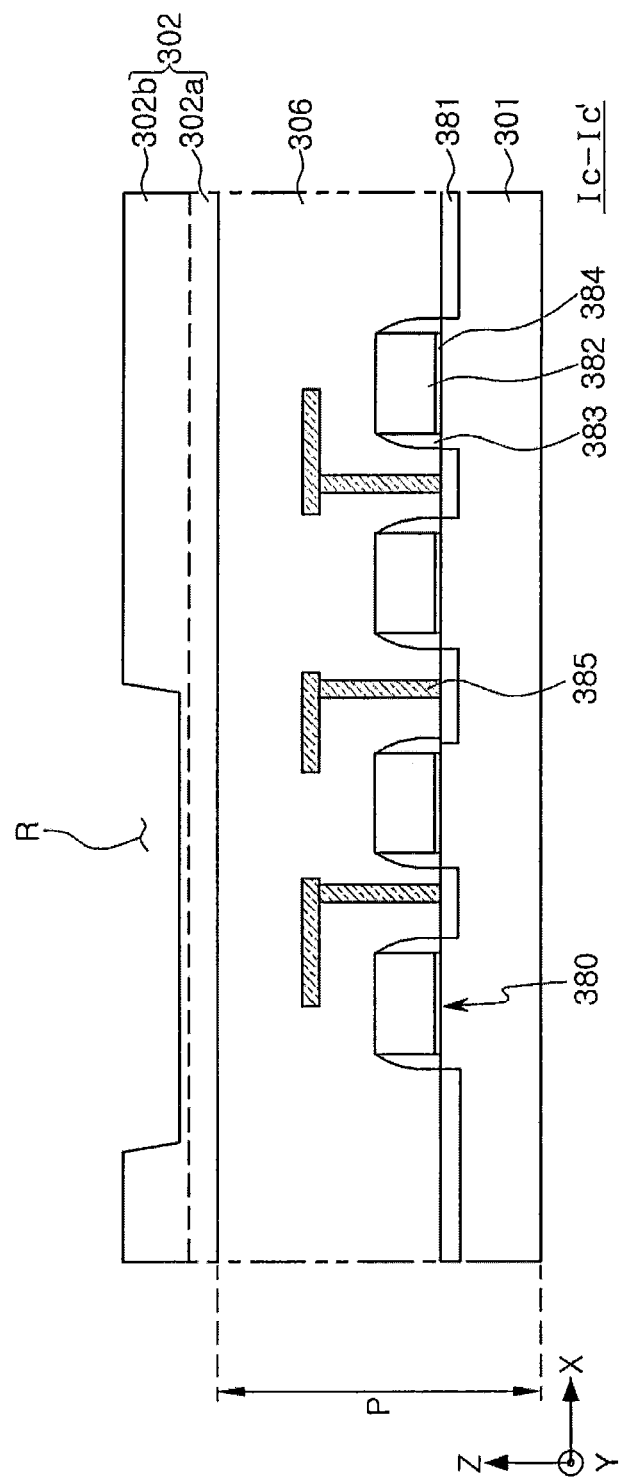

Referring to FIGS. 39A and 39B, the recesses R may be formed in the second substrate 302 by forming a mask on an upper surface of the second substrate 302 that exposes the regions where the recesses R are to be formed and then etching the second substrate 302 to form the recesses R as illustrated in FIGS. 39A and 39B. In an exemplary embodiment, each of the recesses R may extend in the first direction (X-axis direction). In FIG. 39B it is illustrated that side surfaces of the recesses are sloped in a depth direction, but the shape of the recesses R is not limited thereto.

Figure 40A:
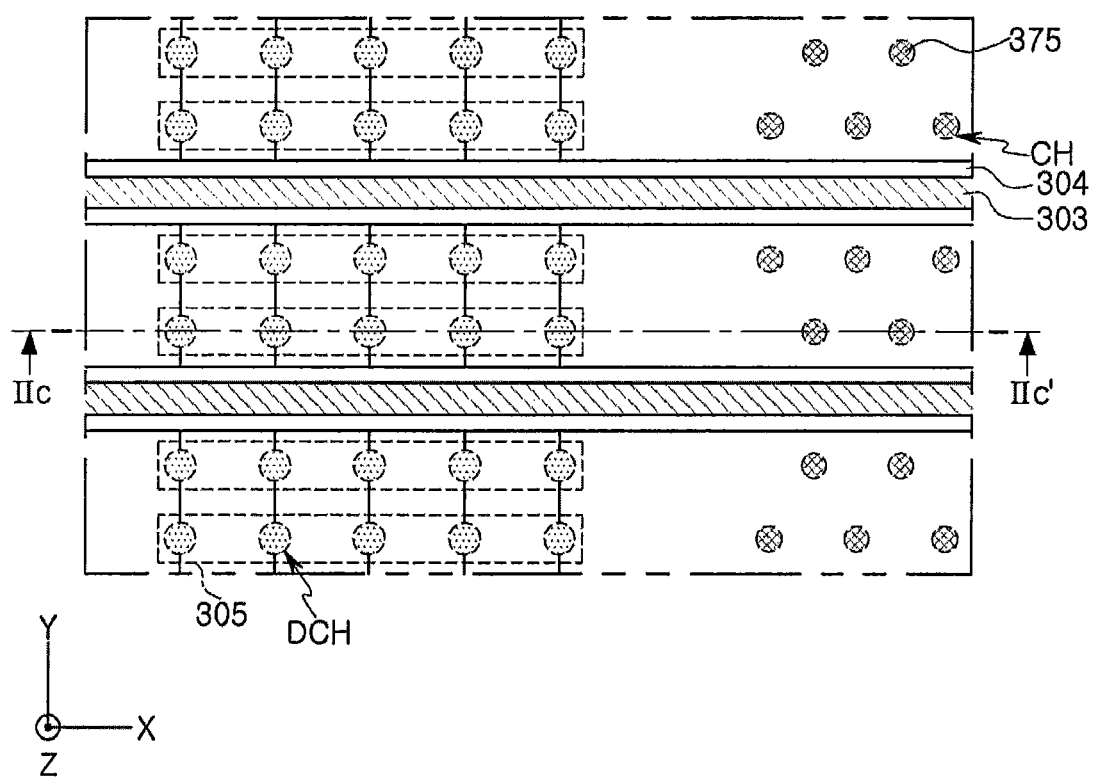
Figure 40B:
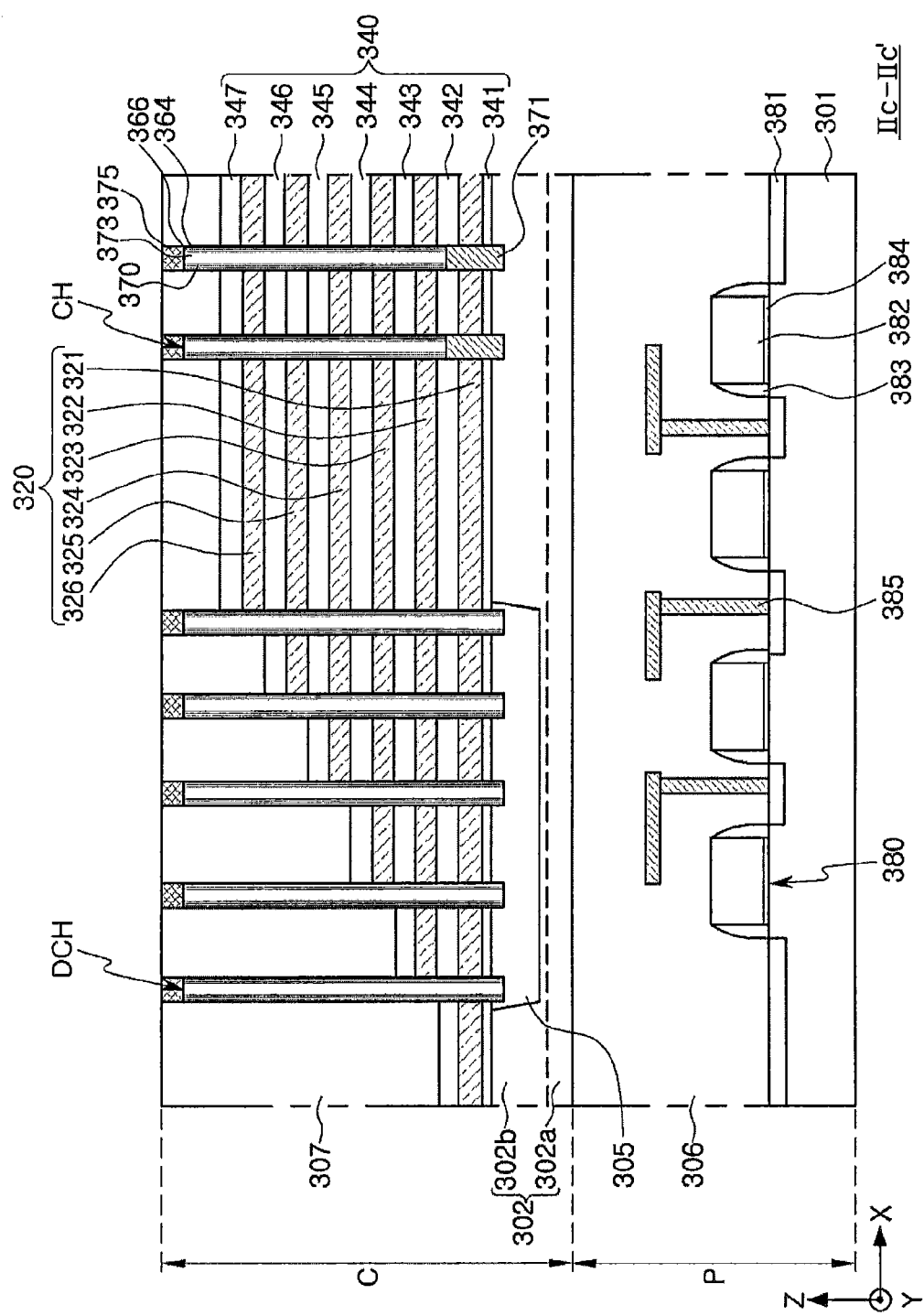

Referring to FIGS. 40A and 40B, the sacrificial layers 321 to 326 (320) and the insulating layers 341 to 347 (340) may be formed in an alternating stacked arrangement on the upper surface of the second substrate 302, and the channel regions CH and the dummy channel regions DCH may be formed to penetrate through the sacrificial layers 320 and the insulating layers 340. The recesses R may be filled with an insulating material to form the substrate insulating layer 305 prior to formation of the sacrificial layers 320 and the insulating layers 340. The sacrificial layers 320 may be removed and replaced with the gate electrode layers 330 in subsequent processing steps.

The dummy channel regions DCH may be adjacent first ends of respective ones of the sacrificial layers 320. The sacrificial layers 320 may have different lengths in the first direction (X-axis direction). Lower portions of the dummy channel regions DCH may be surrounded by the substrate insulating patterns 305. Thus, selective epitaxial growth may not occur in lower portions of the dummy channel regions DCH, and unlike the channel regions CH, the epitaxial patterns 371 may not be formed.

FIGS. 41A through 44B are plan and cross-sectional views that illustrate a method for manufacturing the memory device 600 of FIG. 20.

Figure 41A:
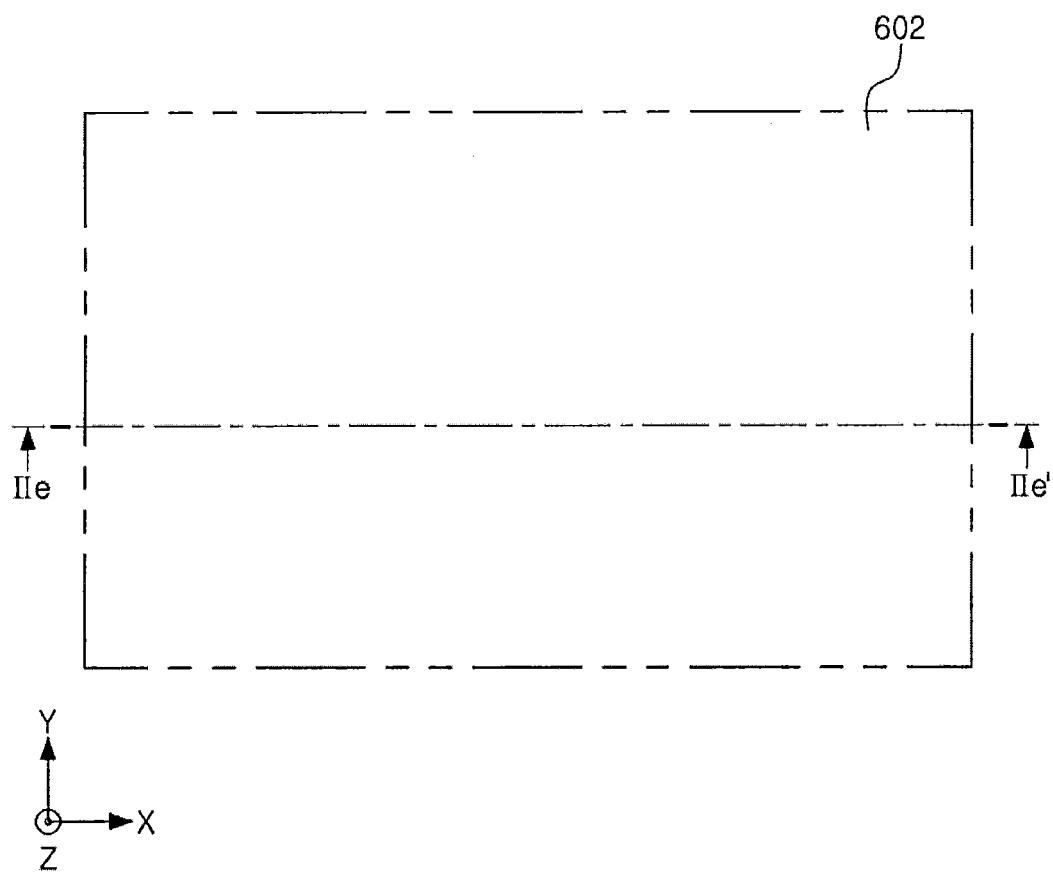
FIGS. 41A through 44B are plan and cross-sectional views that illustrate a method for manufacturing the memory device illustrated in FIG. 20.
Figure 41B:
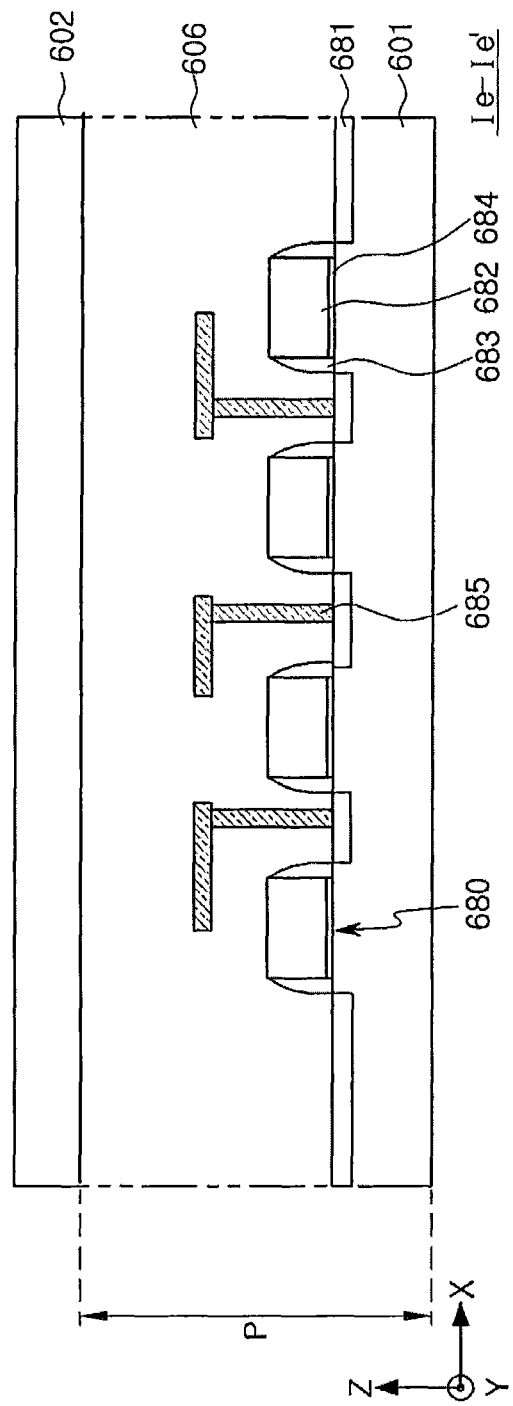

Referring to FIGS. 41A and 41B, a second substrate 602 for forming the cell region C may be provided on the peripheral circuit region P. The peripheral circuit region P may include a first substrate 601, a plurality of peripheral circuit devices 680 provided on the first substrate 601, and a first interlayer insulating layer 606. The second substrate 602 may be provided on the first interlayer insulating layer 606. The first substrate 601 may be a single crystal silicon substrate, and the second substrate 602 may be a polycrystalline silicon substrate.

Figure 42A:
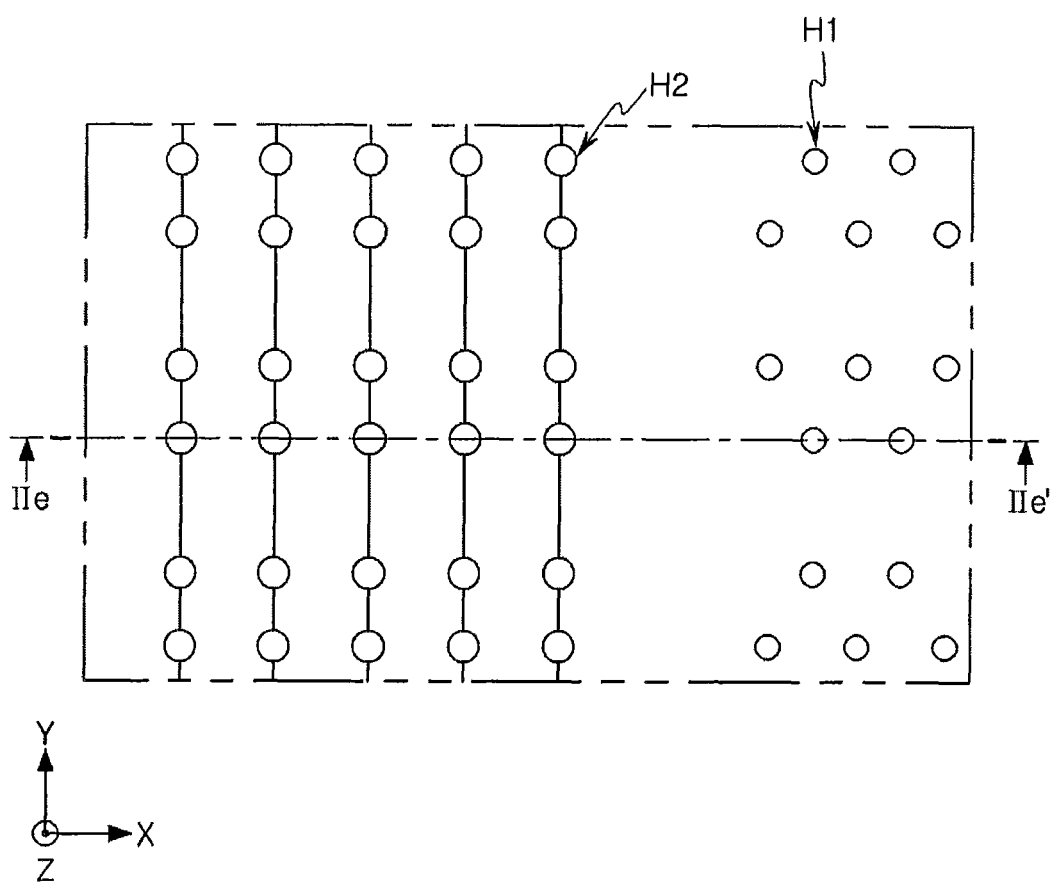
Figure 42B:
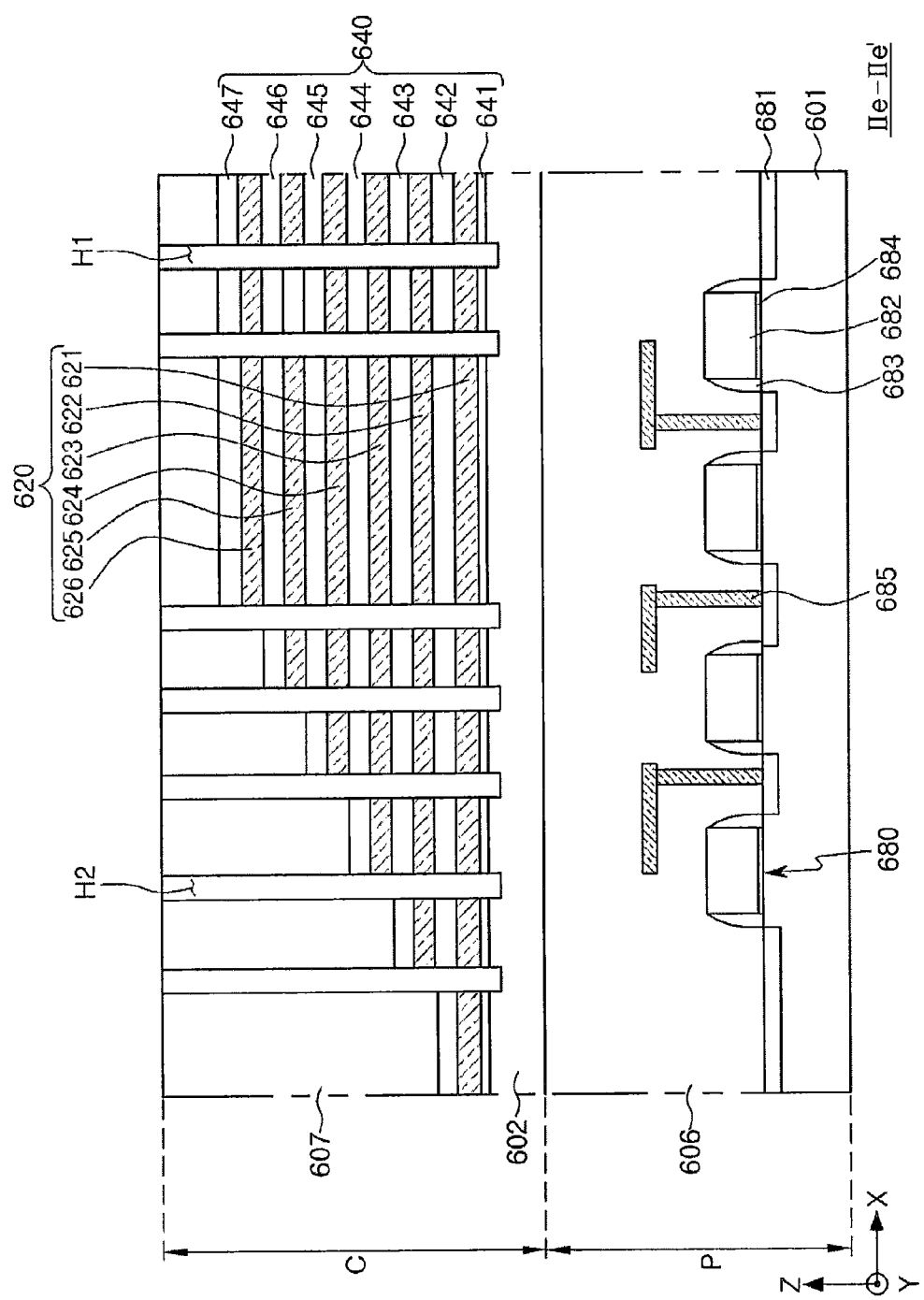

Referring to FIGS. 42A and 42B, a plurality of sacrificial layers 621 to 626 (620) and a plurality of insulating layers 641 to 647 (640) may be alternately stacked on the second substrate 602, and a plurality of channel openings H1 and H2 for forming the channel regions CH and the dummy channel regions DCH may be formed. The plurality of channel openings H1 and H2 may penetrate an upper portion of the second substrate 602. The sacrificial layers 620 and the insulating layers 640 may have different lengths in the first direction (X-axis direction) to form a step structure, and the second interlayer insulating layer 607 may be formed on the step structure.

Figure 43A:
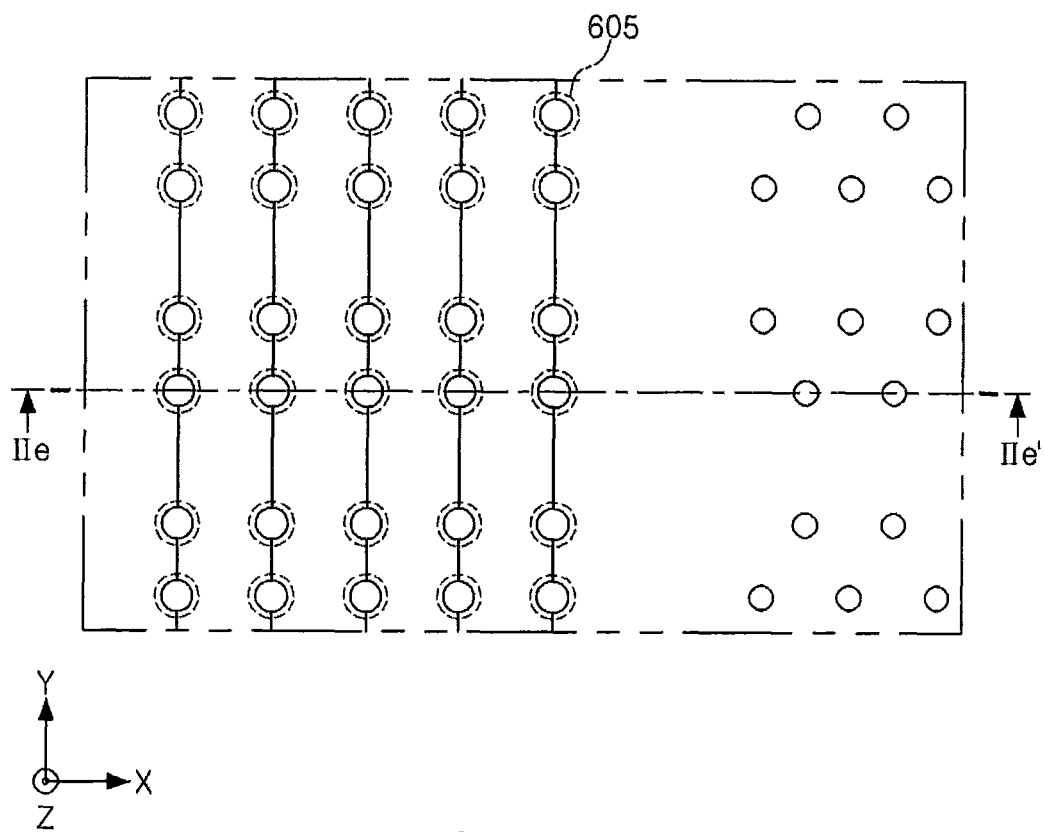
Figure 43B:
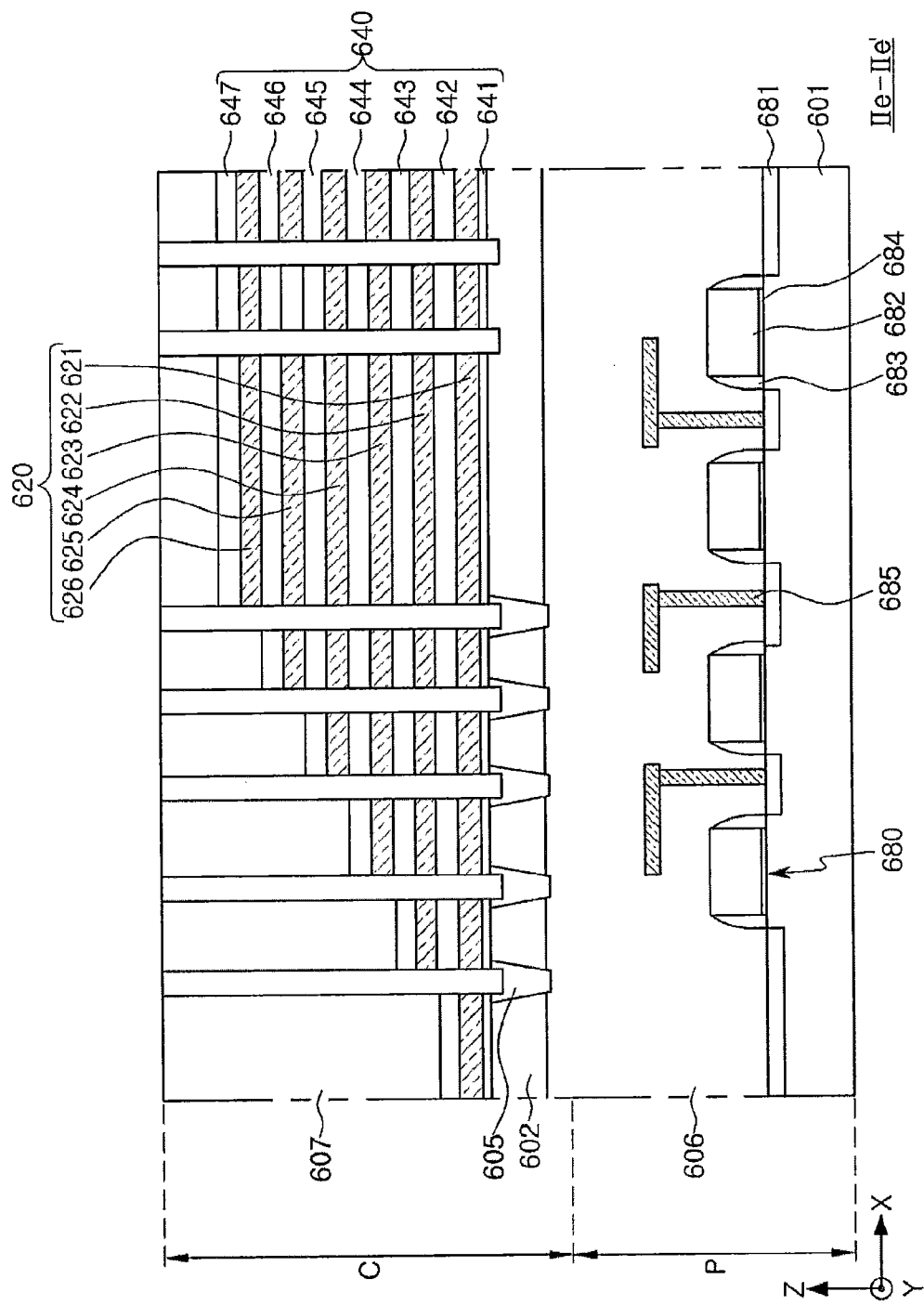

Referring to FIGS. 43A and 43B, substrate insulating patterns 605 may be formed below the second channel openings H2. The substrate insulating layers 605 may be formed by oxidizing portions of the second substrate 602 that are adjacent the channel openings H2. The substrate insulating patterns 605 may be formed through a dry oxidation method or a wet oxidation method, and since the substrate insulating patterns 605 are formed by oxidizing portions of the second substrate 602 underneath the second channel openings H2, a cross-section of each substrate insulating patterns 605 may have a circular or oval shape similar to the cross-sectional shapes of the channel openings H2.

Figure 44A:
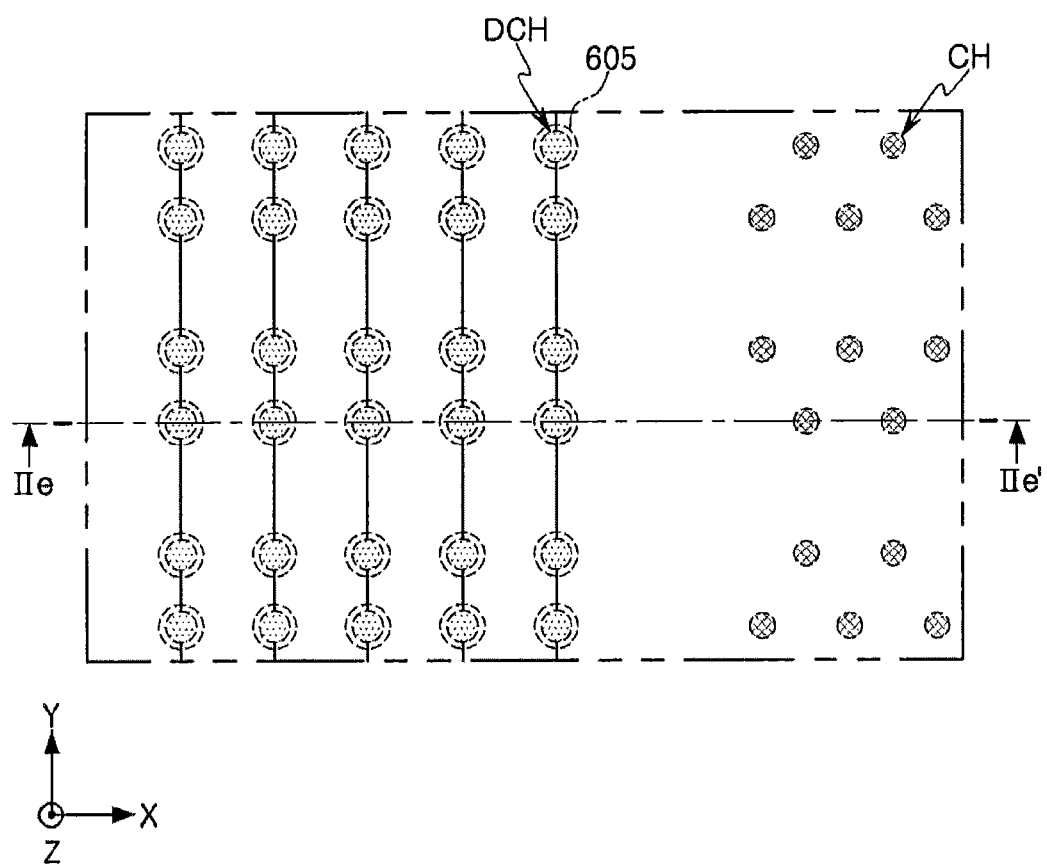
Figure 44B:
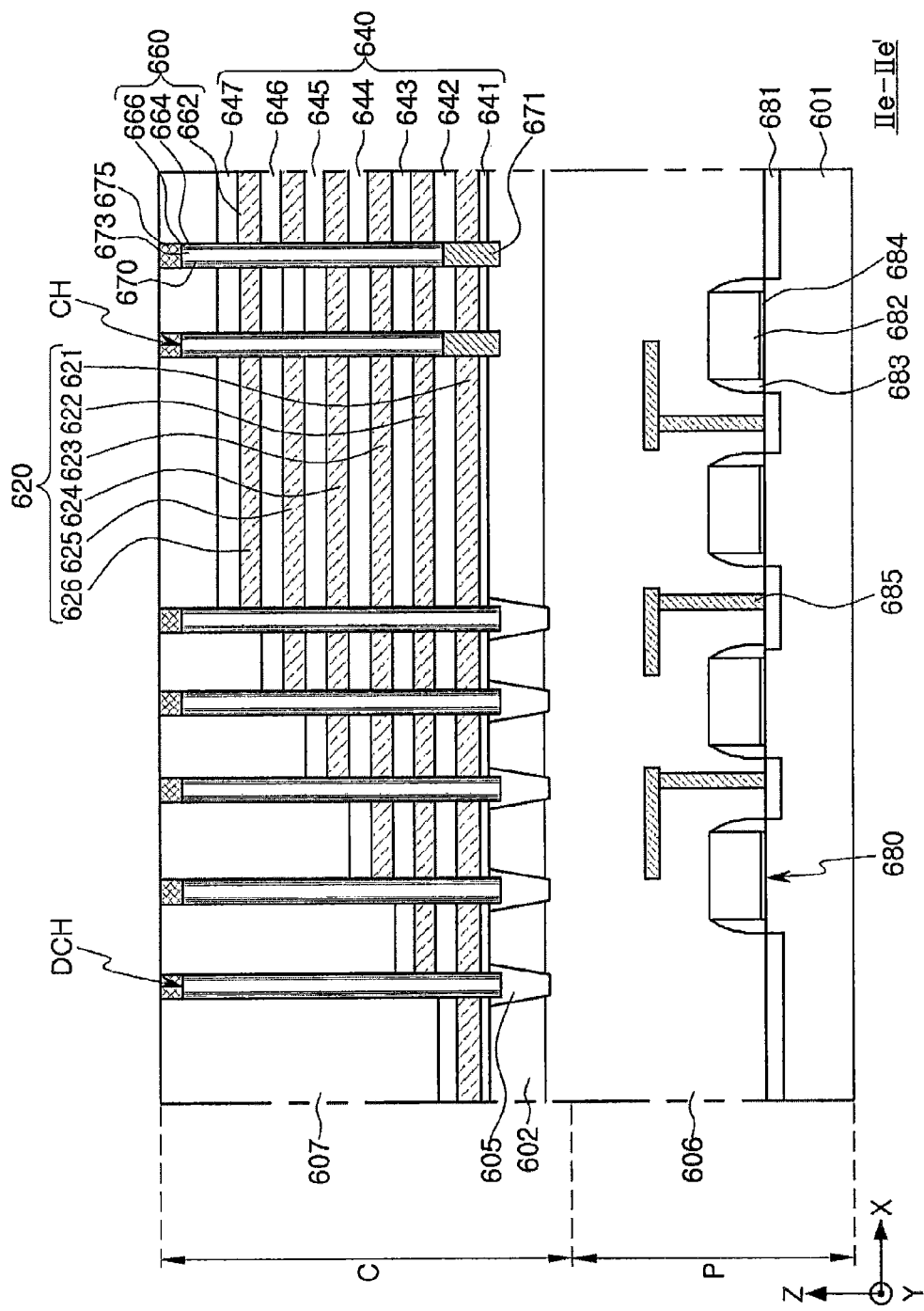

Referring to FIGS. 44A and 44B, the channel regions CH and the dummy channel regions DCH may be formed within the channel openings H1 and H2. Since the substrate insulating patterns 605 are disposed below the second channel openings H2 that correspond to the dummy channel regions DCH, the dummy channel regions DCH may not include the epitaxial pattern 671, unlike the channel region CH. The dummy channel regions DCH and the channel regions CH may each include a channel layer 670 and an embedded insulating layer 673. Drain regions 675, and portions of gate insulating layers 664 and 666 may be disposed on the outer sides of the channel layers 670. The gate insulating layers 664 and 666 may include a charge storage layer 664 and a tunneling layer 666.

In an exemplary embodiment, since the epitaxial patterns 671 are not included in the dummy channel regions DCH, and hence the thicknesses of the sacrificial layers 620 and the insulating layers 640 may be determined based on a height of the epitaxial patterns 671 that are included in the lower portions of the respective channel regions CH. Thus, it is possible to reduce a thickness of a mold that includes the sacrificial layers 620 and the insulating layers 640. Also, since the epitaxial patterns 671 are not included in the dummy channel regions DCH, a phenomenon in which portions of the gate insulating layers 664 and 666 are removed together with the sacrificial layers 620 when the sacrificial layers 620 are selectively removed may be reduced or prevented, and thus, portions of the gate electrode layers formed thereafter may be prevented from being electrically connected.

Figure 45:
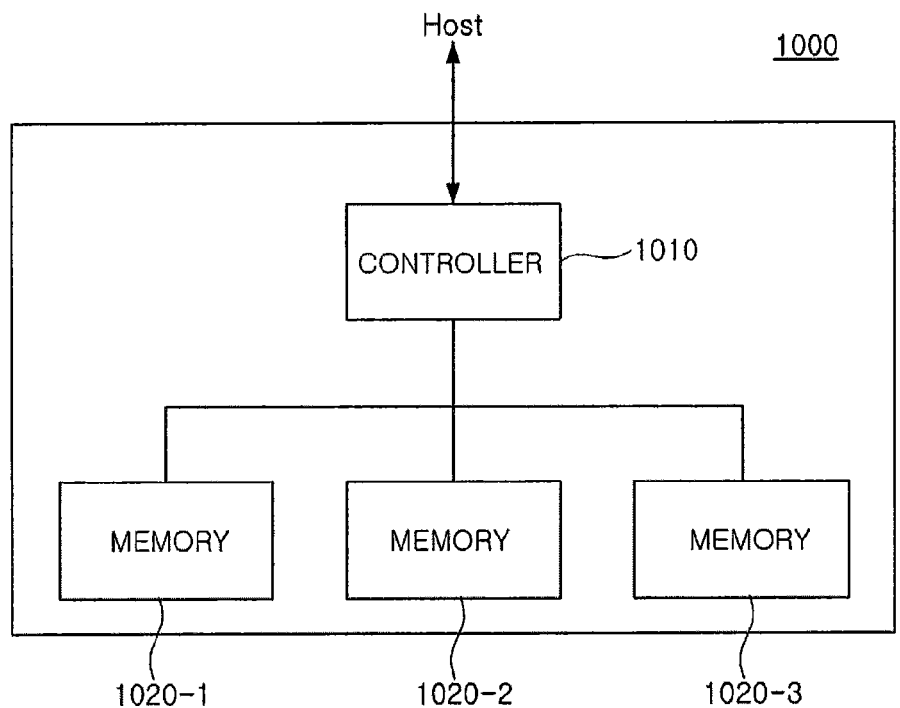
FIGS. 45 and 46 are block diagrams illustrating electronic devices that include a memory device according to an exemplary embodiment of the inventive concepts.
Figure 46:
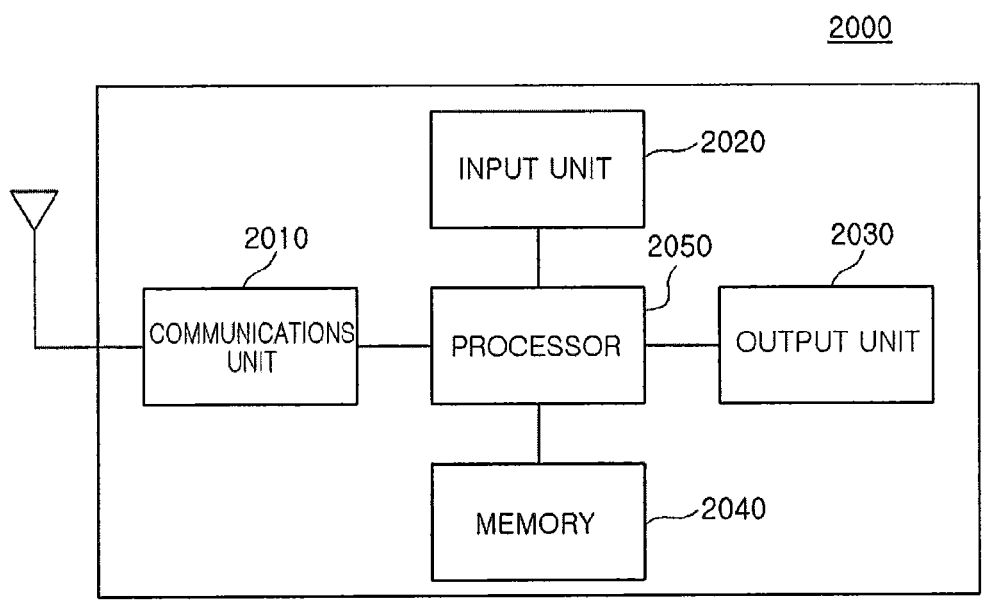

FIGS. 45 and 46 are block diagrams illustrating electronic devices including a memory device according to exemplary embodiments of the inventive concepts.

Referring to FIG. 45, a storage device 1000 may include a controller 1010 communicating with a host HOST and memories 1020-1, 1020-2, and 1020-3 storing data. Each of the memories 1020-1, 1020-2, and 1020-3 may include one or more of the memory devices 100, 200, 300, 400, 500, 600, and 700 according to various exemplary embodiments described above.

The host HOST communicating with the controller 1010 may be various electronic devices in which the storage device 100 is installed. For example, the host HOST may be a smartphone, a digital camera, a desktop computer, a laptop computer, or a media player. When a data write or read request is received from the host HOST, the controller 1010 may store data in the memories 1020-1, 1020-2, and 1020-3 or generate a command CMD to retrieve data from the memories 1020-1, 1020-2, and 1020-3.

As illustrated in FIG. 45, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, a storage device 1000 having large capacity, such as a solid state drive (SSD), may be realized.

FIG. 46 is a block diagram illustrating an electronic device including a non-volatile memory device according to an exemplary embodiment of the inventive concepts.

Referring to FIG. 46, an electronic device 2000, according to an exemplary embodiment, may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, and a mobile communications module. A wired/wireless communications module included in the communications unit 2010 may be connected to an external communications network based on various communications standards to transmit and receive data.

The input unit 2010, provided to allow a user to control an operation of the electronic device 2000, may include a mechanical switch, a touchscreen, and a voice recognition module. Also, the input unit 2010 may include a mouse operating in a track ball or a laser pointer manner, or a finger mouse device. In addition, the input unit 2020 may further include various sensor modules allowing the user to input data.

The output unit 2030 outputs information processed in the electronic device 2000 in an audio or video format, and the memory 2040 may store a program for processing and controlling the processor 2050, or data. The memory 2040 may include one of more of the memory devices 100, 200, 300, 400, 500, 600, and 700 according to various exemplary embodiments described above. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In a case in which the memory 2040 communicates with the processor 2050 through a separate interface, the processor 2050 may store data to the memory 2040 or retrieve data therefrom through various interface standards such as SD, SDHC, SDXC, MICRO SD, or USB.

The processor 2050 may control operations of components included in the electronic device 2000. The processor 2050 may perform controlling and processing related to an audio call, a video call, and data communications, or may perform controlling and processing for multimedia playback and management. Also, the processor 2050 may process an input transmitted from the user through the input unit 2020 and output corresponding results through the output unit 2030. Further, as described above, the processor 2050 may store data required for controlling an operation of the electronic device 2000 in the memory 2040 or may retrieve such data therefrom.

As set forth above, in the memory device according to exemplary embodiments of the present inventive concept, since an insulating material is disposed between a dummy channel region and a substrate, occurrence of selective epitaxial growth (SEG) in the dummy channel region may be avoided, improving breakdown voltage characteristics of a ground select transistor, and a height of a device may be reduced, increasing a degree of integration.

While exemplary embodiments have been shown and described above, it will be apparent to those skilled in the art that modifications and variations could be made without departing from the scope of the invention as defined by the appended claims.

What is claimed is:

1. A semiconductor device, comprising:
   a semiconductor substrate;
   a gate electrode layer structure that includes a plurality of spaced-apart gate electrode layers stacked on an upper surface of the semiconductor substrate;
   a plurality of channel regions penetrating the gate electrode layers;
   a plurality of dummy channel regions penetrating at least the lowermost of the gate electrode layers; and
   a substrate insulating layer between the semiconductor substrate and the dummy channel regions.

2. The semiconductor device of claim 1, wherein the substrate insulating layer comprises a plurality of substrate insulating patterns, wherein the semiconductor substrate includes a plurality of recesses, and wherein the substrate insulating patterns are formed in respective ones of the recesses.

3. The semiconductor device of claim 1, wherein the dummy channel regions extend below the upper surface of the semiconductor substrate and directly contact the substrate insulating layer.

4. The semiconductor device of claim 1, wherein the dummy channel regions comprise respective annular channel regions that penetrate a lowermost one of the gate electrode layers.

5. The semiconductor device of claim 4, wherein the channel regions comprise respective epitaxial patterns on the semiconductor substrate and respective annular channel regions on upper surfaces of the respective epitaxial patterns.

6. The semiconductor device of claim 5, wherein the epitaxial patterns penetrate a lowermost one of the gate electrode layers.

7. The semiconductor device of claim 1, further comprising a plurality of bit lines, wherein the channel regions are electrically connected to respective ones of the bit lines and wherein the dummy channel regions are not electrically connected to any of the bit lines.

8. The semiconductor device of claim 1, wherein the dummy channel regions penetrate a first region of the gate electrode layer structure that has a stepped structure, and wherein the channel regions are spaced-apart from the first region of the gate electrode layer structure.

9. A semiconductor device, comprising:
   a semiconductor substrate having an upper surface that defines a horizontal plane;
   a gate electrode layer structure that includes a plurality of gate electrode layers and a plurality of insulating layers that are alternately stacked in a vertical direction on the upper surface of the semiconductor substrate;
   a plurality of dummy channel regions that penetrate the gate electrode layer structure, the dummy channel regions comprising respective annular channel layers that penetrate a lowermost of the gate electrode layers; and
   a plurality of channel regions that penetrate the gate electrode layer structure, the channel regions comprising respective epitaxial patterns on the semiconductor substrate and respective annular channel regions on an upper surface of the respective epitaxial patterns,
   wherein the dummy channel regions are spaced apart from the semiconductor substrate.

10. The semiconductor device of claim 9, wherein bottom surfaces of the respective dummy channel regions extend below a bottom surface of the gate electrode layer structure.

11. The semiconductor device of claim 10, further comprising a substrate insulating layer that includes a plurality of substrate insulating patterns that are provided in respective recesses in the upper surface of the semiconductor substrate.

12. The semiconductor device of claim 11, wherein bottom surfaces of the respective dummy channel regions directly contact the substrate insulating layer.

13. The semiconductor device of claim 9, wherein the channel regions comprise respective epitaxial patterns on the semiconductor substrate and respective annular channel regions on upper surfaces of the respective epitaxial patterns.

14. The semiconductor device of claim 13, wherein the epitaxial patterns of the respective channel regions penetrate a lowermost one of the gate electrode layers.

15. The semiconductor device of claim 9, further comprising a plurality of bit lines, wherein the channel regions are electrically connected to respective ones of the bit lines and wherein the dummy channel regions are not electrically connected to any of the bit lines.

16. A semiconductor memory device, comprising:
 a semiconductor substrate having an upper surface that has a plurality of recesses therein;
 a substrate insulating layer that includes a plurality of substrate insulating patterns in the respective recesses;
 a gate electrode layer structure on the upper surface of the semiconductor substrate; and
 a plurality of dummy channel regions vertically penetrating the gate electrode layer structure, wherein the dummy channel regions directly contact the substrate insulating layer.

17. The semiconductor device of claim 16, wherein the dummy channel regions have respective lower surfaces that are below the upper surface of the semiconductor substrate.

18. The semiconductor device of claim 16, further comprising a plurality of channel regions, the channel regions comprising respective epitaxial patterns on the semiconductor substrate and respective annular channel regions on upper surfaces of the respective epitaxial patterns.

19. The semiconductor device of claim 18, wherein the epitaxial patterns directly contact the semiconductor substrate.

* * * * *